(12) United States Patent
Fujii

(10) Patent No.: US 8,241,948 B2
(45) Date of Patent: Aug. 14, 2012

(54) SEMICONDUCTOR DEVICE AND MANUFACTURING METHOD OF THE SAME

(75) Inventor: Gen Fujii, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 89 days.

(21) Appl. No.: 12/792,816

(22) Filed: Jun. 3, 2010

(65) Prior Publication Data

US 2010/0240173 A1 Sep. 23, 2010

Related U.S. Application Data

(63) Continuation of application No. 11/474,474, filed on Jun. 26, 2006, now Pat. No. 7,732,330.

(30) Foreign Application Priority Data

Jun. 30, 2005 (JP) ................................. 2005-193192

(51) Int. Cl.
*H01L 21/00* (2006.01)
(52) U.S. Cl. . 438/104; 438/678; 438/677; 257/E21.479; 257/E21.476
(58) Field of Classification Search .................. 438/678, 438/677, 647, 610, 641, 401, 686, 674, 104; 257/E21.161, E21.171, E21.174, E21.479, 257/E21.476; 427/301, 427.1, 466, 304; 430/315, 324; 205/105
See application file for complete search history.

(56) References Cited

U.S. PATENT DOCUMENTS

| | | | |
|---|---|---|---|
| 5,660,883 A | 8/1997 | Omura | |
| 6,103,393 A | 8/2000 | Kodas et al. | |
| 6,153,123 A | 11/2000 | Hampden-Smith et al. | |
| 6,156,385 A | 12/2000 | Takagi et al. | |
| 6,165,247 A | 12/2000 | Kodas et al. | |
| 6,168,731 B1 | 1/2001 | Hampden-Smith et al. | |
| 6,180,029 B1 | 1/2001 | Hampden-Smith et al. | |
| 6,193,908 B1 | 2/2001 | Hampden-Smith et al. | |
| 6,197,218 B1 | 3/2001 | Hampden-Smith et al. | |
| 6,210,604 B1 | 4/2001 | Hampden-Smith et al. | |
| 6,277,169 B1 | 8/2001 | Hampden-Smith et al. | |
| 6,277,679 B1 | 8/2001 | Ohtani | |
| 6,316,100 B1 | 11/2001 | Kodas et al. | |
| 6,338,809 B1 | 1/2002 | Hampden-Smith et al. | |
| 6,344,309 B2 | 2/2002 | Fukushima et al. | |

(Continued)

FOREIGN PATENT DOCUMENTS

JP 09-263950 10/1997

(Continued)

*Primary Examiner* — Caridad Everhart
(74) *Attorney, Agent, or Firm* — Nixon Peabody, LLP; Jeffrey L. Costellia

(57) ABSTRACT

The manufacturing method of the present invention includes steps of selectively forming a photocatalyst material or a material including an amino group by discharging a composition including the photocatalyst material or the material including an amino group; immersing the photocatalyst material or the material including an amino group in a solution including a plating catalyst material so as to adsorb or deposit the plating catalyst material onto the photocatalyst material or the material including an amino group; and immersing the plating catalyst material in a plating solution including a metal material so as to form a metal film on a surface of the photocatalyst material or the material including an amino group adsorbing or depositing the plating catalyst material, thereby manufacturing a semiconductor device. The pH of the solution including the plating catalyst material is adjusted in a range of 3 to 6.

16 Claims, 36 Drawing Sheets

U.S. PATENT DOCUMENTS

| | | | |
|---|---|---|---|
| 6,348,240 B1 | 2/2002 | Calvert et al. |
| 6,360,562 B1 | 3/2002 | Kodas et al. |
| 6,555,022 B2 | 4/2003 | Hampden-Smith et al. |
| 6,562,671 B2 | 5/2003 | Ohnuma |
| 6,602,439 B1 | 8/2003 | Hampden-Smith et al. |
| 6,623,856 B1 | 9/2003 | Kodas et al. |
| 6,627,115 B2 | 9/2003 | Hampden-Smith et al. |
| 6,635,348 B1 | 10/2003 | Hampden-Smith et al. |
| 6,645,398 B1 | 11/2003 | Hampden-Smith et al. |
| 6,660,185 B2 | 12/2003 | Hampden-Smith et al. |
| 6,660,680 B1 | 12/2003 | Hampden-Smith et al. |
| 6,679,937 B1 | 1/2004 | Kodas et al. |
| 6,689,186 B1 | 2/2004 | Hampden-Smith et al. |
| 6,699,304 B1 | 3/2004 | Hampden-Smith et al. |
| 6,720,211 B2 | 4/2004 | Izumi et al. |
| 6,730,245 B2 | 5/2004 | Hampden-Smith et al. |
| 6,750,475 B1 | 6/2004 | Izumi et al. |
| 6,753,108 B1 | 6/2004 | Hampden-Smith et al. |
| 6,770,226 B2 | 8/2004 | Hampden-Smith et al. |
| 6,780,350 B1 | 8/2004 | Kodas et al. |
| 6,830,823 B1 | 12/2004 | Kodas et al. |
| 6,853,004 B2 | 2/2005 | Ohtani |
| 6,866,929 B2 | 3/2005 | Kodas et al. |
| 6,875,372 B1 | 4/2005 | Hampden-Smith et al. |
| 6,909,117 B2 | 6/2005 | Ohnuma |
| 6,911,412 B2 | 6/2005 | Hampden-Smith et al. |
| 6,933,533 B2 | 8/2005 | Yamazaki et al. |
| 6,951,666 B2 | 10/2005 | Kodas et al. |
| 6,967,183 B2 | 11/2005 | Hampden-Smith et al. |
| 6,991,754 B2 | 1/2006 | Hampden-Smith et al. |
| 6,993,934 B2 | 2/2006 | Kodas et al. |
| 6,994,802 B2 | 2/2006 | Hampden-Smith et al. |
| 7,004,994 B2 | 2/2006 | Hampden-Smith et al. |
| 7,005,085 B2 | 2/2006 | Hampden-Smith et al. |
| 7,022,261 B2 | 4/2006 | Hampden-Smith et al. |
| 7,037,451 B2 | 5/2006 | Hampden-Smith et al. |
| 7,066,976 B2 | 6/2006 | Hampden-Smith et al. |
| 7,067,070 B2 | 6/2006 | Hampden-Smith et al. |
| 7,077,882 B2 | 7/2006 | Kodas et al. |
| 7,083,747 B2 | 8/2006 | Hampden-Smith et al. |
| 7,087,198 B2 | 8/2006 | Hampden-Smith et al. |
| 7,087,341 B2 | 8/2006 | Hampden-Smith et al. |
| 7,094,370 B2 | 8/2006 | Kodas et al. |
| 7,097,686 B2 | 8/2006 | Chandler et al. |
| 7,098,163 B2 | 8/2006 | Hampden-Smith et al. |
| 7,128,852 B2 | 10/2006 | Hampden-Smith et al. |
| 7,138,159 B2 | 11/2006 | Hampden-Smith et al. |
| 7,138,354 B2 | 11/2006 | Hampden-Smith et al. |
| 7,141,528 B2 | 11/2006 | Hampden-Smith et al. |
| 7,150,920 B2 | 12/2006 | Kodas et al. |
| 7,172,663 B2 | 2/2007 | Hampden-Smith et al. |
| 7,211,345 B2 | 5/2007 | Hampden-Smith et al. |
| 7,226,547 B2 | 6/2007 | Hampden-Smith et al. |
| 7,226,819 B2 | 6/2007 | Maekawa et al. |
| 7,229,572 B2 | 6/2007 | Hampden-Smith et al. |
| 7,255,954 B2 | 8/2007 | Hampden-Smith et al. |
| 7,316,725 B2 | 1/2008 | Kodas et al. |
| 7,316,790 B2 | 1/2008 | Hampden-Smith et al. |
| 7,354,471 B2 | 4/2008 | Hampden-Smith et al. |
| 7,384,447 B2 | 6/2008 | Kodas et al. |
| 7,476,411 B1 | 1/2009 | Hampden-Smith et al. |
| 7,507,687 B2 | 3/2009 | Kodas et al. |
| 7,517,606 B2 | 4/2009 | Kodas et al. |
| 7,524,528 B2 | 4/2009 | Kodas et al. |
| 7,531,108 B2 | 5/2009 | Hampden-Smith et al. |
| 7,533,361 B2 | 5/2009 | Edwards |
| 7,553,433 B2 | 6/2009 | Hampden-Smith et al. |
| 7,553,512 B2 | 6/2009 | Kodas et al. |
| 7,575,621 B2 | 8/2009 | Vanheusden et al. |
| 7,582,134 B2 | 9/2009 | Hampden-Smith et al. |
| 7,585,697 B2 | 9/2009 | Moriya |
| 7,597,769 B2 | 10/2009 | Hampden-Smith et al. |
| 7,598,129 B2 | 10/2009 | Kanno et al. |
| 7,599,165 B2 | 10/2009 | Hampden-Smith et al. |
| 7,619,248 B1 * | 11/2009 | Cleeves ......................... 257/57 |
| 7,621,976 B2 | 11/2009 | Hampden-Smith et al. |
| 7,625,420 B1 | 12/2009 | Kodas et al. |
| 7,629,017 B2 | 12/2009 | Kodas et al. |
| 7,631,518 B2 | 12/2009 | Kodas et al. |
| 7,632,331 B2 | 12/2009 | Hampden-Smith et al. |
| 7,642,213 B2 | 1/2010 | Hampden-Smith et al. |
| 7,691,664 B2 | 4/2010 | Kodas et al. |
| 7,713,899 B2 | 5/2010 | Hampden-Smith et al. |
| 7,722,687 B2 | 5/2010 | Hampden-Smith et al. |
| 7,727,630 B2 | 6/2010 | Kodas et al. |
| 7,749,299 B2 | 7/2010 | Vanheusden et al. |
| 7,824,466 B2 | 11/2010 | Vanheusden et al. |
| 7,875,542 B2 | 1/2011 | Maekawa et al. |
| 2003/0008075 A1 | 1/2003 | Ueno et al. |
| 2003/0124255 A1 | 7/2003 | Ueno et al. |
| 2003/0124263 A1 | 7/2003 | Ueno et al. |
| 2004/0055503 A1 | 3/2004 | Hasan |
| 2004/0126548 A1 | 7/2004 | Ueno et al. |
| 2004/0146647 A1 | 7/2004 | Fixter et al. |
| 2005/0003101 A1 | 1/2005 | Damerell et al. |
| 2005/0029514 A1 | 2/2005 | Moriya |
| 2005/0095356 A1 | 5/2005 | Nakamura et al. |
| 2005/0136578 A1 | 6/2005 | Ohtani |
| 2005/0200301 A1 | 9/2005 | Yamazaki et al. |
| 2007/0026580 A1 | 2/2007 | Fujii |
| 2008/0254569 A1 * | 10/2008 | Hoffman et al. .............. 438/104 |
| 2010/0006326 A1 | 1/2010 | Ueno et al. |
| 2011/0177689 A1 | 7/2011 | Maekawa et al. |

FOREIGN PATENT DOCUMENTS

| | | |
|---|---|---|
| JP | 2000-129211 | 5/2000 |
| JP | 2000-204479 | 7/2000 |
| JP | 2000-255165 | 9/2000 |
| JP | 2000-305113 | 11/2000 |
| JP | 2000-343848 | 12/2000 |
| JP | 2001-032086 | 2/2001 |
| JP | 2002-353222 | 12/2002 |
| JP | 2003-051538 | 2/2003 |
| JP | 2004-013042 | 1/2004 |
| JP | 2005-051151 | 2/2005 |
| JP | 2005-051199 | 2/2005 |
| JP | 2005-159328 | 6/2005 |
| JP | 2005-167229 | 6/2005 |
| WO | WO-03/032084 A2 | 4/2003 |
| WO | WO-2005/048223 A1 | 5/2005 |

* cited by examiner

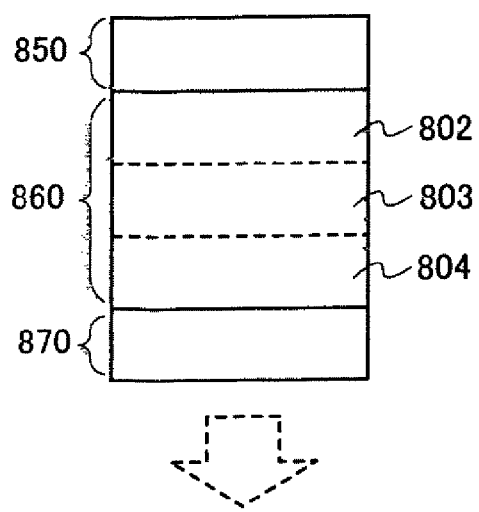
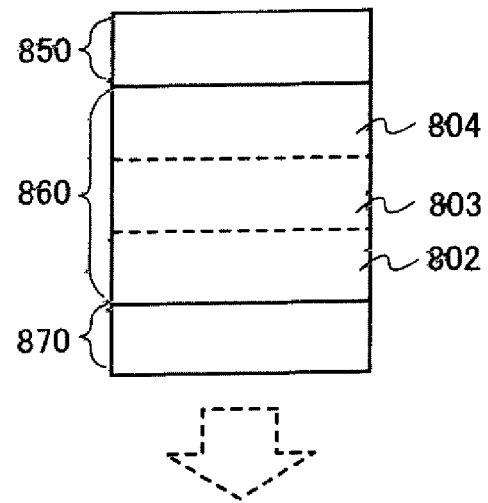
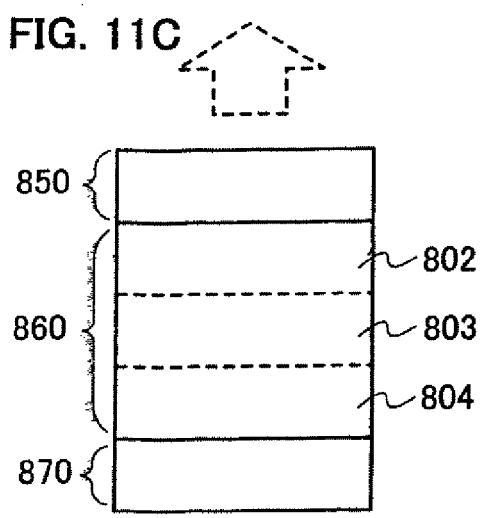
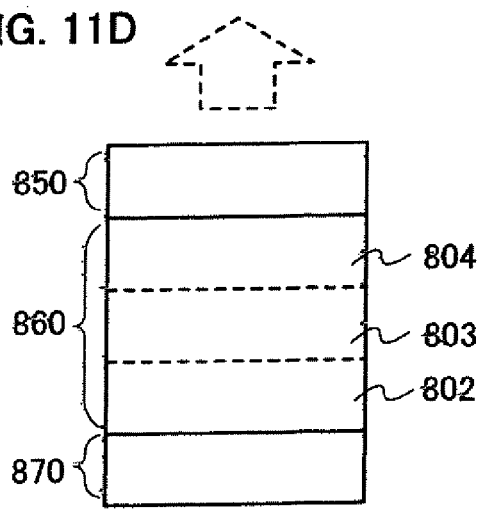

206a
206b
206c
E
F 206a  206b
          206c
205a  205b  205c  207
E                         F

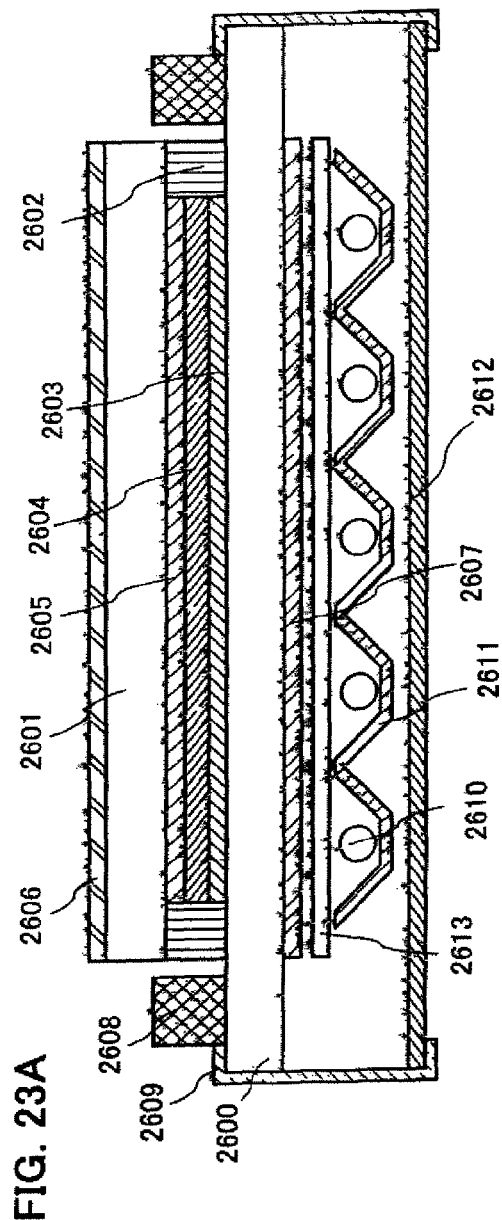
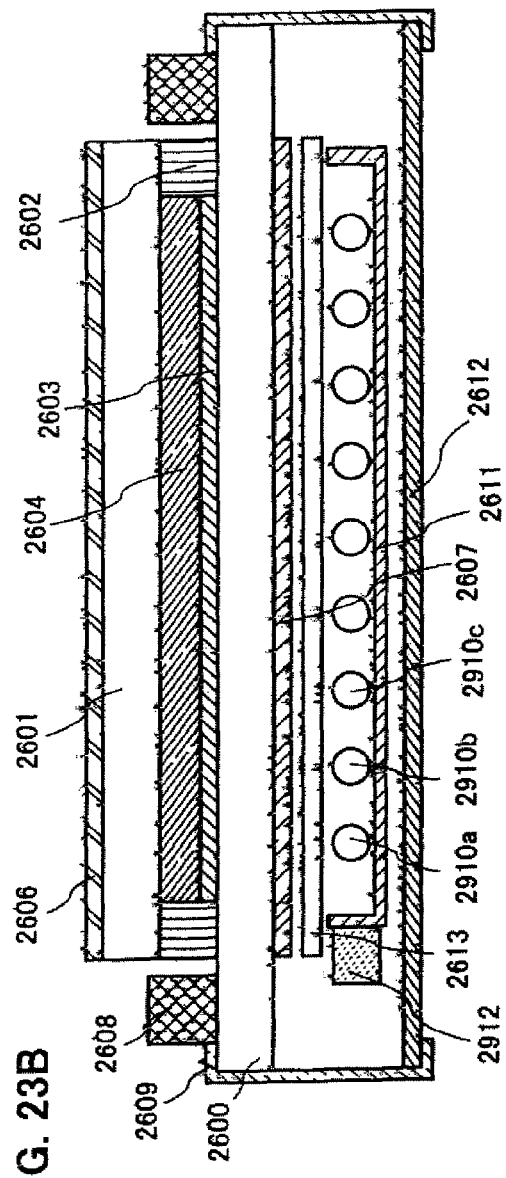
FIG. 23A
FIG. 23B

SEMICONDUCTOR DEVICE AND MANUFACTURING METHOD OF THE SAME

BACKGROUND OF THE INVENTION

1. Field of the Invention

The present invention relates to a semiconductor device formed by a plating method and a manufacturing method of the semiconductor device using the plating method.

2. Description of the Related Art

A method using a wet film formation technique in a manufacturing process of a flat panel display, a semiconductor integrated circuit, and the like has been considered. For example, a metal film has been attempted to be formed by adopting a plating method as a wet film formation technique (for example, Reference 1: Japanese Patent Laid-Open No. 2001-032086).

SUMMARY OF THE INVENTION

It is an object of the present invention to provide a technique by which the number of photolithography steps is reduced in a manufacturing process of a thin film transistor (TFT), an electronic circuit using TFTs, a semiconductor device and a display device formed with TFTs, the manufacturing process is simplified, and manufacturing using a large-area substrate having a side of more than one meter can be performed with high yield.

It is another object of the present invention to provide a technique by which such a semiconductor device or display device can be manufactured at low cost with high productivity.

In the present invention, at least one or more of conductive layers forming a wire layer, an electrode, and the like is formed by a plating method. In an electroless plating method, prior to a catalyst material for a metal material to be used for plating (also referred to as a plating metal material), a catalyst material is needed first as a material for adsorbing the above described catalyst material used for the plating metal material (in this specification, also referred to as a plating catalyst material). One feature of the present invention is to manufacture a semiconductor device or a display device by selectively forming such a catalyst material which adsorbs the plating catalyst material, into a desired shape by a method that can form the desired shape.

A growth rate of a conductive film by electroless plating is not influenced even when a pattern shape is miniaturized. Control of the film thickness can be conducted by adjusting an immersion time in a plating solution.

Note that the term "semiconductor device" in this specification means a device which can operate by utilizing semiconductor characteristics. A multilayer wire layer and a semiconductor device such as a processor chip can be manufactured by applying the present invention.

The present invention can also be used for a display device that is a device having a display function. The display device using the present invention includes a light-emitting display device; a liquid crystal display device using a liquid crystal element including a liquid crystal material as a display element, and the like. In the light-emitting display device, a TFT is connected to a light-emitting element having a layer containing an organic material, or a combination of organic and inorganic materials, which exhibits light emission called electroluminescence (hereinafter also referred to as "EL"), between electrodes.

An aspect of a manufacturing method of a semiconductor device of the present invention includes the steps of: selectively forming a photocatalyst material or a material including an amino group over a substrate by discharging a composition including the photocatalyst material or the material including an amino group; immersing the photocatalyst material or the material including an amino group in a solution including a plating catalyst material so as to adsorb or deposit the plating catalyst material onto the photocatalyst material or the material including an amino group; and immersing the plating catalyst material in a plating solution including a metal material so as to form a metal film on a surface of the photocatalyst material or the material including an amino group adsorbing or depositing the plating catalyst material, wherein pH of the solution including the plating catalyst material is adjusted in a range of 3 to 6. In addition, a nickel alloy thin film or a copper thin film is formed as the metal film.

An aspect of a manufacturing method of a semiconductor device of the present invention includes the steps of: selectively forming a photocatalyst material by discharging a solution including the photocatalyst material over a substrate; immersing the photocatalyst material in a solution including a plating catalyst material solution while irradiating the photocatalyst material with light so as to adsorb or deposit the plating catalyst material onto the photocatalyst material; and immersing the photocatalyst material in a plating solution including a metal material to form a metal film on a surface of the photocatalyst material adsorbing or depositing the plating catalyst material.

An aspect of a manufacturing method of a semiconductor device of the present invention includes the steps of: forming a material including a fluorocarbon group over a substrate; selectively forming a photocatalyst material on the material including a fluorocarbon group by discharging a solution including the photocatalyst material; immersing the photocatalyst material in a solution including a plating catalyst material, while irradiating the photocatalyst material with light, so as to adsorb or deposit the plating catalyst material onto the photocatalyst material and decompose the material including a fluorocarbon group; and immersing the plating catalyst material in a plating solution including a metal material to form a metal film on a surface of the photocatalyst material adsorbing or depositing the plating catalyst material, An aspect of a manufacturing method of a semiconductor device of the present invention includes the steps of: selectively forming a first photocatalyst material or a first material including an amino group over a substrate by discharging a composition including the first photocatalyst material or the first material including an amino group; immersing the first photocatalyst material or the first material including an amino group in a solution including a first plating catalyst material so as to adsorb or deposit the first plating catalyst material onto the first photocatalyst material or the first material including an amino group;

immersing the first plating catalyst material in a plating solution including a first metal material so as to form a gate electrode layer on a surface of the first photocatalyst material or the first material including an amino group adsorbing or depositing the first plating catalyst material; forming a gate insulating layer over the gate electrode layer; selectively forming a second photocatalyst material or a second material including an amino group over the gate insulating layer by discharging a composition including the second photocatalyst material or the second material including an amino group; immersing the second photocatalyst material or the second material including an amino group in a solution including a second plating catalyst material so as to adsorb or deposit the second plating catalyst material onto the second photocatalyst material or the second material including an amino group; and immersing the second plating catalyst material in a plating solution including a second metal material so as to form a source electrode layer and a drain electrode layer on a surface of the second photocatalyst material or the second material including an amino group adsorbing or depositing the second plating catalyst material; and forming a semiconductor layer over the source electrode layer and the drain electrode layer; wherein pH of each of the solution including the first plating catalyst material and the solution including the second plating catalyst material is adjusted in a range of 3 to 6.

An aspect of a manufacturing method of a semiconductor device of the present invention includes the steps of: selectively forming a first photocatalyst material by discharging a solution including the first photocatalyst material over a substrate; immersing the first photocatalyst material in a solution including a first plating catalyst material solution while irradiating the first photocatalyst material with light so as to adsorb or deposit the first plating catalyst material onto the first photocatalyst material; immersing the first photocatalyst material in a plating solution including a first metal material to form a gate electrode layer on a surface of the first photocatalyst material adsorbing or depositing the first plating catalyst material; forming a gate insulating layer over the gate electrode layer; selectively forming a second photocatalyst material over the gate insulating layer by discharging a solution including the second photocatalyst material; immersing the second photocatalyst material in a solution including a second plating catalyst material while irradiating the second photocatalyst material with light so as to adsorb or deposit the second plating catalyst material onto the second photocatalyst material; immersing the second photocatalyst material in a plating solution including a second metal material to form a source electrode layer and a drain electrode layer on a surface of the second photocatalyst material adsorbing or depositing the second plating catalyst material; and forming a semiconductor layer over the source electrode layer and the drain electrode layer.

An aspect of a manufacturing method of a semiconductor device of the present invention includes the steps of: forming a material including a fluorocarbon group over a substrate; selectively forming a first photocatalyst material on the material including a fluorocarbon group by discharging a solution including the first photocatalyst material; immersing the first photocatalyst material in a solution including a first plating catalyst material, while irradiating the first photocatalyst material with light, so as to adsorb or deposit the first plating catalyst material onto the first photocatalyst material and decompose the material including a fluorocarbon group; immersing the first plating catalyst material in a plating solution including a first metal material to form a gate electrode layer on a surface of the first photocatalyst material adsorbing or depositing the first plating catalyst material; forming a gate insulating layer over the gate electrode layer; selectively forming a second photocatalyst material over the gate insulating layer by discharging a solution including the second photocatalyst material; immersing the second photocatalyst material in a solution including a second plating catalyst material while irradiating the second photocatalyst material with light so as to adsorb or deposit the second plating catalyst material onto the second photocatalyst material; immersing the second photocatalyst material in a plating solution including a second metal material to form a source electrode layer and a drain electrode layer on a surface of the second photocatalyst material adsorbing or depositing the second plating catalyst material; and forming a semiconductor layer over the source electrode layer and the drain electrode layer.

In accordance with the present invention, components such as wires which constitute parts of a semiconductor device, a display device or the like can be formed stably to have a desired shape. Further, cost reduction can be achieved. Therefore, high performance and highly reliable semiconductor device and display device can be manufactured with high yield.

BRIEF DESCRIPTION OF DRAWINGS

In the accompanying drawings:

FIGS. 11A to 11D are diagrams explaining structures of light-emitting elements applicable to the present invention;

FIGS. 23A and 23B are cross-sectional views each explaining a structure example of a liquid crystal display module of the present invention;

DETAILED DESCRIPTION OF THE INVENTION

Figure 1A:
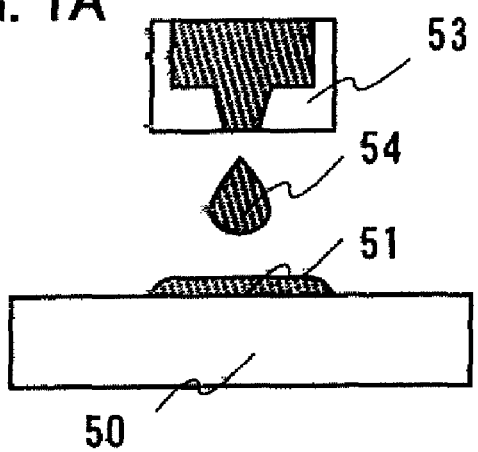
FIGS. 1A to 1D are conceptual diagrams explaining the present invention.

Embodiment Modes of the present invention will be hereinafter described with reference to the accompanying drawings. However, the present invention is not limited to the following description. As is easily known to a person skilled in the art, the mode and the detail of the present invention can be variously changed without departing from the spirit and the scope of the present invention. Therefore, the present invention is not interpreted as being limited to the following description of the embodiment modes. Note that the same portions or portions having a similar function are denoted by the same reference numeral through different diagrams in a structure of the present invention to be described hereinafter, and repetitive description thereof is omitted.

Embodiment Mode 1

An embodiment mode of the present invention will be described with reference to FIGS. 1A to 1D.

In the present invention, at least one or more of conductive layers forming a wire layer, an electrode, and the like is formed by a plating method. In a plating method, prior to a catalyst material for a metal material to be used for plating (also referred to as a plating metal material), a catalyst material is needed first as a material for adsorbing the above described catalyst material used for the plating metal material (in this specification, also referred to as a plating catalyst material). One feature of this embodiment mode is to manufacture a semiconductor device or a display device by selectively forming such a catalyst material which adsorbs the plating catalyst material, into a desired shape by a method that can form the desired shape.

A growth rate of a conductive film by electroless plating is not influenced even when a pattern shape is miniaturized. If a thick conductive film is required, an immersion time in a plating solution may be extended.

As a method by which a formation object can be selectively formed into a desired pattern, a droplet-discharge (jet) method (also referred to as an ink-jet method depending on the system) can be used, which can form a thin film with a predetermined pattern by selectively discharging (jetting) a droplet of a composition mixed for a specific purpose can be used. In addition, a method by which an object can be transferred or drawn into a desired pattern, for example, various printing methods (a method by which a desired pattern can be formed, such as screen (mimeograph) printing, offset (planography) printing, relief printing, or gravure (intaglio) printing), a selective application method, or the like can be used.

This embodiment mode employs a method for discharging (jetting) a composition containing a fluid catalyst material as a droplet so as to selectively form a pattern in a manufacturing process of a semiconductor device or a display device. A droplet containing a material forming a component is discharged to a formation region of a catalyst material, and the droplet is fixed (or solidified) by baking, drying, or the like to form a catalyst material having a desired pattern. In a case of directly manufacturing a wire layer by an ink jet method, an organic material serving as a binder is included in the wire layer; therefore, the wire layer tends to be highly resistive. However, a low-resistant wire layer can be manufactured by a plating method.

Figure 32:
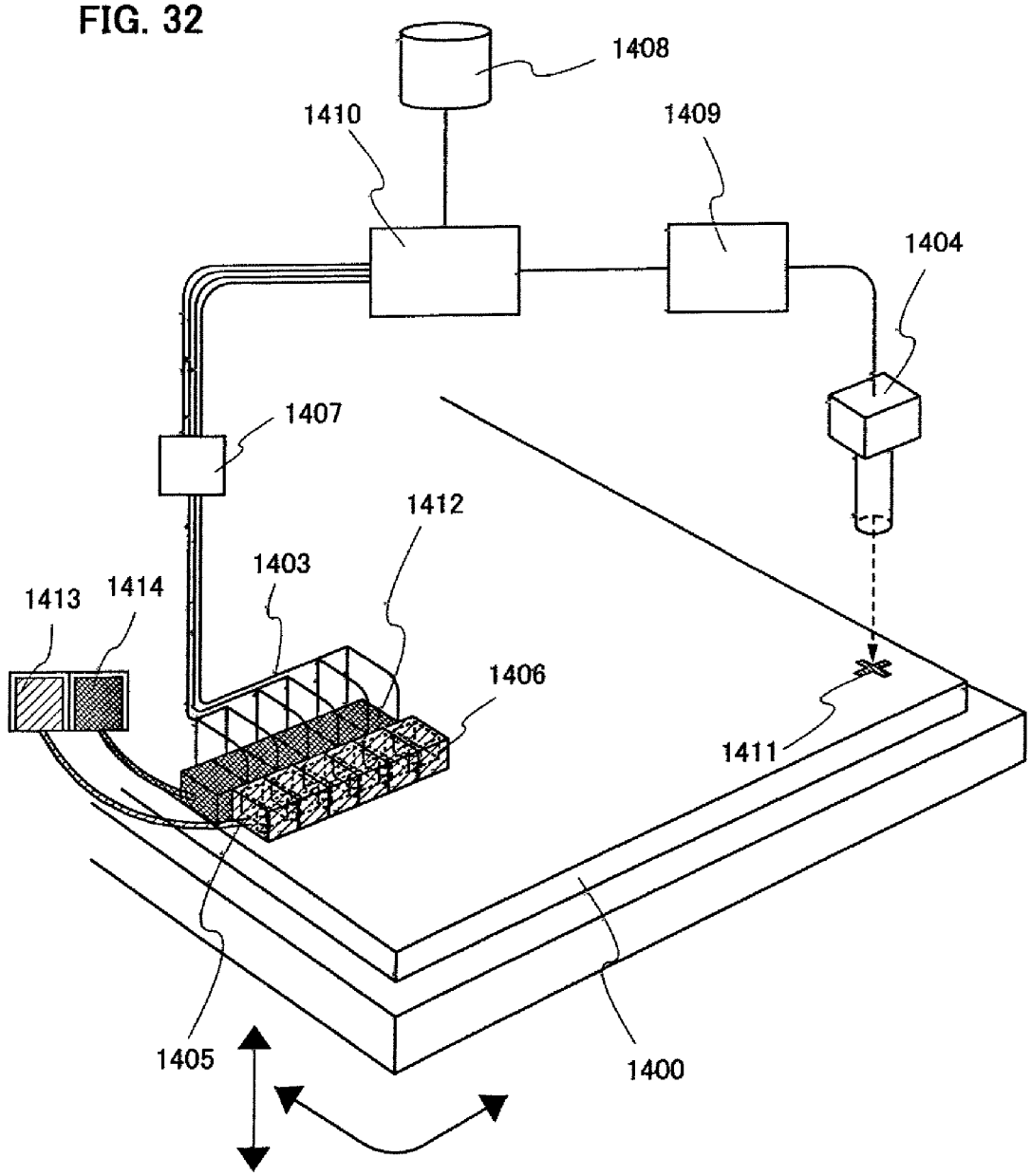
FIG. 32 is a diagram showing a structure of a droplet-discharge device which can be applied to the present invention.

One mode of a droplet-discharge device used for a droplet-discharge method is shown in FIG. 32. Each of heads 1405 and 1412 of a droplet-discharge means 1403 is connected to a control means 1407, and this control means 1407 is controlled by a computer 1410, so that a preprogrammed pattern can be drawn. The formation position timing for drawing) may be determined, for example, based on a marker 1411 that is formed over a substrate 1400. Alternatively, a reference point may be fixed based on an edge of the substrate 1400. The reference point is detected by an imaging means 1404, and converted into a digital signal by an image processing means 1409. Then, the digital signal is recognized by the computer 1410 to generate a control signal, and the control signal is transmitted to the control means 1407. An image sensor or the like using a charge coupled device (CCD) or a complementary metal oxide semiconductor (CMOS) can be used as the imaging means 1404. Naturally, information about a pattern to be formed over the substrate 1400 is stored in a storage medium 1408, and the control signal is transmitted to the control means 1407 based on the information, so that each of the heads 1405 and 1412 of the droplet-discharge means 1403 can be individually controlled. The heads 1405 and 1412 are supplied with a material to be discharged, from material supply sources 1413 and 1414 through pipes, respectively.

The head 1405 has an internal structure which has a space filled with a liquid material as indicated by dotted lines 1406 and a nozzle which is a discharge opening. Although not shown, an inside structure of the head 1412 is similar to the head 1405. When the nozzle sizes of the heads 1405 and 1412 are different from each other, different materials with different widths can be discharged simultaneously. Also, a conductive material, an organic material, an inorganic material, and the like can each be discharged from one head and drawn. In the case of drawing over a large area such as an interlayer film, the same material can be simultaneously discharged from a plurality of nozzles to improve throughput, and thus, drawing can be performed. When a large-sized substrate is used, the heads 1405 and 1412 can freely move over the substrate in a direction indicated by arrows, and a drawing region can be freely set. Thus, a plurality of the same patterns can be drawn over one substrate.

In the case of forming a film (such as an insulating film or a conductive film) by a droplet-discharge method, the film is formed as follows: a composition containing a film material which is processed into a particle form is discharged, and fused or welded by baking to solidify the composition as a film. Many of films formed by a sputtering method or the like have a columnar structure, whereas many of films formed by discharging and baking the composition containing a conductive material in this manner, have a polycrystalline structure having a large number of grain boundaries.

An embodiment mode of the present invention will be described with reference to FIGS. 1A to 1D.

A material having a function of adsorbing a plating catalyst material serving as a catalyst for plating a metal material, is formed over a substrate 50 by a droplet-discharge method. As the photocatalyst material has a function of adsorbing or depositing a plating catalyst material, there is a photocatalyst material having a photocatalytic function, a substance having an amino group and the like.

As a material including an amino group, a coupling agent which is chemically coupled with a substrate is preferable in terms of adhesion. As the coupling agent, a silane coupling agent and a titanium coupling agent can be used. A silane coupling agent having an amino group at its end group, for example, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, N,N-bis[3-(trimethoxysilyl)propyl] ethylenediamine, p[N-(2-aminoethyl)aminomethyl] phenethyltrimethoxysilane, or the like can be used.

The photocatalyst material can reduce and deposit the plating catalyst material included in the solution by a photocatalytic function. The photocatalyst material is preferably titanium oxide ($TiO_2$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like. Photocatalytic activity can be caused by irradiating such a photocatalyst material with light in an ultraviolet region (having a wavelength of 400 nm or less, preferably, 380 nm or less).

A photocatalyst material including an oxide semiconductor containing a plurality of metals can be formed by mixing and melting salts of constituting elements. When a solvent needs to be removed, baking or drying may be performed. Specifically, the photocatalyst material may be heated at a predetermined temperature (for example, 300° C. or higher), and preferably performed in an atmosphere including oxygen.

Through this heat treatment, the photocatalyst material can have a predetermined crystal structure. For example, as for titanium oxide ($TiO_2$), the photocatalyst material has an anatase type or a rutile-anatase mixed type, and an anatase type is preferentially formed in a low-temperature phase. Therefore, the photocatalyst material may be heated even when it does not have a predetermined crystal structure.

Photocatalytic activity can be improved by further doping the photocatalyst material with transition metal (such as Pd, Pt, Cr, Ni, V, Mn, Fe, Ce, Mo, or W), or photocatalyst activity can be caused by light in a visible light region (having a wavelength of 400 nm to 800 nm). This is because a transition metal forms a new level in a forbidden band of an active photocatalyst having a wide band gap, and can expand a light absorption range to the visible light region. For example, an acceptor type such as Cr or Ni; a donor type such as V or Mn; an amphoteric type such as Fe; or Ce, Mo, W, or the like can be used for doping. Since a wavelength of light can be determined by the photocatalyst material in this manner, light irradiation means irradiation of light having such a wavelength as to activate the photocatalyst material.

In addition, when the photocatalyst material is heated and reduced in vacuum or under hydrogen reflux, oxygen defects are generated in a crystal. Without doping with a transition element as described above, an oxygen defect can play a role equivalent to an electron donor In particular, in the case of adopting a sol-gel method, oxygen defects originally exist, so that reduction is not necessarily performed. By doping with a gas of $N_2$ or the like, an oxygen defect can be formed.

The plating catalyst material is appropriately selected depending on a plating metal material. As the plating catalyst material, palladium (Pd), rhodium (Rh), ruthenium (Ru), osmium (Os), iridium (Ir), cold (Au), platinum (Pt), silver (Ag), or the like may be used. The plating catalyst material is dissolved in a solution, and is used as a solution containing the plating catalyst material In this embodiment mode, a liquid composition 54 including aminopropyltriethoxysilane which is a material including an amino group is discharged by a droplet-discharge method 53, and a solvent is dried. The material including an amino group is chemically coupled with the substrate, thereby selectively forming a photocatalyst material or the material including an amino group 51 (FIG. 1A).

Figure 1B:
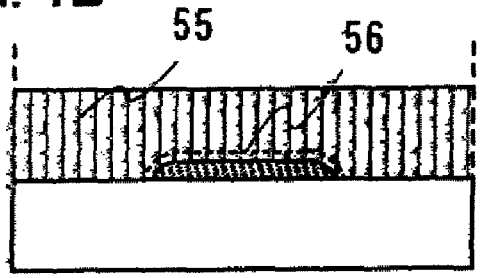

In order to adsorb a plating catalyst material onto the photocatalyst material or the material including an amino group 51, the photocatalyst material or the material including an amino group 51 is immersed in a solution 55 containing a plating catalyst material to adsorb a plating catalyst material 56 onto the surface of the photocatalyst material or the material including an amino group 51 (FIG. 1B). The pH of the solution containing a plating catalyst material is adjusted, and the pH is preferably adjusted to 3 to 6 with an alkaline solution or an acid solution. In this embodiment mode, palladium is used as the plating catalyst material, and a compound such as palladium chloride ($PdCl_2$) or palladium(II) sodium chloride ($2NaCl.PdCl_2$) can be used. Since an acid solution such as a hydrochloric acid is used in dissolving such a plating catalyst material, the pH of the solution becomes 2 or less. The pH is preferably 3 to 6 (more preferably, 4 to 5) to obtain a sufficient amount of plating catalyst material to be adsorbed or deposited; therefore, the pH is adjusted by adding potassium hydroxide (KOH), sodium hydroxide (NaOH), or the like. In this embodiment mode, as the solution 55 containing a plating catalyst material, a solution is used, which is produced by dissolving palladium(II) chloride ($PdCl_2$) in a dilute hydrochloric acid and adjusting the pH to approximately 4 to 6 with potassium hydroxide. Note that the immersion time in this embodiment mode is approximately 30 seconds to 3 minutes.

As long as the solution 55 containing a plating catalyst material may be in contact with the photocatalyst material or the material including an amino group 51, there is no limitation on the immersion method. Therefore, the substrate 50 may be arranged obliquely (or vertically), and the solution 55 containing a plating catalyst material may be applied to the surface of the photocatalyst material 55 to flow. If plating is performed with a substrate set obliquely (or vertically) and a solution is applied, there is the advantage of miniaturizing an apparatus used for a process in a case of using a large-area substrate.

Figure 1C:
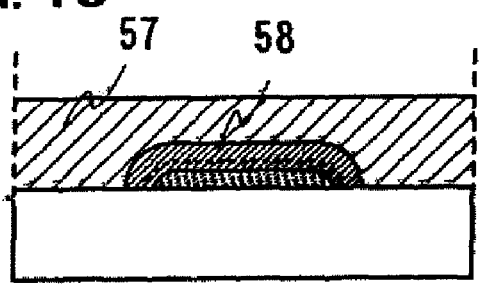
Figure 1D:
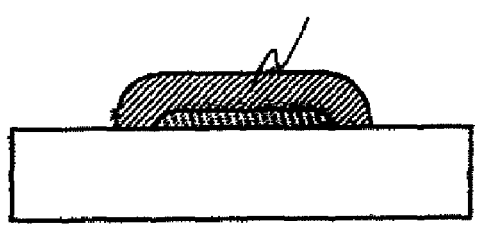

The photocatalyst material or the material including an amino group 51 adsorbing the plating catalyst material 56 on its surface is immersed in the plating solution 57 including a plating metal material so as to grow a metal film 58 on the plating catalyst material 56 (FIG. 1C). The immersion time is controlled so as to obtain a desired film thickness and a conductive layer 59 is formed (FIG. 1D). The plating solution contains, as its main component, a metal salt (a salt containing a metal material to be deposited, typically, chloride or sulphate) and a reducing agent (which provides an electron to deposit a metal ion as metal). In addition, a pH adjuster, a buffer, a complexing agent, an accelerator, a stabilizer, an improver, or the like may be added as an auxiliary component. With only the main component, metal ions are deposited as metal under the right conditions such as pH and bath temperature. In contrast to the main component, the auxiliary component functions to extend the life of a plating bath (plating solution) and to improve the efficiency of a reducing agent, and a highly economical electroless plating method can be performed depending on a combination with auxiliary component. The pH adjuster influences a plating rate, a reduction efficiency, and the state of a coating film by plating. The buffer (various organic acids or weak inorganic acids) suppresses pH fluctuation caused by a substance generated when metal deposition is caused by the reduction of a metal ion in an electroless plating method. The complexing agent contributes to prevention of hydroxide precipitation in an alkaline solution and plating solution decomposition, adjustment of free metal ion concentration and plating rate, and the like (typically, ammonia, ethylenediamine, pyrophosphate, a citric acid, an acetic acid, various organic salts, or the like is used). The accelerator improves metal deposition efficiency by suppressing generation of a hydrogen gas as well as accelerating the plating rate, which is added in minute amounts (typically, sulfide or fluoride is used). The stabilizer functions to suppress generation of a reductive reaction in portions other than the surface of an object to be plated. The stabilizer suppresses natural decomposition of a plating bath or the like and prevents a precipitation or the like generated with aging of a plating bath from reacting with the reducing agent, so as not to intensely generate a hydrogen gas (typically, chloride, sulfide, nitrate of lead or the like is used). The improver improves the state of a coating film by plating and improves luster and the like (typically, a surfactant is used).

As the plating metal material, nickel (Ni), a nickel alloy (such as a nickel phosphorus (NiP) alloy, a nickel cobalt (NiCo) alloy, a nickel cobalt phosphorus (NiCoP) alloy, a nickel iron phosphorus (NiFeP) alloy, or a nickel tungsten phosphorus (NiWP) alloy), copper (Cu), gold (Au), cobalt (Co), tin (Sn), or the like can be used.

In this embodiment mode, as the solution 57 containing a metal material, a mixture of nickel sulphate hexahydrate ($NiSO_4$) which is a metal salt, a hypophosphorous acid ($H_3PO_2$) which is a reducing agent, and a lactic acid and a malic acid which are complexing agents is used. A metal film to be deposited is a nickel phosphorus alloy (NiP) thin film.

The plating catalyst material 56 is adsorbed to cover the surface of the photocatalyst material or the material including an amino group 51. Since a metal film formed by plating grows approximately isotropically, the conductive layer 59 is formed to cover top and side faces of the photocatalyst material or the material including an amino group 51 as shown in FIG. 1D.

In this embodiment mode, the photocatalyst material or the material including an amino group 51 for adsorbing the plating catalyst material 56 is selectively formed by a droplet-discharge method. Thus, a mask or a photolithography process is not required to form a desired shape. Thus, the process is also simplified and a conductive layer can be formed at low cost with high productivity. Accordingly, a semiconductor device, a display device and the like can be manufactured at low cost with high productivity in accordance with the present invention.

In addition, a plating method is used; therefore, the thickness or size of a conductive layer can be controlled relatively easily, and a conductive layer which is suitable for an intended application can be manufactured. Therefore, a high-performance and highly reliable semiconductor device which can operate at high speed can also be manufactured.

Embodiment Mode 2

An embodiment mode of the present invention will be described with reference to FIGS. 2A to 2B. Embodiment Mode 2 describes an example of controlling wettability of a formation region, in forming a film by a droplet-discharge method in Embodiment Mode 1. Thus, description of the same portions or portions having similar functions is not repeated.

A material having a function of adsorbing a plating catalyst material which is a catalyst for plating a metal material is formed over a substrate 60 by a droplet-discharge method. As a material having a function of adsorbing or depositing a plating catalyst material, there is a photocatalyst material having a photocatalytic function, a material including an amino group or the like.

Thus, a surface of the substrate 60 which is a formation region of a composition 64 including a photocatalyst material or a material including an amino group is preferably controlled to have wettability by the liquid composition 64 including a photocatalyst material or a material including an amino group, which is to form a photocatalyst material or a material including an amino group. The degree of wettability may be set appropriately depending on a line width or a pattern shape of the photocatalyst material or the material including an amino group to be formed. The wettability can be controlled by a treatment described below. In this embodiment mode, in forming a photocatalyst material or a material including an amino group, a contact angle between the formation region and the composition including the photocatalyst material or the material including an amino group is preferably 20° or more, and more preferably, 20° to 40°.

Wettability of a solid surface is influenced by chemical properties of the surface. If a material having low wettability by a liquid composition is formed, a surface thereof becomes a region having low wettability by the liquid composition (hereinafter also referred to as a low wettability region). On the other hand, if a material having high wettability by a liquid composition is formed, a surface thereof becomes a region having high wettability by the liquid composition (hereinafter also referred to as a high wettability region). In the present invention, a treatment of controlling surface wettability means forming regions having different wettability by a liquid composition in a region to be attached with the liquid composition.

The regions having different wettability have a difference in wettability by a liquid composition, where contact angles to the liquid composition are different from each other. A region where a contact angle to the composition containing is large, is a region having lower wettability (hereinafter also referred to as a low wettability region) and a region, where a contact angle thereto is small is a region having higher wettability (hereinafter also referred to as a high wettability region). When a contact angle is large, a liquid composition having fluidity does not spread on a surface of a region, and the surface repels the composition and is not wetted thereby. When a contact angle is small, a composition having fluidity spreads on a surface, and the surface is wetted well thereby. Therefore, the regions having different wettability have different surface energy. The region having low wettability has low surface energy, and the region having high wettability has high surface energy.

A method of controlling wettability of a formation region to become low by forming a material having a low wettability is shown first. A material including a fluorocarbon group (fluorocarbon chain) or a material including a silane coupling agent can be used as the material having a low wettability. The silane coupling agent is expressed by the chemical formula: $Rn—Si—X_{(4-n)}$ (n=1, 2, 3). Here, R represents a material including a relatively inactive group such as an alkyl group. X includes a hydrolytic group such as halogen, a methoxy group, an ethoxy group, or an acetoxy group that is bondable by a condensation with a hydroxyl group or adsorbed water on a base material surface.

As a typical example of the silane coupling agent, a fluorine-based silane coupling agent (fluoroalkylsilane (hereinafter also referred to as FAS)), which has a fluoroalkyl group for R, can be used, thereby lowering the wettability more. R in FAS has a structure expressed by $(CF_3)(CF_2)_x(CH_2)_y$ (x is an integer in the range of 0 to 10, and y is an integer in the range of 0 to 4). When a plurality of Rs or Xs are bonded with Si, the Rs or Xs may be all the same or different from one another. The following can be given as typical FAS: fluoroalkylsilane such as heptadefluorotetrahydroclecyltriethoxysilane, heptadecafluorotetrahydrodecyltrichlorosilane, tridecafluorotetrahydrooctyltrichlorosilane, or trifluoropropyltrimethoxysilane.

In addition, a material including an alkyl group without a fluorocarbon chain being provided in R of a silane coupling agent can also be used as the material having a low wettability. Octadecyltrimethoxysilane or the like can be used as, for example, organosilane.

As a solvent of a solution including a material having a low wettability, a hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, or squalane; tetrahydrofuran; or the like can be used.

As an example of a composition for controlling wettability to become lower and for forming a low wettability region, a material having a fluorocarbon chain (e.g., fluorine-based resin) can be used. As a fluorine-based resin, the following can be used: a polytetrafluoroethylene (PTFE) resin; perfluoroalkoxyalkane (PFA) or tetrafluoroethylene perfluoroalkylvinylether copolymer resin; a perfluoroethylenepropene copolymer (PFEP) or tetrafluoroethylene-hexafluoropropylene copolymer resin; an ethylene-tetrafluoroethylene copolymer (ETFE) or tetrafluoroethylene-ethylene copolymer resin; a polyvinylidene fluoride (PVDF) resin; a polychlorotrifluoro ethylene (PCTFE) or polytrifluorochloroethylene resin; an ethylene-chlorotrifluoroethyle copolymer (ETFE) or polytrifluorochloroethylene-ethylene copolymer resin; a polytetrafluoroethylene-perfluorodioxole copolymer (TFE/PDD); a polyvinyl fluoride (PVF) or vinyl fluoride resin; or the like.

Further, when a treatment using $CF_4$ plasma or the like is performed on an inorganic or organic material, wettability can be reduced. As the organic material, for instance, a material of a solvent such as $H_2O$ mixed with a water-soluble resin such as polyvinyl alcohol (PVA) can be used. In addition, a combination of PVA and another water-soluble resin can be used. An organic material (organic resin material) (polyimide or acrylic) or a silicone resin material may be used.

In this embodiment mode, FAS is formed on the surface of the substrate 60 as a base film 71 by spin coating; thus, wettability of the surface of the substrate 60 is adjusted. The wettability is with respect to a liquid composition containing a photocatalyst material or a material including an amino group, which is to form the photocatalyst material or the material including an amino group in a later step.

Figure 2A:
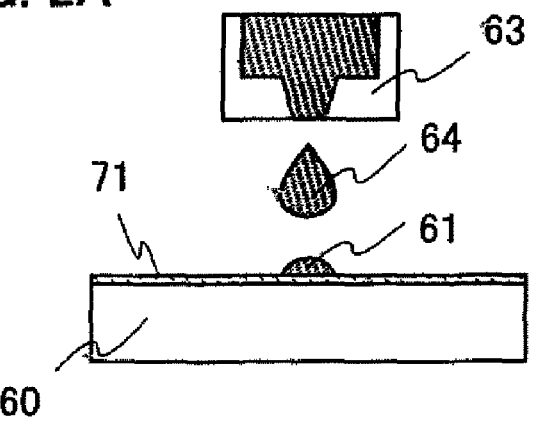
FIGS. 2A to 2D are conceptual diagrams explaining the present invention.

In this embodiment mode, a liquid composition 64 including titanium oxide which is a photocatalyst material is discharged by a droplet-discharge method 63, and solidified, thereby selectively forming a photocatalyst material 61 (FIG. 2A). A more liquid composition 64 is repelled more by the base film 71, and does not spread. Thus, a microscopic shape such as a thin line shape can be selectively formed.

The photocatalyst material 61 is immersed in a solution 65 including a plating catalyst material so that the plating catalyst material is deposited on the photocatalyst material 61. Thus, the plating catalyst material 66 is deposited on the surface of the photocatalyst material 61 (FIG. 2B). At this time, light 73 is delivered onto the photocatalyst material 61 from a light source 72. The photocatalyst material is activated by light, and the photocatalytic function reduces the plating catalyst material included in the solution 65 including the plating catalyst material. Thus, the plating catalyst material 66 is deposited on the surface of the photocatalyst material 61. In the case where the photocatalyst material is activated by this light irradiation and the photocatalytic function of the photocatalyst material is utilized, pH of the solution including the plating catalyst material is not needed to be adjusted, unlike Embodiment Mode 1. The light 73 is light having a wavelength generating the photocatalytic function of the photocatalyst material 61, and light-irradiation time and immersion time are adjusted appropriately in accordance with light energy. In this embodiment mode, since titanium oxide is used as the photocatalyst material 61, ultraviolet light is used as the light 73. By this irradiation of ultraviolet light, FAS serving as the base film 71 is decomposed and removed.

In the case of using a photocatalytic function, sodium hydroxide (NaOH), potassium hydroxide (KOH), or the like does not need to be added into the solution including the plating catalyst material, for pH control. Therefore, the use of a photocatalytic function has an advantage in that a material which may have an adverse effect depending on materials of the semiconductor layer, such as potassium hydroxide (KOH), does not need to be used.

As long as the solution 65 including a plating catalyst material may be in contact with the photocatalyst material 61, there is no limitation on the immersion method. Therefore, the substrate 60 may be arranged obliquely (or vertically), and the solution 65 containing a plating catalyst material may be applied to the surface of the photocatalyst material 61 over the substrate 60 to flow. If plating is performed with a substrate set obliquely (or vertically) and a solution applied thereto, there is the advantage of miniaturizing an apparatus used for a process even in the case of using a large-area substrate.

Figure 2B:
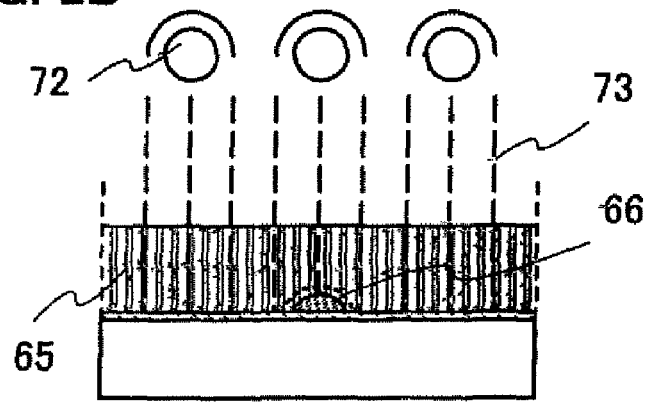
Figure 2C:
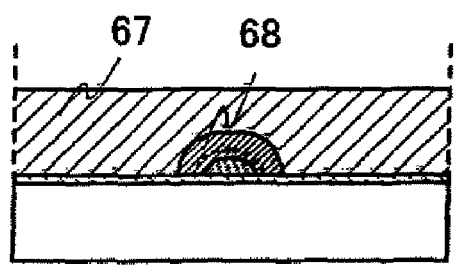
Figure 2D:
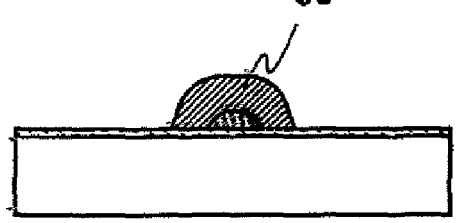

The photocatalyst material 61 adsorbing the plating catalyst material 66 on its surface is immersed in a plating solution 67 including a metal material, and a metal film 68 is grown on the plating catalyst material 66 (FIG. 2C). The immersion time is controlled to obtain a desired film thickness to form a conductive layer 69 (FIG. 2D).

In this embodiment mode, as a plating solution 67 including a metal material, a mixture of nickel sulphate hexahydrate ($NiSO_4$) which is a metal salt, a hypophosphorous acid ($H_3PO_2$) which is a reducing agent, and a lactic acid and a malic acid which are complexing agents is used. A conductive film to be deposited is a nickel phosphorus alloy (NiP) film.

The plating catalyst material 66 is adsorbed to cover the surface of the photocatalyst material 61. Since a metal film formed by plating is grown approximately isotropically, the conductive layer 69 is formed to cover top and side faces of the photocatalyst material 61 as shown in FIG. 2D.

In this embodiment mode, a photocatalyst material 61 which adsorbs a plating catalyst material 66 is selectively formed by a droplet-discharge method. Thus, a mask or a photolithography process is not required to form a desired shape. Thus, the process is also simplified and a conductive layer can be formed at low cost with high productivity.

Accordingly, a semiconductor device, a display device and the like can be manufactured at low cost with high productivity.

Embodiment Mode 3

Figure 27A:
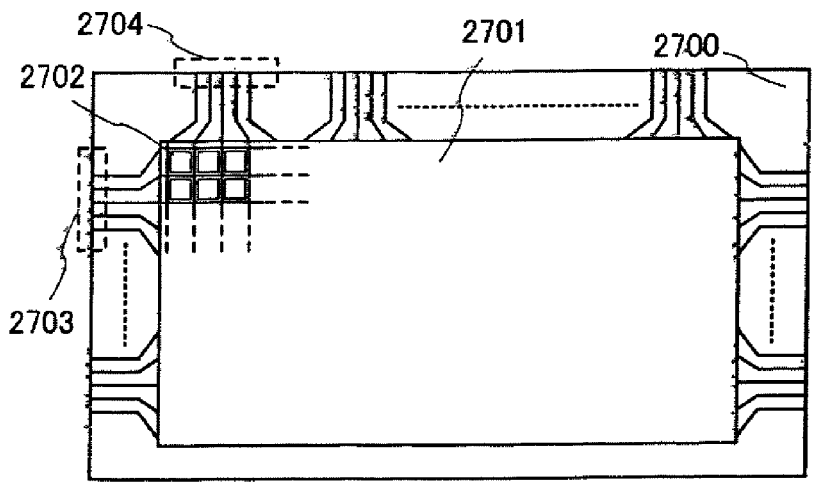
FIGS. 27A to 27C are top views of display devices of the present invention.

FIG. 27A is a top view showing a structure of a display panel in accordance with the present invention. A pixel portion 2701 in which pixels 2702 are arranged in matrix, a scanning line input terminal 2703, and a signal line input terminal 2704 are formed over a substrate 2700 having an insulating surface. The number of pixels may be determined in accordance with various standards. In the case of XGA, the number of pixels may be 1024×768×3 (RGB). In the case of UXGA, the number of pixels may be 1600×1200×3 (RGB), and in the case of full-spec high-definition display, it may be 1920×1080×3 (RGB).

The pixels 2702 are formed in matrix by intersections of scanning lines extended from the scanning line input terminal 2703 and signal lines extended from the signal line input terminal 2704. Each pixel 2702 is provided with a switching element and a pixel electrode connected thereto. A typical example of the switching element is a TFT. The gate electrode of the TFT is connected to a scanning line, and a source or drain of the TFT is connected to a signal line, which enables each pixel to be independently controlled by a signal inputted from outside.

As main components of a TFT, a semiconductor layer, a gate insulating layer, and a gate electrode layer are given, and a wire layer connected to source and drain regions which are formed in the semiconductor layer accompanies thereto. In terms of a structure, a top gate type in which a semiconductor layer, a gate insulating layer, and a gate electrode layer are provided from the substrate side; a bottom gate type in which a gate electrode layer, a gate insulating layer, and a semiconductor layer are provided from the substrate side; and the like are typically known. Any of the structures may be applied to the present invention.

Figure 28A:
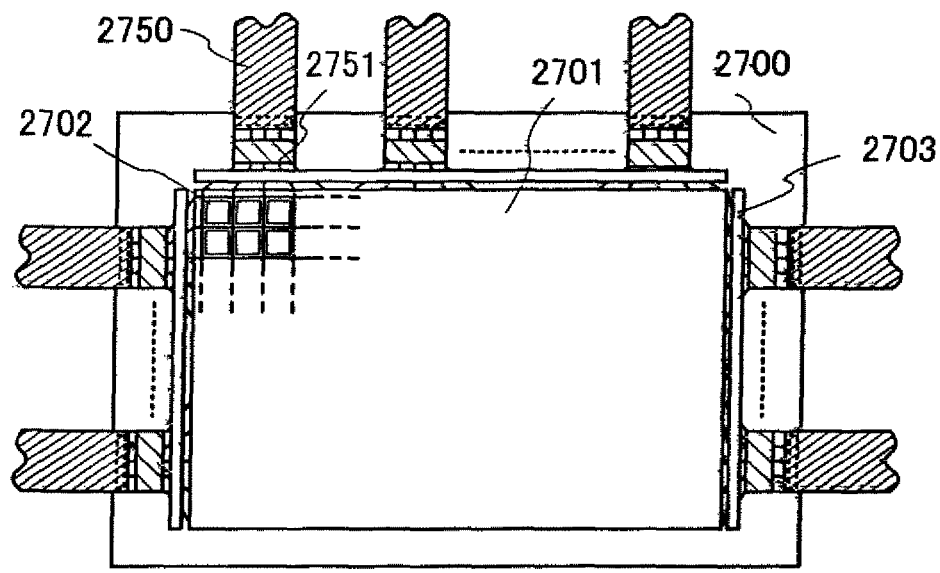
FIGS. 28A and 28B are top views of display devices of the present invention.
Figure 28B:
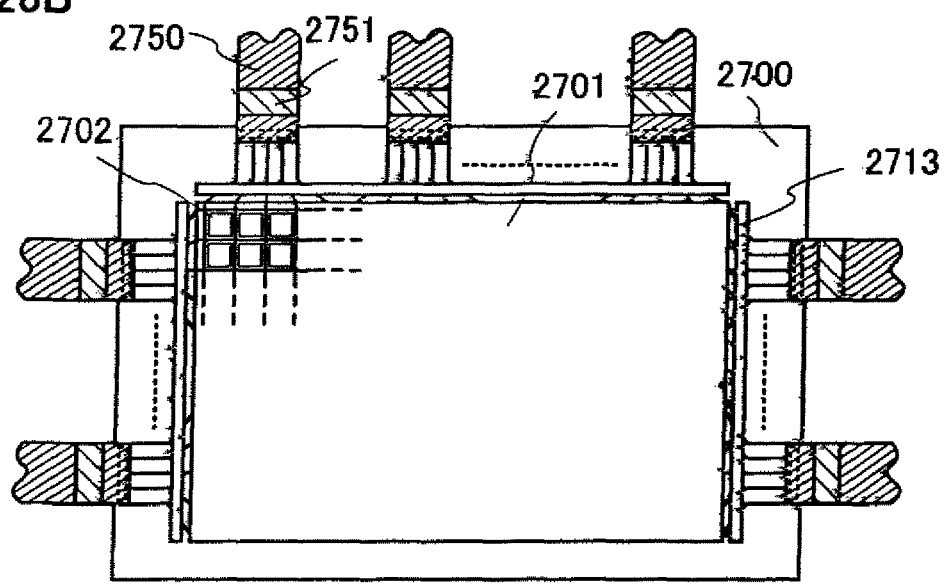

FIG. 27A shows a structure of a display panel in which a signal to be inputted to a scanning line and a signal line is controlled by an external driver circuit. Alternatively, a driver IC 2751 may be mounted on a substrate 2700 by a COG (Chip on Glass) method as shown in FIG. 28A. As another mounting mode, a TAB (Tape Automated Bonding) method may also be used as shown in FIG. 28B. The driver IC may be formed over a single crystal semiconductor substrate or may be formed of a TFT over a glass substrate. In FIGS. 28A and 28B, the driver IC 2751 is connected to an FPC 2750.

Figure 27B:
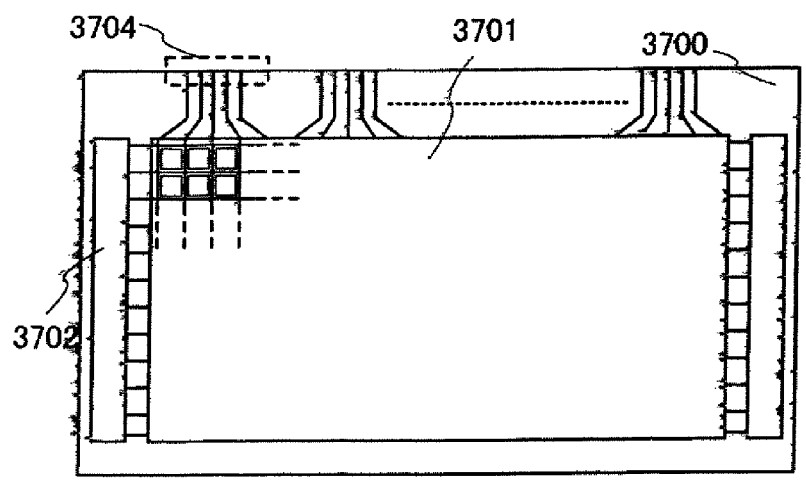
Figure 27C:
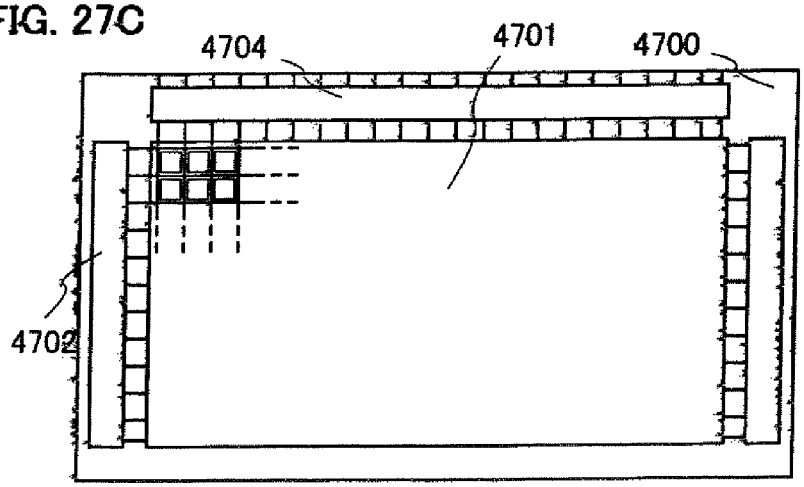

When a TFT provided in a pixel is formed of a polycrystalline (microcrystalline) semiconductor having high crystallinity, a scanning line driver circuit 3702 can be formed over a substrate 3700 as shown in FIG. 27B. In FIG. 27B, reference numeral 3701 denotes a pixel portion, and a signal line driver circuit is controlled by an external driver circuit in the same manner as in FIG. 27A. Like the TFT formed in the present invention, when the TFT provided in a pixel is formed of a polycrystalline (microcrystalline) semiconductor, a single crystal semiconductor, or the like having high mobility, a scanning line driver circuit 4702 and a signal line driver circuit 4704 can be formed to be integrated over a glass substrate 4700 as shown in FIG. 27C.

Figure 8A:
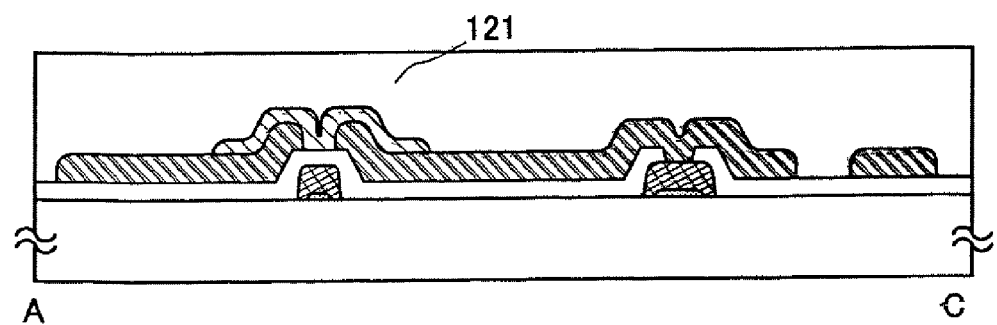
FIGS. 8A and 8B are diagrams explaining a method for manufacturing a display device of the present invention.
Figure 8B:
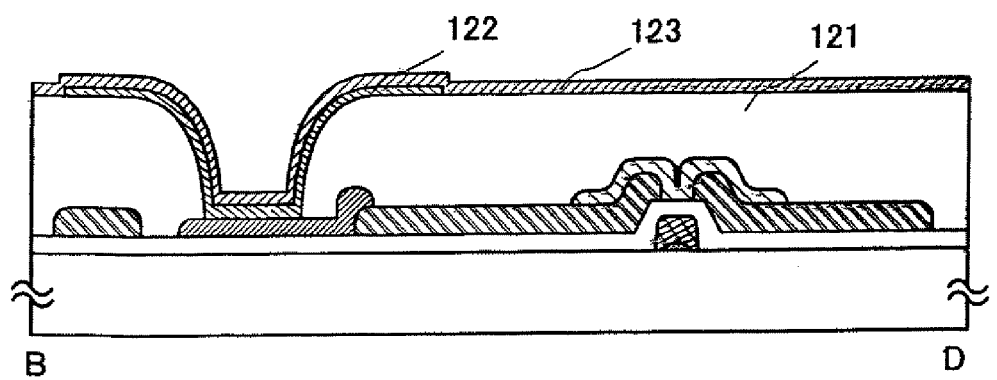
Figure 9A:
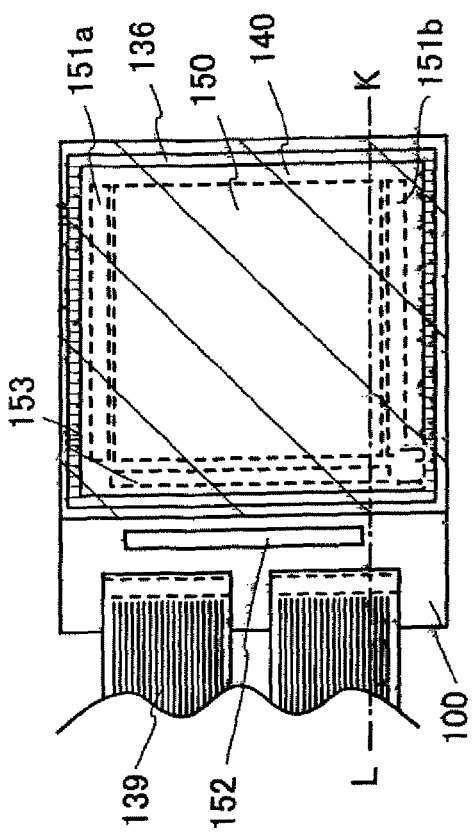
FIGS. 9A and 9B are diagrams explaining a display device of the present invention.
Figure 9B:
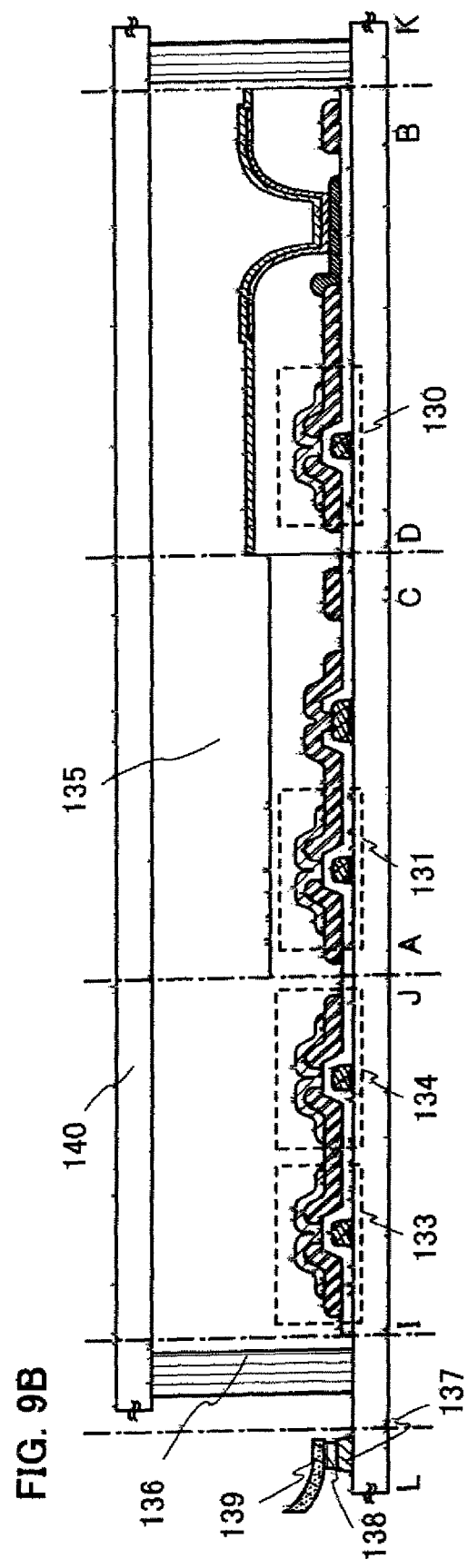

This embodiment mode of the present invention is explained with reference to FIGS. 3A to 9B. In more detail, a method for manufacturing a display device including a bottom-gate coplanar thin film transistor, to which the present invention is applied, is explained. FIGS. 3A, 4A, 5A, 6A and 7A are top views of a pixel portion of a display device. FIGS. 3B, 4B, 5B, 6B and 7B are cross-sectional views taken along line A-C in FIGS. 3A, 4A, 5A, 6A and 7A and FIGS. 3C, 4C, 5C, 6C and 7C are cross-sectional views taken along line B-D in FIGS. 3A, 4A, 5A, 6A and 7A, respectively. FIGS. 8A and 8B are cross-sectional views of a display device, and FIG. 9A is a top view thereof. FIG. 9B is a cross-sectional view taken along line L-K (including I-J) in FIG. 9A.

A glass substrate made of barium borosilicate glass, alumino borosilicate glass, or the like; a quartz substrate; a metal substrate; or a plastic substrate which can withstand the process temperature of this manufacturing process is used as a substrate 100. A surface of the substrate 100 may be polished by a CMP method or the like so as to be planarized.

Note that an insulating layer may be formed over the substrate 100. The insulating layer is formed using an oxide material and/or a nitride material containing silicon by a method such as a CVD method, a plasma CVD method, a sputtering method, or a spin coating method as a single layer or a multilayer. Alternatively, an acrylic acid, a methacrylic acid, or a derivative thereof; a heat-resistant high molecular compound such as polyimide, aromatic polyamide, or polybenzimidazole; or a siloxane resin may be used. Note that the siloxane material corresponds to a resin including a Si—O—Si bond. A skeleton of siloxane includes a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin of polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. Furthermore, a droplet-discharge method, a printing method (a method for forming a pattern, such as screen printing or offset printing), an application method such as a spin coating method, a dipping method, or the like can be used. This insulating layer is not necessarily formed, but it has the effect of blocking a contaminant or the like from the substrate 100.

Figure 3A:
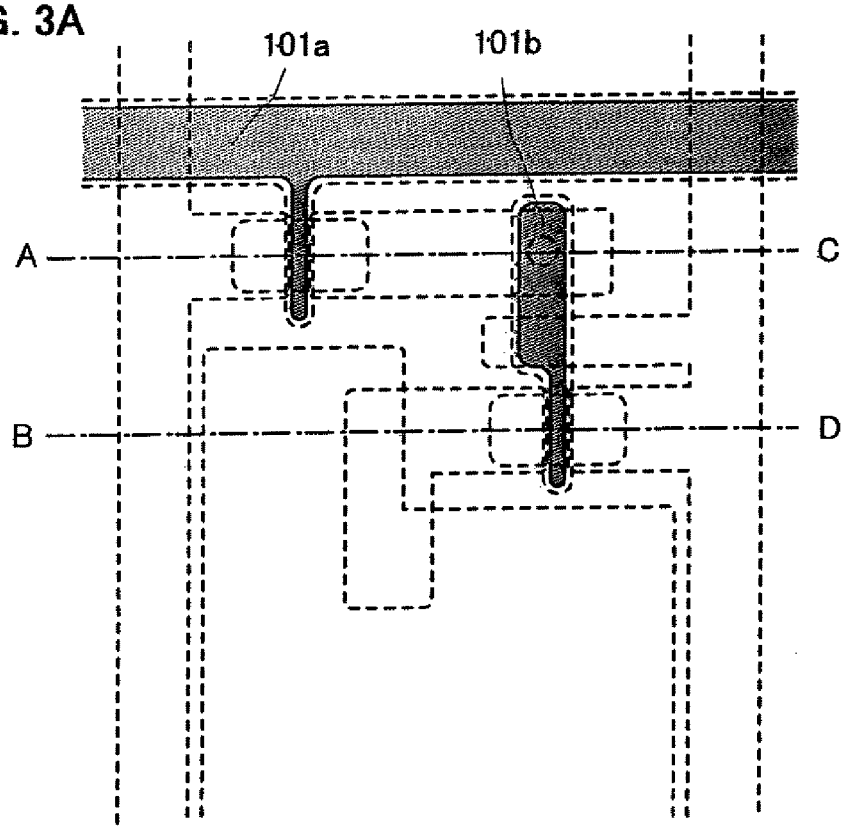
FIGS. 3A to 3C are diagrams explaining a method for manufacturing a display device of the present invention.
Figure 3B:
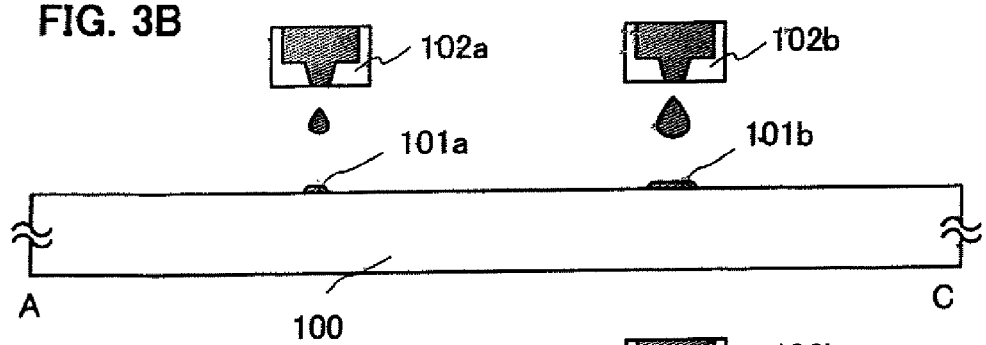
Figure 3C:
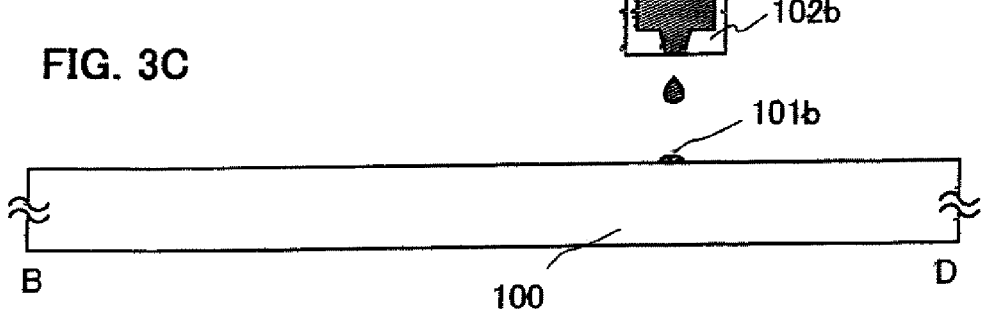

In this embodiment mode, a gate electrode layer is formed by a plating method with the use of the present invention. A plating method employed in this embodiment mode is electroless plating. A photocatalyst material or a material including an amino group is selectively formed by a droplet-discharge method in a formation region for forming the gate electrode layer over the substrate 100 as a material adsorbing the plating catalyst material for the gate electrode layer. A liquid composition including a photocatalyst material or a material including an amino group is discharged to form photocatalyst materials or materials including an amino group 101a and 101b by using droplet-discharge devices 102a and 102b (FIGS. 3A to 3C). The photocatalyst materials or materials including an amino group 101a and 101b are solidified by drying or baking. In this embodiment mode, titanium oxide is used as the photocatalyst material. Nanoparticles of titanium oxide are dispersed in a solvent and a liquid composition is selectively discharged. The discharged material is solidified to become a film by drying or baking. In this specification, the films formed by a droplet-discharge method may be extremely thin films depending on a film formation condition in some cases, and they may have discontinuous island-shape; thus, it is not necessary to keep a film form.

Figure 4A:
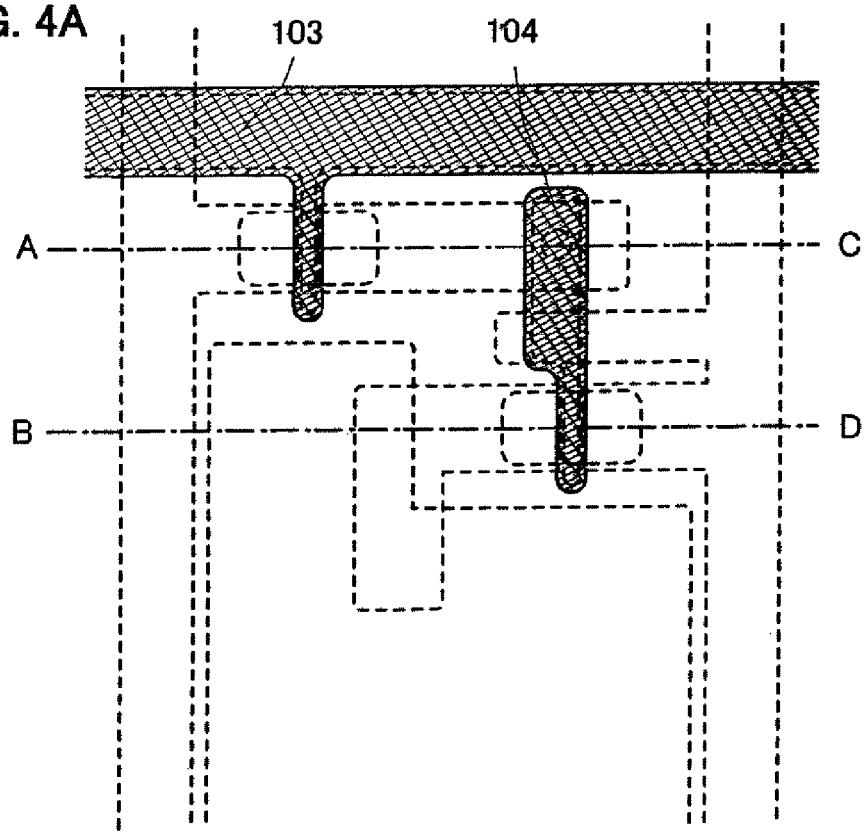
FIGS. 4A to 4C are diagrams explaining a method for manufacturing a display device of the present invention.
Figure 4B:
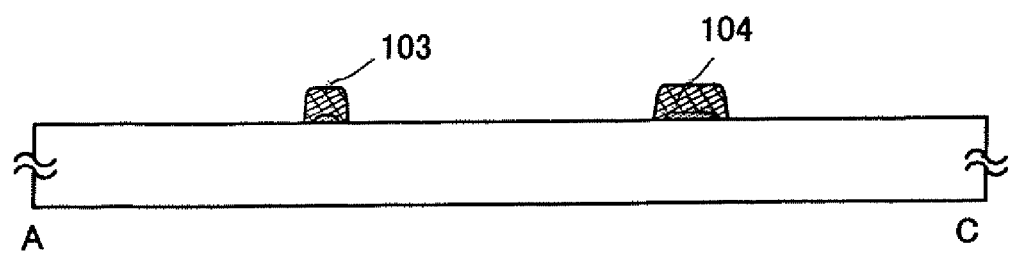
Figure 4C:
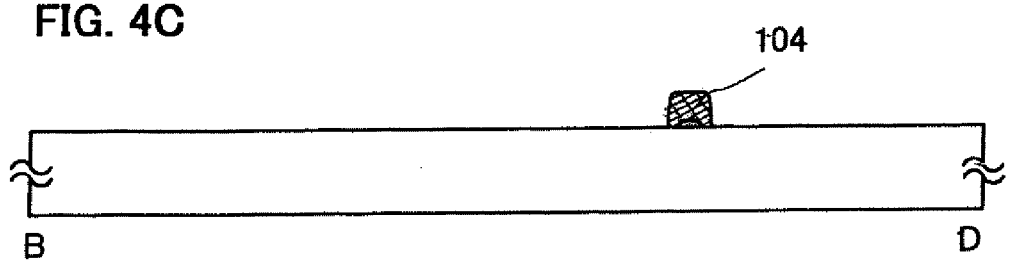

Then, the films are immersed in a solution including a plating catalyst material whose pH is adjusted, and the plating catalyst material is adsorbed onto the photocatalyst materials or materials including an amino group 101a and 101b. After that, they are immersed in a plating solution including a metal material to grow the metal film on the plating catalyst material, thereby obtaining gate electrode layers 103 and 104 (FIGS. 4A to 4C). The plating catalyst material is adsorbed to cover surfaces of the photocatalyst materials or materials including an amino group 101a and 101b, and the metal film formed by plating is grown almost isotropically. Thus, the gate electrode layers 103 and 104 are formed to cover top and side faces of the photocatalyst materials or materials including an amino group 101a and 101b.

As described in Embodiment Mode 2, when a photocatalyst material is used and irradiated with light to generate a photocatalytic function, the pH adjustment of the solution including the plating catalyst material is not necessarily conducted. In this case, the photocatalyst material is immersed in the solution including the plating catalyst material while conducting light irradiation for generating the photocatalytic function of the photocatalyst material.

As a material including an amino group, a coupling agent which is chemically coupled with a substrate is preferable in terms of adhesion. As the coupling agent, a silane coupling agent and a titanium coupling agent can be used. A silane coupling agent having an amino group at its end group, for example, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, N,N-bis[3-(trimethoxysilyl)propyl]ethylenediamine, p[N-(2-aminoethyl)aminomethyl]phenethyltrimethoxysilane, or the like can be used.

The photocatalyst material can reduce and deposit the plating catalyst material included in the solution by a photocatalytic function. The photocatalyst material is preferably titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like. Photocatalytic activity can be caused by irradiating the photocatalyst material with light in an ultraviolet region (having a wavelength of 400 nm or less, preferably, 380 nm or less).

The plating catalyst material is appropriately selected depending on a metal material to be used for plating. As the plating catalyst material, palladium (Pd), rhodium (Rh), ruthenium (Ru), osmium (Os), iridium (Ir), gold (Au), platinum (Pt), silver (Ag), or the like may be used. The plating catalyst material is dissolved into a solution, and is used as a solution containing the plating catalyst material.

As the plating metal material, nickel (Ni), a nickel alloy (such as a nickel phosphorus (NiP) alloy, a nickel cobalt (NiCo) alloy, a nickel cobalt phosphorus (NiCoP) alloy, a nickel iron phosphorus (NiFeP) alloy, or a nickel tungsten phosphorus (NiWP) alloy), copper (Cu), gold (Au), cobalt (Co), tin (Sn), or the like can be used.

Other detailed plating conditions can be similar to those in Embodiment Mode 1.

Next, a gate insulating layer 105 is formed over the gate electrode layers 103 and 104. The gate insulating layer 105 may be formed from an oxide material or a nitride material of silicon as a single layer or a multilayer. In this embodiment mode, a stacked structure of a silicon nitride film and a silicon oxide film is used. In addition to that, a single layer of a silicon oxynitride film, or a stacked structure of three or more layers may be used. Preferably, a silicon nitride film having a dense film quality may be used. In a case where silver, copper or the like is used for a conductive film formed by a droplet-discharge method, a silicon nitride film or a NiB film is formed thereover as a barrier film. At this time, an effect that diffusion of impurities is prevented and the surface is planarized can be obtained. In addition, in order to form a dense insulating film having less gate leakage current at a low temperature, a rare gas such as argon may be contained in a reaction gas so that the rare gas element may be mixed in the insulating film to be formed.

After forming the substrate, the insulating layer, a semiconductor layer, the gate insulating layer, an interlayer insulating layer, and another insulating layer, conductive layer, and the like for constituting parts of a display device or a semiconductor device, the surfaces of the substrate, the insulating layer, the semiconductor layer, the gate insulating layer, the interlayer insulating layer may be oxidized or nitrided by a plasma treatment. When the semiconductor layer or the insulating layer are oxidized or nitrided by the plasma treatment, the surface of the semiconductor layer or the insulating layer is modified and a more dense insulating layer than an insulating layer formed by a CVD method or a sputtering method can be obtained. Accordingly, defects such as a pinhole can be suppressed, and thus, characteristics or the like of a semiconductor device can be improved. Such a plasma treatment as described above can be performed on a conductive layer such as a gate electrode layer, a source wire layer, or a drain wire layer, and the surface can be nitrided or oxidized by performing nitridation or oxidization (or both nitridation and oxidization).

If the film is oxidized by a plasma treatment, the plasma treatment is performed in an oxygen atmosphere (e.g., an atmosphere including oxygen ($O_2$) and a rare gas (containing at least one of He, Ne, Ar, Kr, and Xe); an atmosphere including oxygen, hydrogen ($H_2$), and a rare gas; or an atmosphere including dinitrogen monoxide and a rare gas). On the other hand, if the film is nitrided by a plasma treatment, the plasma treatment is performed in a nitrogen atmosphere (e.g., an atmosphere including nitrogen ($N_2$) and a rare gas (containing at least one of He, Ne, Ar, Kr, and Xe); an atmosphere including nitrogen, hydrogen, and a rare gas; or an atmosphere including $NH_3$ and a rare gas). As the rare gas, Ar can be used for example. Alternatively, a mixed gas of Ar and Kr may be used. Thus, the insulating film formed by the plasma treatment includes the rare gas (containing at least one of He, Ne, Ar, Kr, and Xe) used for the plasma treatment, and if Ar is used, Ar is contained in the insulating film.

The plasma treatment is performed at an electron density of $1 \times 10^{11}$ cm$^{-3}$ more and an electron temperature of plasma of 1.5 eV or less in the atmosphere containing the gases described above. More specifically, the electron density is $1 \times 10^{11}$ to $1 \times 10^{13}$ cm$^{-3}$, and the electron temperature of plasma is 0.5 to 1.5 eV. Since the electron density of plasma is high and the electron temperature around an object formed over the substrate is low; the object can be prevented from being damaged due to plasma. In addition, because the plasma electron density is as high as $1 \times 10^{11}$ cm$^{-3}$ or more, the oxide film or the nitride film formed by oxidizing or nitriding the object by the plasma treatment has improved uniformity of film thickness or the like as compared with a film formed by CVD, sputtering, or the like, and a dense film can be formed. In addition, since the electron temperature of plasma is as low as 1.5 eV or less, the oxidation or nitridation treatment can be performed at a lower temperature than a conventional plasma treatment or thermal oxidation method. For example, the oxidation or nitridation treatment can be performed sufficiently even when the plasma treatment is performed at a temperature lower by at least 100° C. than a strain point of a glass substrate. As the frequency for producing plasma, high frequency waves such as microwaves (2.45 GHz) can be employed. Note that in this specification, the plasma treatment is performed under the aforementioned conditions, unless otherwise noted.

A mask is formed using an insulator such as a resist or polyimide by a droplet-discharge method. A through hole 125 is formed in a part of the gate insulating layer 105 by an etching process using the mask to partially expose the gate electrode layer 104 formed therebelow. The etching process may be performed by either plasma etching (dry etching) or wet etching; however, plasma etching is suitable for treating a large-sized substrate. As an etching gas, a fluorine-based gas such as $CF_4$ or $NF_3$, or a chlorine-based gas such as $Cl_2$ or $BCl_3$ is used, and an inert gas such as He or Ar may be appropriately added thereto. Alternatively, electric discharge machining can be performed locally when the etching process using atmospheric pressure discharge is performed, in which case a mask layer is not required to be formed over the entire surface.

A mask used in a process of forming the through hole 125 can be formed by selectively discharging a composition. When the mask is selectively formed in such a way, an advantageous effect of simplifying the process can be obtained. A resin material such as an epoxy resin, a phenol resin, a novolac resin, an acrylic resin, a melamine resin, or a urethane resin is used for the mask. In addition, the mask may be formed by a droplet-discharge method using an organic material such as benzocyclobutene, parylene, fluorinated aryleneether or permeable polyimide; a compound material made by the polymerization of a siloxane-based polymer or the like; a composition material containing a water-soluble homopolymer and a water-soluble copolymer; or the like. Alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator etc., may be used. In using whichever material, the surface tension and the viscosity are appropriately controlled by adjusting the concentration of a solvent or adding a surfactant or the like.

Figure 5A:
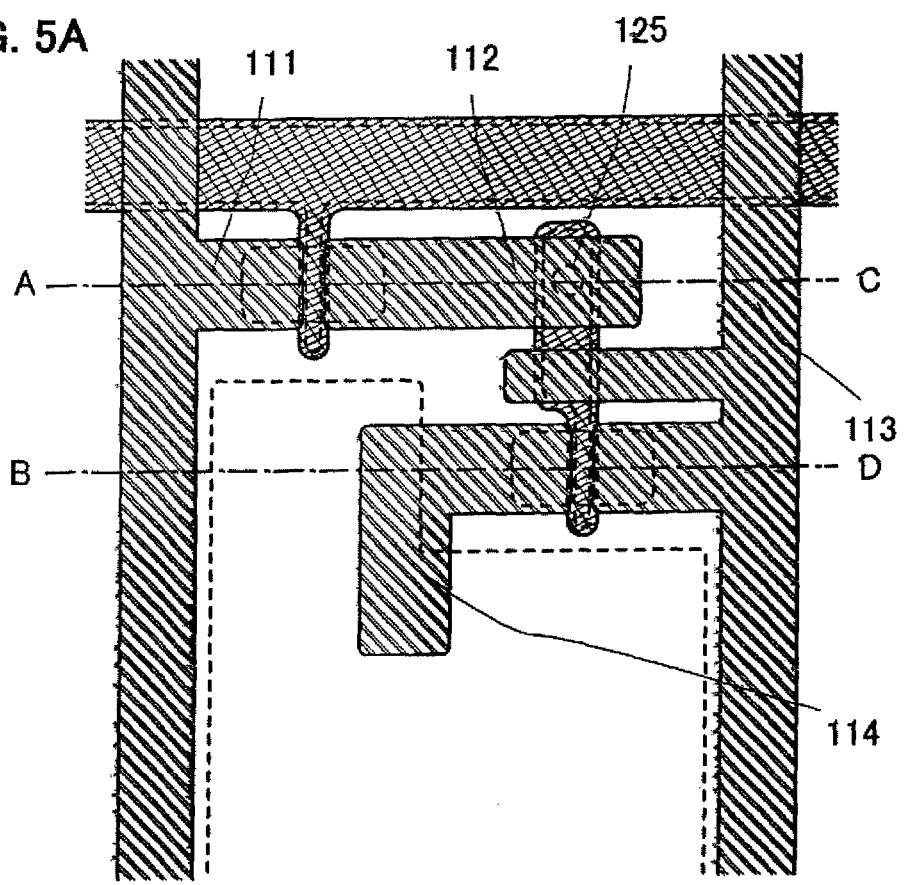
FIGS. 5A to 5C are diagrams explaining a method for manufacturing a display device of the present invention.
Figure 5B:
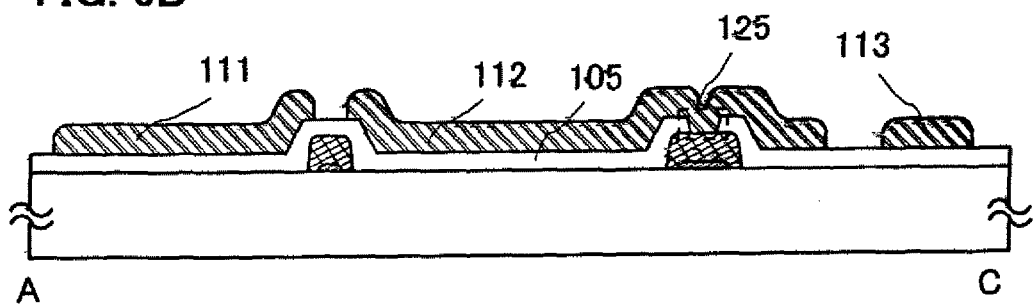
Figure 5C:
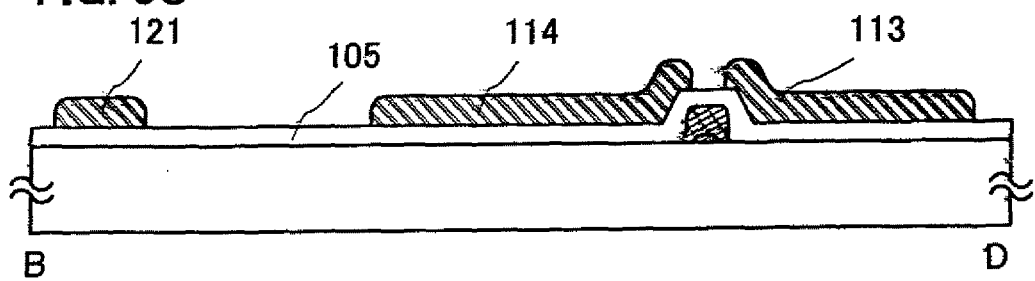
Figure 6A:
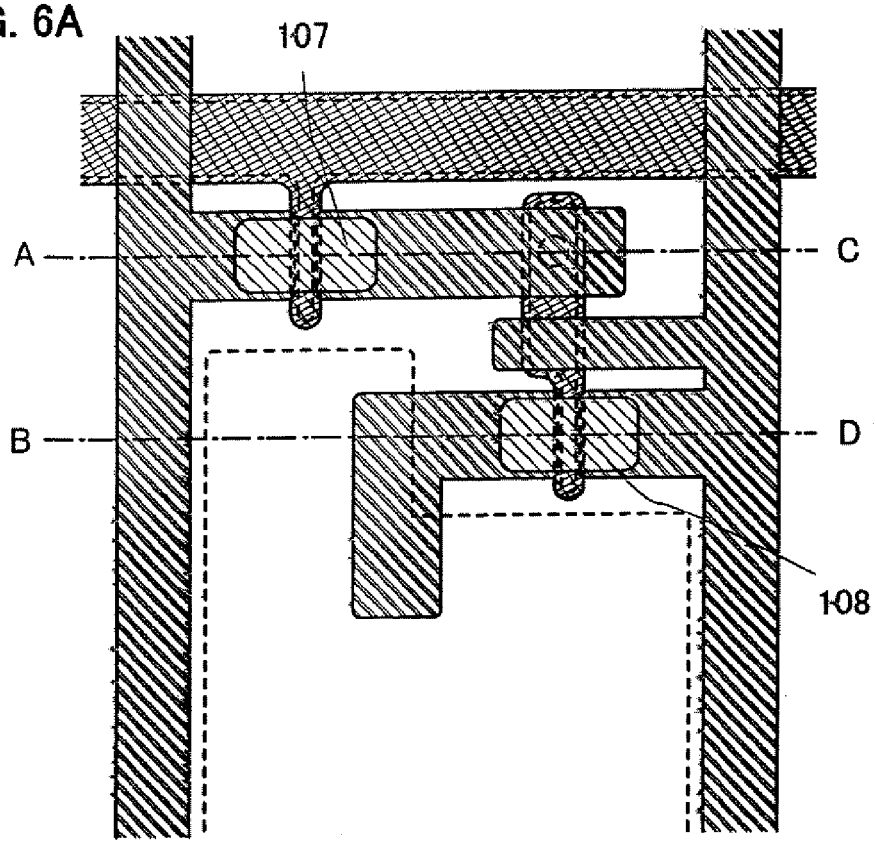
FIGS. 6A to 6C are diagrams explaining a method for manufacturing a display device of the present invention.
Figure 6B:
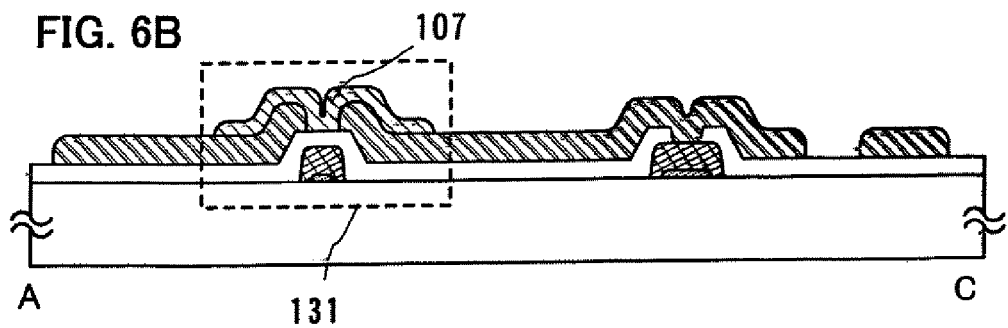
Figure 6C:
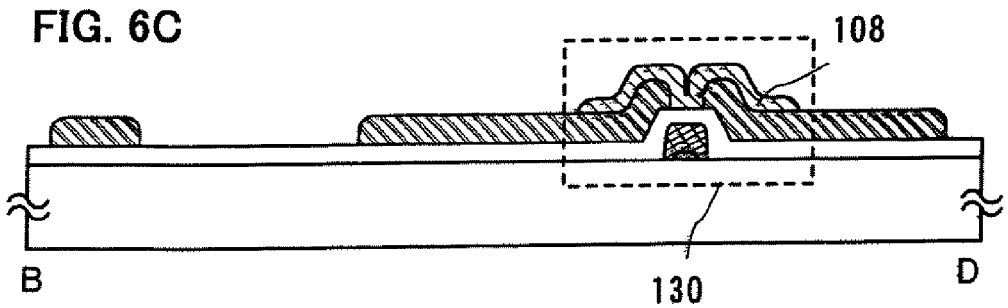

A liquid composition containing a conductive material is discharged using a droplet-discharge device over the gate insulating layer 105 to form a source or drain electrode layer 111, a source or drain electrode layer 112, a source or drain electrode layer 113, and a source or drain electrode layer 114 (FIGS. 5A to 5C). The source or drain electrode layer 111 functions also as a source wire layer or drain wire layer, and the source or drain electrode layer 113 also serves as a power supply line. The source or drain electrode layer 112 is electrically connected to the gate electrode layer 104 by the through hole 125 formed in the gate insulating layer 105. A capacitor is also formed in a stacked region of the source or drain electrode layer 113, the gate insulating layer 105, and the gate electrode layer 104.

In this embodiment mode, conductive layers for the source or drain electrode layer 111, the source or drain electrode layer 112, the source or drain electrode layer 113, and the source or drain electrode layer 114 are formed using a droplet-discharge means. The droplet-discharge means is a general term for a means with an instrument that discharges a droplet, such as a nozzle having a discharge opening of a composition, or a head equipped with a single or plurality of nozzles. The diameter of the nozzle included in the droplet-discharge means is set in the range of 0.02 to 100 μm (preferably, 30 μm or less), and the amount of the composition to be discharged from the nozzle is set in the range of 0.001 pl to 100 pl (preferably, 0.1 pl to 40 pl, more preferably, 10 pl or less). The amount of the composition to be discharged increases in proportion to the size of the nozzle diameter. Further, it is preferable that the distance between an object to be treated and the discharge opening of the nozzle is as short as possible in order to drop a droplet in a desired position. Preferably, the distance is set approximately within the range of 0.1 mm to 3 mm (more preferably, 1 mm or less).

For the composition to be discharged from the discharge opening, a conductive material dissolved or dispersed in a solvent is used. The conductive material corresponds to a fine particle or a dispersed nanoparticle of a metal such as Ag, Au, Cu, Ni, Pt, Pd, Ir, Rh, W, or Al, sulfide of a metal such as Cd or Zn, an oxide of Fe, Ti, Si, Ge, Zr, Ba, or the like, silver halide, or the like. In addition, it corresponds to a transparent conductive film, such as indium tin oxide (ITO), indium tin silicon oxide (ITSO) that contains indium tin oxide and silicon oxide, organic indium, organic tin, zinc oxide, titanium nitride, or the like. The above described conductive materials may be mixed. However, as for the composition to be discharged from the discharge opening, it is preferable to use one of the materials of gold, silver, and copper dissolved or dispersed in a solvent, taking into consideration a specific resistance value. It is more preferable to use silver or copper having a low resistance value. However, when silver or copper is used, a barrier film may be additionally provided as a countermeasure against impurities. A silicon nitride film or a nickel boron (NiB) film can be used as the barrier film.

The composition to be discharged is a conductive material dissolved or dispersed in a solvent, which contains a dispersant, or a thermosetting resin called a binder as well. In particular, the binder has a function of preventing the generation of cracks or uneven baking during baking. Thus, a conductive layers to be formed may contain an organic material in some cases. The organic material to be contained depends on heating temperature, atmosphere, or time. This organic material is an organic resin or the like which functions as a binder, a solvent, a dispersant, or a coating agent of a metal particle. A typical example thereof is an organic resin such as polymide, acrylic, a novolac resin, a melamine resin, a phenol resin, an epoxy resin, a silicone resin, a furan resin, or a diallyl phthalate resin.

In addition, a particle with a plurality of layers, in which a conductive material is coated with another conductive material, may be used. For example, a three-layer structure particle in which copper is coated with nickel boron (NiB), which is further coated with silver, may be used. As for the solvent, ester such as butyl acetate or ethyl acetate, alcohol such as isopropyl alcohol or ethyl alcohol, an organic solvent such as methyl ethyl ketone or acetone, water, or the like is used. The viscosity of the composition is preferably 20 mPa·s or less. This prevents the composition from drying, and enables the composition to be discharged smoothly from the discharge opening. The surface tension of the composition is preferably 40 mN/m or less. However, the viscosity of the composition and the like may be appropriately controlled depending on a solvent to be used and an intended purpose. For example, the viscosity of a composition in which ITO, organic indium, or organotin is dissolved or dispersed in a solvent may be set from 5 mPa·s to 20 mPa·s, the viscosity of a composition in which silver is dissolved or dispersed in a solvent may be set from 5 mPa·s to 20 mPa·s, and the viscosity of a composition in which gold is dissolved or dispersed in a solvent may be set from 5 mPa·s to 20 mPa·s.

The conductive layer may be formed by stacking a plurality of conductive materials. In addition, the conductive layer may be formed first by a droplet-discharge method using silver as a conductive material, and may then be plated with copper or the like. The plating may be performed by an electroplating or chemical (electroless) plating method. The plating may be performed by immersing a substrate surface into a container filled with a solution containing a plating catalyst material; alternatively, the solution containing a plating catalyst material may be applied by placing the substrate obliquely (or vertically), and applying the solution over the substrate surface. This is applied to an plating method for the gate electrode layer 103 and 104 similarly. When the plating is performed by applying a solution with the substrate placed obliquely (or vertically), there is an advantage that an apparatus used for the process can be downsized even with a large-sized substrate.

Although a diameter of a particle depends on the diameter of each nozzle, a desired shape of a pattern, and the like, the diameter of a particle of the conductive material is preferably as small as possible, for the purpose of preventing nozzles from being clogged and of manufacturing a minute pattern. Preferably, the diameter of the particle of the conductive material is 0.1 μm or less. The composition is formed by a method such as an electrolyzing method, an atomizing method, or a wet reduction method, and the particle size to be obtained is typically about 0.01 to 10 μm. However, when a gas evaporation method is employed, nanoparticles protected by a dispersant are as minute as about 7 nm, and when the surface of each particle is covered with a coating agent, the nanoparticles do not aggregate in the solvent and are uniformly dispersed in the solvent at room temperature, and behaves similarly to a liquid. Accordingly, it is preferable to use a coating agent.

In addition, the step of discharging the composition may be performed under reduced pressure. When the step is performed under reduced pressure, an oxide film or the like is not formed over the surface of the conductive material, which is preferable. After discharging the composition, either or both steps of drying and baking is/are performed. Both the drying and baking steps are heat treatments. For example, drying is performed for three minutes at 100° C. and baking is performed for 15 to 60 minutes at a temperature of 200° C. to 550° C., each having a different purpose, temperature, and time. The steps of drying and baking are performed under normal pressure or under reduced pressure, by laser light irradiation, rapid thermal annealing, heating using a heating furnace, or the like. Note that the timing or the number of the heat treatment is not particularly limited. The substrate may be heated in advance to perform the steps of drying and baking well, and although the temperature of the substrate at the time depends on the material of the substrate or the like, it is typically 100° C. to 800° C. (preferably, 200° C. to 550° C.). Through these steps, nanoparticles are made in contact with each other and fusion and welding are accelerated by hardening and shrinking of a peripheral resin, while the solvent in the composition is volatilized or the dispersant is chemically removed.

A gas laser or a solid-state laser of a continuous wave or a pulsed laser may be used for laser light irradiation. An excimer laser, a YAG laser, or the like can be used as the former gas laser. A laser or the like using a crystal of YAG, $YVO_4$, $GdVO_4$, or the like which is doped with Cr, Nd, or the like can be used as the latter solid-state laser. Note that it is preferable to use a continuous wave laser in consideration of the absorption rate of laser light. Moreover, a laser irradiation method in which pulsed and continuous wave lasers are combined, a so-called hybrid laser, may be used. However, it is preferable that the heat treatment by laser light irradiation is instantaneously performed within several microseconds to several tens of seconds so as not to damage the substrate, depending on heat resistance of the substrate. Rapid thermal annealing (RTA) is carried out by raising the temperature rapidly and heating instantaneously for several microseconds to several minutes using an infrared lamp or a halogen lamp which emits light of ultraviolet to infrared light in an inert gas atmosphere. Since this treatment is performed instantaneously, only an outermost thin film can be substantially heated and the lower layer of the film is not affected. In other words, even a substrate having low heat resistance such as a plastic substrate is not affected.

After forming a conductive layer, an insulting film and the like by discharging a composition by a droplet-discharge method, the surface thereof may be planarized by pressing with pressure to improve planarity. As a pressing method, unevenness of the surface may be reduced by moving a roller-shaped object on the surface, or the surface may be perpendicularly pressed with a flat plate-shaped object. A heating step may be performed at the time of pressing. Alternatively, the unevenness of the surface may be eliminated with an air knife after softening or melting the surface with a solvent or the like. A CMP method may be also used for polishing the surface. This step may be employed in planarizing a surface when unevenness is generated by a droplet-discharge method.

Although a film formation method by the above droplet-discharge method is explained using formation of a conductive film as an example, conditions for discharge, drying, baking, a solvent, or the like and detailed explanation can also be applied to the photocatalyst material, the material including an amino group and the insulating layer formed in this embodiment mode.

By combining a droplet-discharge method, cost can be reduced as compared to the case of coating entire surface by a spin coating method or the like. In accordance with the present invention, even when wires and the like are formed densely and complicatedly due to miniaturization or thinning, they can be formed stably.

Next, a semiconductor layer is formed. A semiconductor layer having one conductivity type may be formed if necessary. An NMOS structure having an n-channel TFT formed using an n-type semiconductor layer, a PMOS structure having a p-channel TFT formed using a p-type semiconductor layer, and a CMOS structure having an n-channel TFT and a p-channel TFT can be manufactured. An n-channel TFT or a p-channel TFT can be formed by forming an impurity region in a semiconductor layer by adding an element which imparts conductivity by doping to impart conductivity. The conductivity may be imparted to a semiconductor layer by a plasma treatment using a $PH_3$ gas instead of forming the n-type semiconductor layer.

An amorphous semiconductor (hereinafter also referred to as an "AS") manufactured by a vapor phase growth method or a sputtering method using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer. The semiconductor layer can be formed by a sputtering method, an LPCVD method, a plasma CVD method, or the like.

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. A region of a crystal with a size of 0.5 to 20 nm can be observed in at least a part of a film. Raman spectrum is shifted toward a lower wavenumber than 520 cm$^{-1}$ in the case where silicon is a main component. The diffraction peaks of (111) and (220), which are believed to be derived from Si crystal lattice, are observed by the X-ray diffraction. The SAS contains hydrogen or halogen of 1 atom % or more for terminating dangling bonds. The SAS is formed by decomposing a gas including silicon with glow discharge (plasma CVD). $SiH_4$ is used as a typical gas including silicon. Further, $Si_2H_6$, $SiH_2Cl_2$, $SiHCl_3$, $SiCl_4$, $SiF_4$, or the like can also be used as the gas including silicon. Further, $F_2$ or $GeF_4$ may be mixed. This gas including silicon may be diluted with $H_2$, or $H_2$ and one or more rare gas elements of He, Ar, Kr, and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or lower, more preferably, 100 to 200° C. As to impurity elements to be contained in forming the film, each concentration of impurities for atmospheric constituents such as oxygen, nitrogen and-carbon is preferably set to be $1\times10^{20}$ cm$^{-3}$ or less. In particular, the oxygen-concentration is set to be $5\times10^{19}$ cm$^{-3}$ or less, preferably, $1\times10^{19}$ cm$^{-3}$ or less. Further, when a rare gas element such as helium, argon, krypton, or neon is mixed, the lattice distortion is increased and the stability is thus enhanced, leading to form an excellent SAS. Additionally, as a semiconductor layer, a SAS layer formed using a hydrogen-based gas may be stacked over a SAS layer formed using a fluorine-based gas.

Typically, as the amorphous semiconductor, there is given hydrogenated amorphous silicon or the like, and as the crystalline semiconductor, there is given polysilicon or the like. Polysilicon (polycrystalline silicon) includes high-temperature polysilicon which contains polysilicon that is formed at a process temperature of 800° C. or higher as the main component, low-temperature polysilicon which contains polysilicon that is formed at a process temperature of 600° C. or lower as the main component, and polysilicon which is crystallized by adding an element which promotes crystallization or the like. Naturally, as described above, a semiamorphous semiconductor or a semiconductor which includes a crystalline phase in a portion of the semiconductor layer can be used.

In addition, a compound semiconductor such as GaAs, InP, SiC, ZnSe, GaN, or SiGe as well as an element such as silicon (Si) or germanium (Ge) can be used. Further, zinc oxide (ZnO) can be used. In the case of using ZnO for the semiconductor layer, $Y_zO_x$, $Al_2O_3$, $TiO_2$, a stacked layer thereof, or the like may be used for the gate insulating layer, and ITO, Au, Ti, or the like may be used for the gate electrode layer, the source electrode layer, and the drain electrode layer. In addition, In, Ga, or the like can be added to ZnO.

In the case where a crystalline semiconductor layer is used as the semiconductor layer, a laser crystallization method, a thermal crystallization method, a thermal crystallization method using an element promoting crystallization such as nickel, or the like may be employed as a method for manufacturing the crystalline semiconductor layer. A microcrystalline semiconductor, which is a SAS, can be crystallized by being irradiated with laser light to improve the crystallinity. In the case where an element promoting crystallization is not introduced, hydrogen is released until a concentration of hydrogen contained in an amorphous silicon film becomes $1\times10^{20}$ atoms/cm$^3$ or less by heating the amorphous silicon film at a temperature of 500° C. for one hour in a nitrogen atmosphere before irradiating the amorphous silicon film with laser light. This is because the amorphous silicon film containing much hydrogen is damaged when the film is irradiated with laser light.

Any method can be used for introducing a metal element into the amorphous semiconductor layer as long as the method is capable of making the metal element exist on the surface of or inside the amorphous semiconductor layer. For example, a sputtering method, a CVD method, a plasma treatment method (including a plasma CVD method), an adsorption method, or a method for applying a metal salt solution can be employed. Among them, the method using a solution is simple and easy, and thus, it is advantageous in terms of easy concentration control of the metal element. It is preferable to form an oxide film by UV light irradiation in an oxygen atmosphere, a thermal oxidation method, a treatment with ozone water or hydrogen peroxide including a hydroxyl radical, or the like in order to improve wettability of the surface of the amorphous semiconductor layer and to spread the aqueous solution over the entire surface of the amorphous semiconductor layer.

The crystallization may be performed by adding an element which promotes crystallization (also referred to as a catalyst element or a metal element) to an amorphous semiconductor layer and performing a heat treatment (at 550° C. to 750° C. for 3 minutes to 24 hours) in a crystallization step in which the amorphous semiconductor layer is crystallized to form a crystalline semiconductor layer. As the element which promotes crystallization, one or more elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor layer, a semiconductor layer containing an impurity element is formed in contact with the crystalline semiconductor layer and used as a gettering sink. The impurity element may be an impurity element imparting n-type conductivity, an impurity element imparting p-type conductivity, a rare gas element or the like. For example, one or more elements of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed over the crystalline semiconductor layer containing an element which promotes crystallization, and a heat treatment (at 550° C. to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. Then, the semiconductor layer containing a rare gas element, which serves as a gettering sink, is removed.

Heat treatment and laser light irradiation may be combined to crystallize the amorphous semiconductor layer. Alternatively, one of the heat treatment and the laser light irradiation may be performed plural times.

In addition, a crystalline semiconductor layer may be directly formed over the substrate by a plasma method. Alternatively, a crystalline semiconductor layer may be selectively formed over the substrate by a plasma method.

The semiconductor layer can be formed by a printing method, a spray method, a spin coating method, a droplet-discharge method, or the like using an organic semiconductor material. In this case, since the above etching step is not required, the number of steps can be reduced. A low molecular material, a high molecular material, or the like is used as the organic semiconductor material, and in addition, a material such as an organic pigment or a conductive high molecular material can be used. A π-electron conjugated high molecular material having a skeleton including conjugated double bonds is preferably used as the organic semiconductor material used in the present invention. Typically, a soluble high molecular material such as polythiophene, polyfluoren, poly(3-alkylthiophene), a polythiophene derivative, or pentacene can be used.

In addition, there is also a material, which can be treated after the deposition of a soluble precursor to form the semiconductor layer, as the organic semiconductor material applicable to the present invention. Note that polythienylenevinylene, poly(2,5-thienylenevinylene), polyacetyrene, a polyacetyrene derivative, polyallylenevinylene, or the like can be used as such an organic semiconductor material.

In converting the precursor into an organic semiconductor, a reaction catalyst such as a hydrogen chloride gas is added, in addition to heat treatment. The following can be employed as a typical solvent which dissolves the soluble organic semiconductor material: toluene, xylene, chlorobenzene, dichlorobenzene, anisole, chloroform, dichloromethane, γbutyllactone, butyl cellosolve, cyclohexane, NMP (N-methyl-2-pyrrolidone), cyclohexanone, 2-butanone, dioxane, dimethylformamide (DMF), THF (tetrahydrofuran), or the like.

A semiconductor layer 107 and a semiconductor layer 108 are formed using pentacene by a droplet-discharging method, in which case the semiconductor layer 407 is formed over the source or drain electrode layer 111 and the source or drain electrode layer 112, and the semiconductor layer 108 is formed over the source or drain electrode layer 113 and the source or drain electrode layer 114. Through the above steps, coplanar thin film transistors 130 and 131 can be manufactured (see FIGS. 6A to 6C).

Figure 7A:
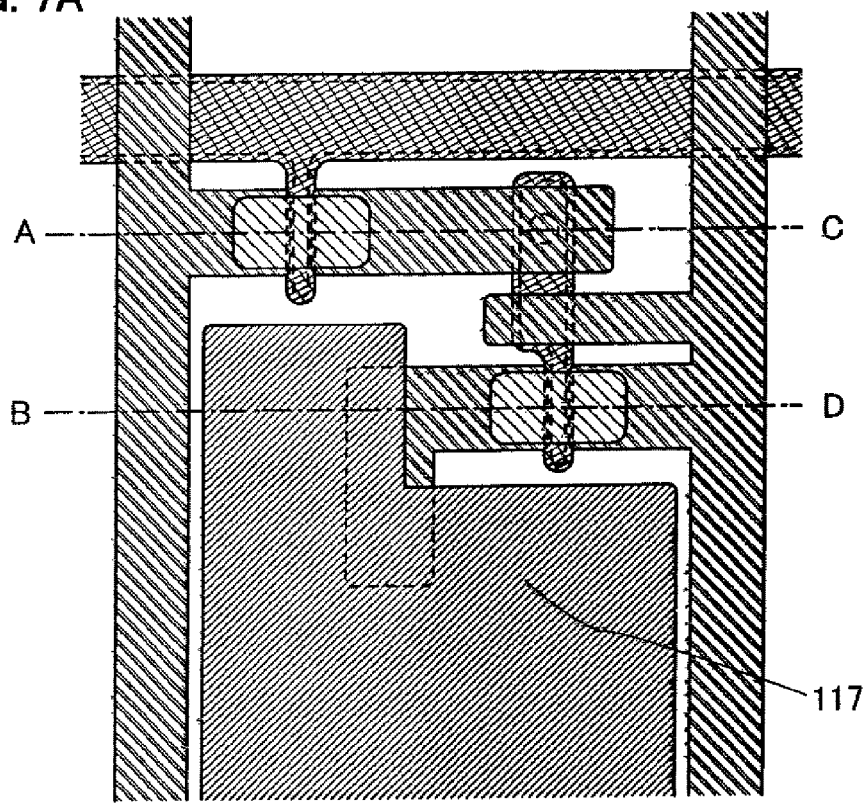
FIGS. 7A to 7C are diagrams explaining a method for manufacturing a display device of the present invention.
Figure 7B:
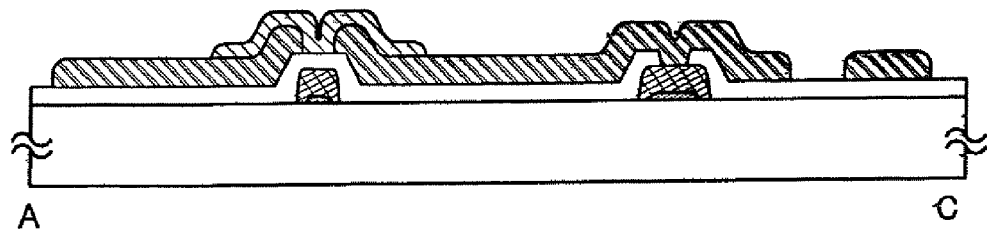
Figure 7C:
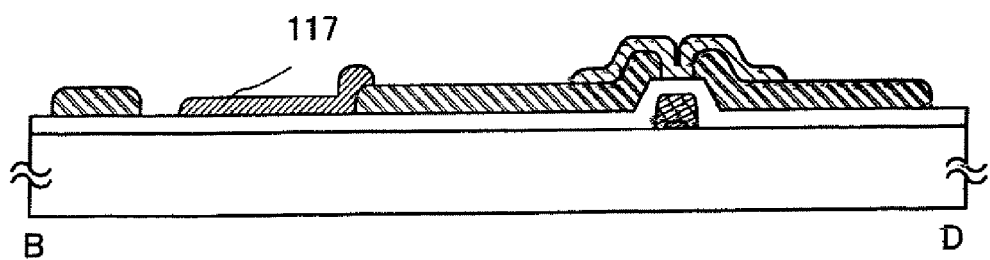

Subsequently, a composition containing a conductive material is selectively discharged over the gate insulating layer 105 to form a first electrode layer 117 (FIGS. 7A to 7C). When light is emitted from the substrate 100 side, the first electrode layer 117 may be formed by forming a predetermined pattern using a composition containing indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide (SnO$_2$), indium oxide containing tungsten oxide, indium zinc oxide containing tungsten oxide, indium oxide containing titanium oxide, indium tin oxide containing titanium oxide, or the like, and by baking the pattern. In this embodiment mode, a composition containing ITO is discharged and baked to form the first electrode layer 117.

An example of a composition ratio of each conductive material having a light transmitting property is described. As for a composition ratio of indium oxide containing tungsten oxide, tungsten oxide may be 1.0 wt % and indium oxide may be 99.0 wt %. As for a composition ratio of indium zinc oxide containing tungsten oxide, tungsten oxide may be 1.0 wt %, zinc oxide may be 0.5 wt %, and indium oxide may be 98.5 wt %. As for indium oxide containing titanium oxide, titanium oxide may be 1.0 wt % to 5.0 wt %, and indium oxide may be 95.0 wt % to 99.0 wt %. As for a composition ratio of indium tin oxide (ITO), tin oxide may be 10.0 wt %, and indium oxide may be 90.0 wt %. As for a composition ratio of indium zinc oxide (IZO), zinc oxide may be 10.7 wt %, and indium oxide may be 89.3 wt %. As for a composition ratio of indium tin oxide containing titanium oxide, titanium oxide may be 5.0 wt %, tin oxide may be 10.0 wt %, and indium oxide may be 85.0 wt %. The above composition ratios are just examples, and a composition ratio may be appropriately set.

Even in the case of using a material such as a metal film which does not have a light transmitting property, light can be transmitted through the first electrode layer 117 by forming such a material to become very thin (preferably, a thickness of approximately 5 nm to 30 nm) so as to transmit light. As a metal thin film which can be used for the first electrode layer 117, a conductive film formed of titanium, tungsten, nickel, gold, platinum, silver, aluminum, magnesium, calcium, lithium, zinc, or an alloy thereof, or a film formed of a compound material containing the element as its main component, such as TiN, TiSi$_x$N$_y$, WSi$_x$, WN$_x$, WSi$_x$N$_y$, or NbN can be used.

The first electrode layer 117 can be selectively formed over the gate insualting layer 105, before forming the source or drain electrode layer 113. In this case, this embodiment mode adopts a structure in which a connection structure between the source or drain electrode layer 113 and the first electrode layer 117 is made by stacking the souse or drain electrode layer 113 over the first electrode layer 117. When the first electrode layer 117 is formed prior to the source or drain electrode layer 113, it can be formed in a flat formation region, with good coverage. Thus, a polishing treatment using CMP or the like can be conducted sufficiently, and it can be formed with good planarity.

In addition, a structure may be employed, in which an insulating film serving as an interlayer insulating film is formed over the source or drain electrode layer 113, and the source or drain electrode layer 113 may be electrically connected to the first electrode layer 117 by a wire layer. In this case, without removing the insulting film to form an opening (a contact hole), a material having a liquid repellent property against the insulating film can be formed over the source or drain electrode layer 113. Then, when a composition including an insulting material is applied by an application method, the insulating film is formed in a region other than a region provided with a material having low a wettability.

After forming the insulating layer by solidification by heating, drying, or the like, the liquid repellent material is removed to form an opening. A wire layer is formed so as to fill this opening, and the first electrode layer 117 is formed to be in contact with this wire layer. This method has an advantageous effect of simplifying a process since it does not require formation of the opening by etching.

In the case of having a structure in which generated light is emitted to a side opposite to the substrate 100 side (the case of manufacturing a top emission type display panel), a composition which contains metal particles of Ag (silver), Au (gold), Cu (copper), W (tungsten), Al (aluminum), or the like as a main component can be used. Alternatively, the first electrode layer 117 may be formed by forming a transparent conductive film or a light-reflective conductive film by a sputtering method, forming a mask pattern by a droplet-discharge method, and then being etched by an etching process in combination.

The first electrode layer 117 may be polished by a CMP method or by cleaning with a polyvinyl alcohol-based porous body so that a surface of the first electrode layer 117 is planarized. In addition, after polishing by a CMP method, ultraviolet irradiation, an oxygen plasma treatment, or the like may be performed on the surface of the first electrode layer 117.

By the above steps, a TFT substrate for a display panel, in which a coplanar thin film transistor is connected to the first electrode layer 117 over the substrate 100, is completed.

Subsequently, an insulating layer 121 (also referred to as a partition wall) is selectively formed. The insulating layer 121 is formed to have an opening portion over the first electrode layer 117. In this embodiment mode, the insulating layer 121 is formed over the entire surface, and etched and processed using a mask of a resist or the like. When the insulating layer 121 is formed by a droplet-discharge method, a printing method, or the like, by which the insulating layer 121 can be formed directly and selectively, an etching process is not necessarily required. The insulating layer 121 can also be formed to have a desired shape by a pretreatment of the present invention.

The insulating layer 121 can be formed of silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant high molecular material such as polyimide, aromatic polyamide, or polybenzimidazole; or a siloxane resin material. The insulating layer 121 may also be formed by using a photosensitive or non-photosensitive material such as acrylic or polyimide. The insulating layer 121 preferably has a shape in which a curvature radius changes continuously. Accordingly, coverage of an electroluminescent layer 122 and a second electrode layer 123 to be formed over the insulating layer 121 is improved.

After forming the insulating layer 121 by discharging a composition by a droplet-discharge method, a surface of the insulating layer 121 may be planarized by pressing with pressure to improve its planarity. As a pressing method, unevenness may be smoothed by moving a roller-shaped object on the surface, or the surface may be perpendicularly pressed with a flat plate-shaped object. Alternatively, an uneven portion on the surface may be eliminated with an air knife after softening or melting the surface with a solvent or the like. A CMP method may also be used for polishing the surface. This step may be employed in planarizing a surface when unevenness is generated by a droplet-discharge method. When the planarity is improved through this step, display unevenness or the like of the display panel can be prevented; therefore, a high-definition image can be displayed.

A light-emitting element is formed over the substrate 100 that is a TFT substrate for a display panel (see FIGS. 8A and 8B).

Before forming the electroluminescent layer 122, a heat treatment is performed at 200° C. under atmospheric pressure to remove moisture in the first electrode layer 117 and the insulating layer 121 or moisture adsorbing on the surface thereof. It is preferable to perform a heat treatment at 200° C. to 400° C., preferably, 250° C. to 350° C. under reduced pressure and to form the electroluminescent layer 122 by a vacuum evaporation method or a droplet-discharge method under reduced pressure without exposing to air.

As the electroluminescent layer 122, materials exhibiting light emission of red (R), green (G), and blue (B) are selectively formed by an evaporation method using respective evaporation masks, or the like. The materials exhibiting light emission of red (R), green (G), and blue (B) (low molecular materials, high molecular materials, or the like) can be formed by a droplet-discharge method as in the case of a color filter. The droplet-discharge method is preferable since the materials exhibiting R, G, and B light can be separately applied without using a mask. The second electrode layer 123 is stacked over the electroluminescent layer 122, thereby completing a display device having a display function using a light-emitting element.

Although not shown, it is effective to provide a passivation film so as to cover the second electrode layer 123. The passivation film which is provided at the time of forming a display device may have a single layer structure or a multilayer structure. As the passivation film, a single layer of an insulating film containing silicon nitride (SiN), silicon oxide (SiO$_2$), silicon oxynitride (SiON), silicon nitride oxide (SiNO), aluminum nitride (AlN), aluminum oxynitride (AlON), aluminum nitride oxide (AlNO) which contains more nitrogen than oxygen, aluminum oxide, diamond like carbon (DLC), or a nitrogen-containing carbon film (CN$_x$), or a stacked layer of such insulating films can be used. For example, a stacked layer of a nitrogen-containing carbon film (CN$_x$) and silicon nitride (SiN) can be used. Alternatively, an organic material can be used, and for example, a stacked layer of a high molecular material such as a styrene polymer may be used. In addition, a siloxane material (inorganic siloxane, or organic siloxane) may be used.

At this time, it is preferable to use a film having good coverage as the passivation film. A carbon film, especially, a DLC film is effective. The DLC film can be formed at a temperature ranging from room temperature to 100° C.; therefore, the DLC film can be easily formed over an electroluminescent layer having low heat resistance. The DLC film can be formed by a plasma CVD method (typically, an RF plasma CVD method, a microwave CVD method, an electron cyclotron resonance (ECR) CVD method, a heat filament CVD method, or the like), a combustion flame method, a sputtering method, an ion beam evaporation method, a laser evaporation method, or the like. A hydrogen gas and a hydrocarbon-based gas (for example, CH$_4$, C$_2$H$_2$, C$_6$H$_6$, or the like) are used as a reaction gas which is used for forming the passivation film. The reaction gas is ionized by glow discharge, and the ions are accelerated to collide with a cathode applied with a negative self bias; accordingly, the passivation film is formed. A CN film may be formed using a C$_2$H$_4$ gas and an N$_2$ gas as the reaction gas. The DLC film has a high blocking effect on oxygen and can suppress oxidation of the electroluminescent layer. Accordingly, the electroluminescent layer can be prevented from oxidizing during the subsequent sealing step.

As shown in FIG. 9B, a sealant 136 is formed and sealing is performed using a sealing substrate 140. After that, a gate wire layer formed to electrically connect to the gate electrode layer 103 may be connected to a flexible wiring board for external electrical connection. This applies to a source wire layer formed to be electrically connected to the source or drain electrode wire layer 111.

Sealing is performed by filling a space between the substrate 100 having the element and the sealing substrate 140 with a filler 135. The space can be filled with the filler by a dropping method as is the case with a liquid crystal material described in Embodiment Mode 4. Instead of the filler 135, the space may be filled with an inert gas such as nitrogen. In addition, by providing a drying agent inside the display device, deterioration of the light-emitting element due to moisture can be prevented. The position of the drying agent may be either on the sealing substrate 140 side or on the substrate 100 side over which the element is formed. Alternatively, the drying agent may be provided in a depression formed in the substrate, which is also the region provided with the sealant 136. When the drying agent is provided in an area which does not contribute to displaying such as a driver circuit region of the sealing substrate 140 or a wiring region, the aperture ratio is not decreased even when the drying agent is opaque. Alternatively, the filler 135 may be formed to contain an absorbent material to have a function as a drying agent. Accordingly, the display device having a display function using the light-emitting element is completed (see FIGS. 9A and 9B).

An FPC 139 is attached to a terminal electrode layer 137 for electrically connecting the inside of the display device to the outside thereof with an anisotropic conductive film 138 so as to be electrically connected to the terminal electrode layer 137.

FIG. 9A is a top view of the display device. As shown in FIG. 9A, a pixel portion 150, scanning line driver regions 151a and 151b, and a connecting region 153 are sealed between the substrate 100 and the sealing substrate 140 with the sealant 136, and a signal line driver circuit 152 formed with an IC driver is provided over the substrate 100. The driver circuit region is provided with thin film transistors 133 and 134, and the pixel portion is provided with thin film transistors 130 and 131.

In this embodiment mode, the case where the light-emitting element is sealed with a glass substrate is shown. Sealing is a treatment for protecting the light-emitting element from moisture. Therefore, any of a method in which a light-emitting element is mechanically sealed with a cover material, a method in which a light-emitting element is sealed with a thermosetting resin or an ultraviolet curable resin, and a method in which a light-emitting element is sealed with a thin film of metal oxide, metal nitride, or the like having a high barrier property, can be used. As for the cover material, glass, ceramics, plastics, or metal can be used. However, when light is emitted to the cover material side, the cover material needs to have a light-transmitting property. The cover material is attached to the substrate over which the above-mentioned light-emitting element is formed, with a sealant such as a thermosetting resin or an ultraviolet curable resin, and a sealed space is formed by curing the resin with a heat treatment or an ultraviolet irradiation treatment. It is also effective to provide an absorbent material typified by barium oxide in the sealed space. The absorbent material may be provided on the sealant, over a partition wall or a peripheral part so as not to block light emitted from the light-emitting element. Further, it is also possible to fill the space between the cover material and the substrate over which the light-emitting element is formed with a thermosetting resin or an ultraviolet curable resin. In this case, it is effective to add an absorbent material typified by barium oxide into the thermosetting resin or the ultraviolet curable resin.

In this embodiment mode, although a switching TFT having a single gate structure is explained in detail, a multi-gate structure such as a double gate structure may also be employed. In the case where a semiconductor is manufactured using a SAS or a crystalline semiconductor, an impurity region can be formed by adding an impurity which imparts one conductivity type. In this case, a semiconductor layer may have impurity regions having different concentrations. For example, the semiconductor layer may have low concentration impurity regions in the vicinity of a channel formation region and a region which is overlapped with a gate electrode layer, and may have a high concentration impurity region outside thereof.

In this embodiment mode, the process can be simplified as described above. By forming various components (parts) and a mask layer directly over a substrate using a droplet-discharge method, a display panel can be easily manufactured even using a glass substrate of the fifth generation or later having a side of 1000 mm or more.

In accordance with the present invention, a conductive layer constituting a part of a semiconductor device or a display device can be manufactured with a simplified process. Thus, the cost can be reduced. In addition, by using a plating method, the film thickness or the size of a wire layer can be controlled relatively easily, and a wire layer which is suitable for an intended purpose can be formed. Accordingly, high performance and highly reliable semiconductor device and display device which can operate at a high speed can be manufactured.

Embodiment Mode 4

Figure 19A:
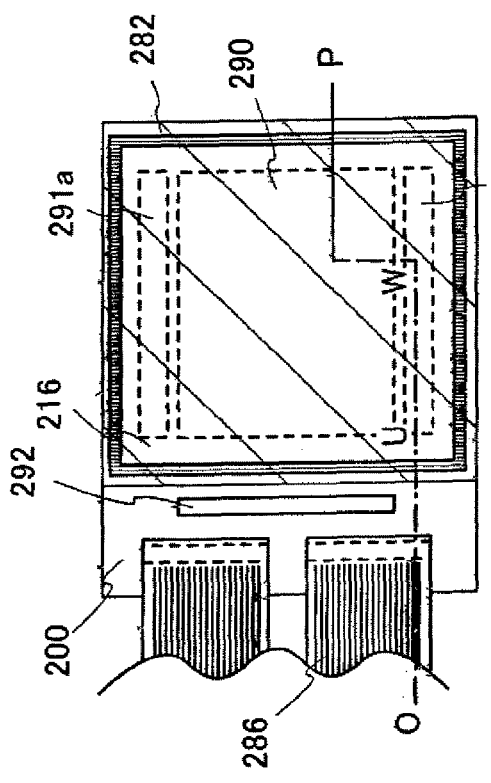
FIGS. 19A and 19B are diagrams explaining a display device of the present invention.
Figure 19B:
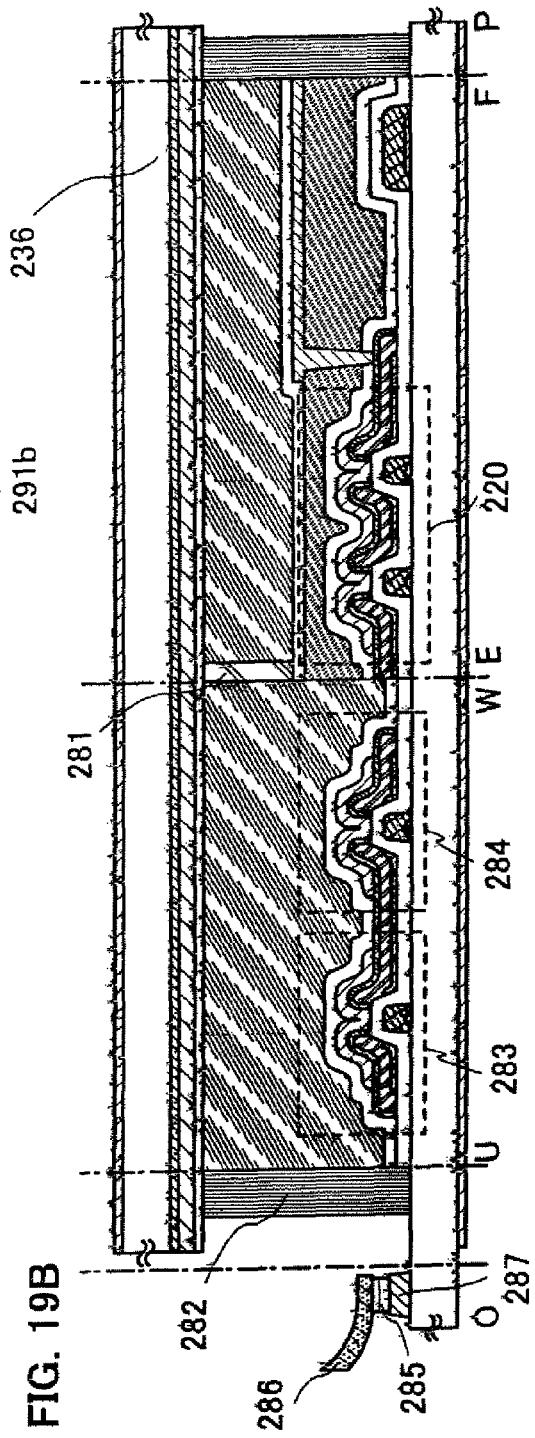

An embodiment mode of the present invention is explained with reference to FIGS. 13A to 19B. In more detail, a method for manufacturing a display device including a coplanar thin film transistor, to which the invention is applied, is explained. FIGS. 13A, 14A, 15A, 16A, 17A and 18A are top views of a pixel portion of a display device. FIGS. 13B, 14B, 15B, 16B, 17B and 18B are cross-sectional views taken along line E-F in each step of forming those shown in FIGS. 13A, 14A, 15A, 16A, 17A and 18A. FIGS. 19A is also a top view of a display device, and FIG. 19B is a cross-sectional view taken along line O-P (including U-W) of FIG. 19A. Note that an example of a liquid crystal display device using a liquid crystal material as a display element is described. Therefore, repetitive explanation of the same portions or portions having a similar function is omitted.

Figure 13A:
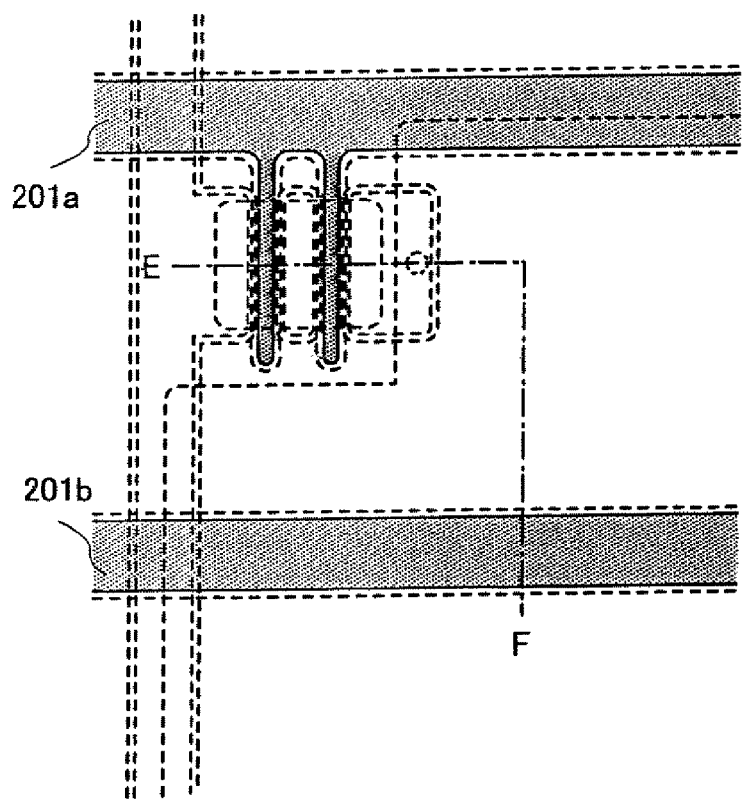
FIGS. 13A and 13B are diagrams explaining a method for manufacturing a display device of the present invention.
Figure 13B:
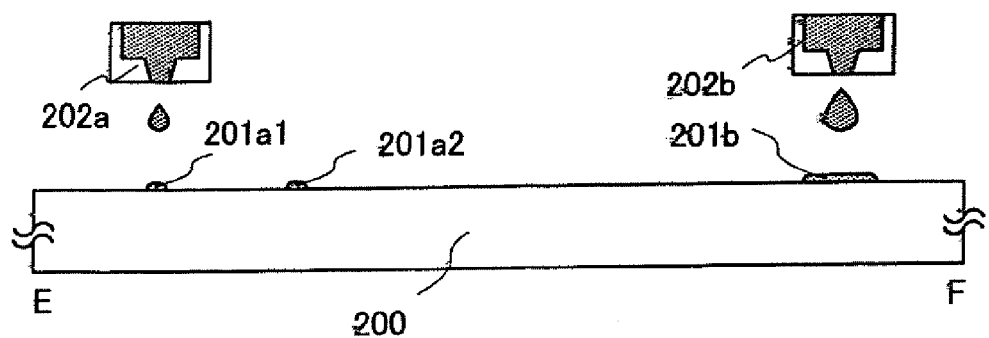

In this embodiment mode, a gate electrode layer, and a capacitor wire layer are formed by a plating method using the present invention. A photocatalyst material or a material including an amino group is selectively formed in a formation region for forming the gate electrode layer and the capacitor wire layer over the substrate 200 by a droplet-discharge method, as a material for adsorbing the plating catalyst material for the gate electrode layer and the capacitor wire layer. A liquid composition including a photocatalyst material or a material including an amino group is discharged to form photocatalyst materials or materials including an amino group 201a1, 201a2 and 201b by using droplet-discharge devices 202a and 202b (FIGS. 13A and 13B). The photocatalyst materials or material including an amino group 201a1, 201a2 and 201b are solidified by drying or baking. In this embodiment mode, titanium oxide is used as the photocatalyst material, and water is used as the solvent.

Figure 14A:
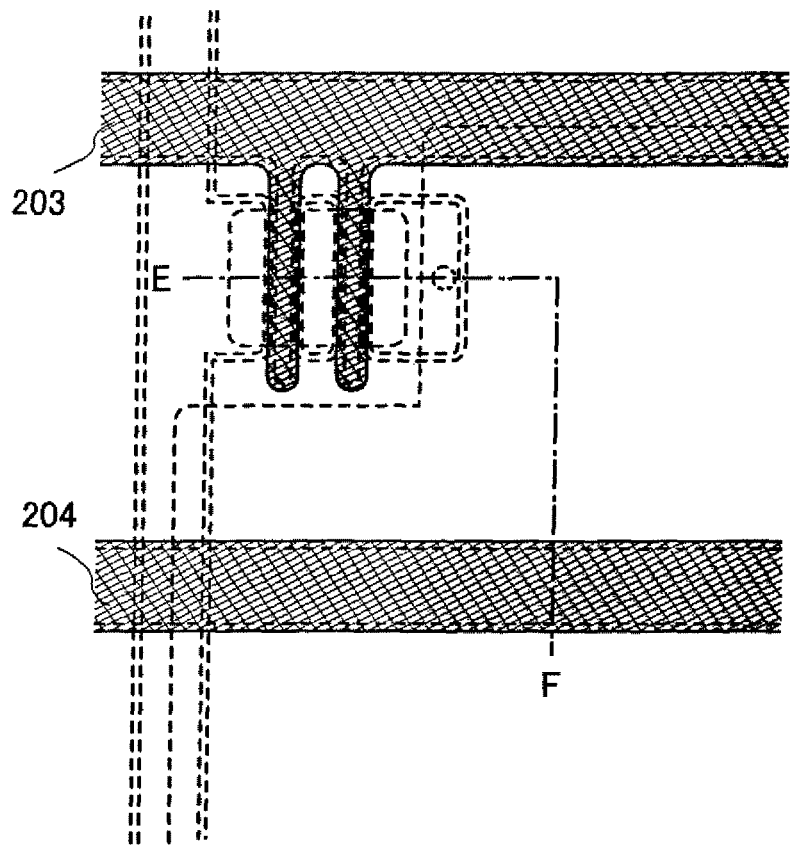
FIGS. 14A and 14B are diagrams explaining a method for manufacturing a display device of the present invention.
Figure 14B:
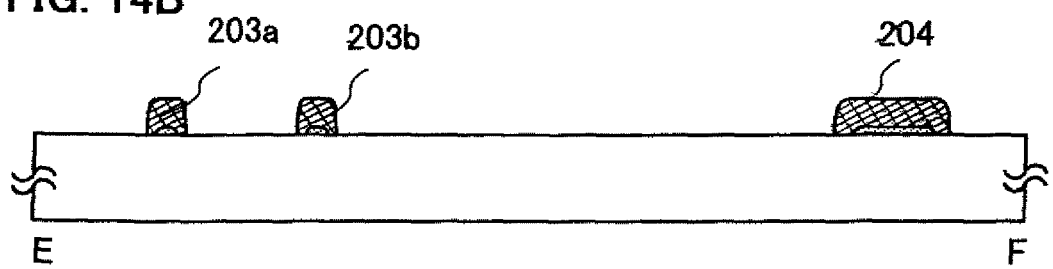

Then, the films are immersed in a solution including a plating catalyst material whose pH is adjusted, and the plating catalyst material is adsorbed onto the photocatalyst materials or materials including an amino group 201a1, 201a2 and 201b. After that, they are immersed in a plating solution including a metal material to grow the metal film on the plating catalyst material, thereby forming gate electrode layers 203a and 203b and a capacitor wire layer 204 (FIGS. 14A and 14B). Conductive films of the gate electrode layers 203a and 203b and the capacitor wire layer 204 are grown almost isotropically as shown in FIGS. 14A and 14B. Thus, the gate electrode layers 203a and 203b and the capacitor wire layer 204 are formed to cover top and side faces of the photocatalyst materials or material including an amino group 201a1, 201a2 and 201b.

As described in Embodiment Mode 2, when a photocatalyst material is used as the photocatalyst material or the material including an amino group and irradiated with light to generate a photocatalytic function, the pH adjustment of the solution including the plating catalyst material is not necessarily carried out. If it is not carried out, the photocatalyst material is immersed in the solution including the plating catalyst material while conducting light irradiation for generating the photocatalytic function of the photocatalyst material.

As a material including an amino group, a coupling agent which is chemically coupled with a substrate is preferable in terms of adhesion. As the coupling agent, a silane coupling agent and a titanium coupling agent can be used. A silane coupling agent having an amino group at its end group, for example, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, N,N-bis[3-(trimethoxysilyl)propyl] ethylenediamine, p-[N-(2-aminoethyl)aminomethyl] phenethyl trimethoxysilane, or the like can be used.

The photocatalyst material can reduce and deposit the plating catalyst material included in the solution by a photocatalytic function. The photocatalyst material is preferably titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like. Photocatalytic activity can be caused by irradiating the photocatalyst materials with light in an ultraviolet region (having a wavelength of 400 nm or less, preferably, 380 nm or less).

The plating catalyst material is selected as appropriate depending on a metal material to be used for plating. As the plating catalyst material, palladium (Pd), rhodium (Rh), ruthenium (Ru), osmium (Os), iridium (Ir), gold (Au), platinum (Pt), silver (Ag), or the like may be used The plating catalyst material is dissolved in a solution, and is used as a solution containing the plating catalyst material.

As the plating metal material, nickel (Ni), a nickel alloy (such as a nickel phosphorus (NiP) alloy, a nickel cobalt (NiCo) alloy, a nickel cobalt phosphorus (NiCoP) alloy, a nickel iron phosphorus (NiFeP) alloy, or a nickel tungsten phosphorus (NiWP) alloy), copper (Cu), gold (Au), cobalt (Co), tin (Sn), or the like can be used.

Other detailed plating conditions can be similar to those in Embodiment Mode 1.

Next, a gate insulating layer 207 is formed over the gate electrode layers 203a, 203b and the capacitor wire layer 204. The gate insulating layer 207 may be formed from an oxide material or a nitride material of silicon as a single layer or a multilayer. In this embodiment mode, a three-layer structure of a silicon nitride film, a silicon oxide film and a silicon nitride film is used.

Figure 15A:
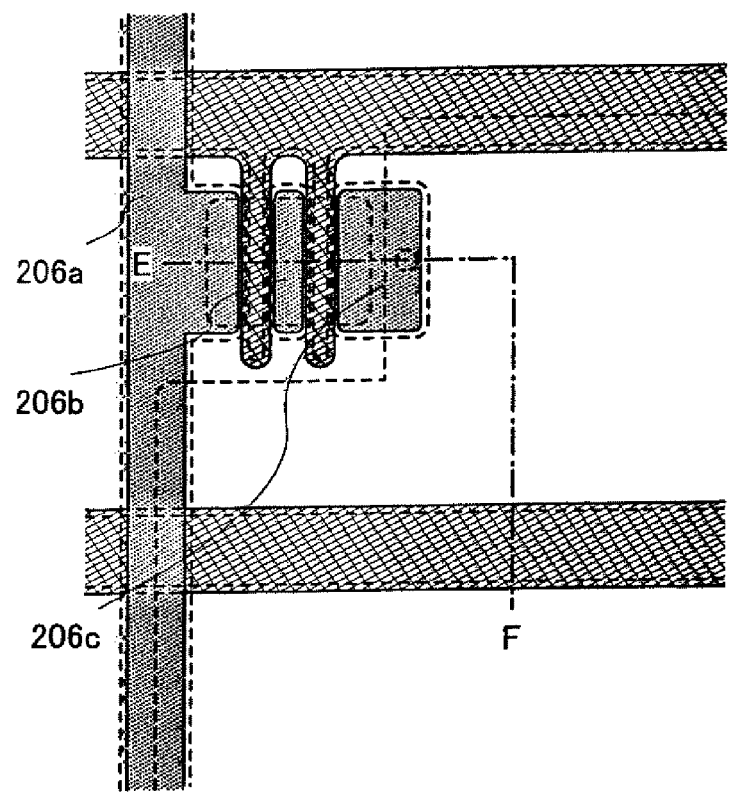
FIGS. 15A and 15B are diagrams explaining a method for manufacturing a display device of the present invention.
Figure 15B:
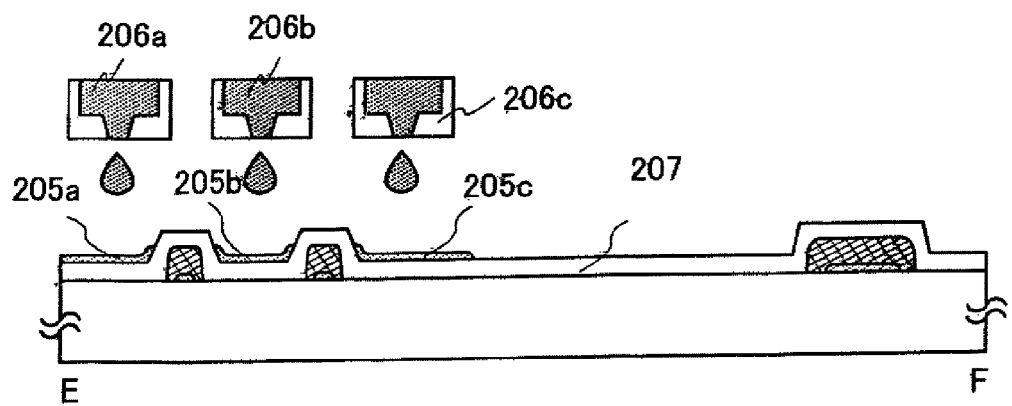

In this embodiment mode, a source or drain electrode layer is also formed by a plating method using the present invention. A photocatalyst material or a material including an amino group is selectively formed by a droplet-discharge method in a formation region for forming the source or drain electrode layer over the gate insulating layer 207 as a material for adsorbing the plating catalyst material for the source or drain electrode layer. A liquid composition including a photocatalyst material or a material including an amino group is discharged to form photocatalyst materials or material including an amino group 205a, 205b and 205c by using droplet-discharge devices 206a, 206b and 206c (FIGS. 15A and 15B). The photocatalyst materials or materials including an amino group 205a, 205b and 205c are solidified by drying or baking. In this embodiment mode, titanium oxide is used as the photocatalyst material, and water is used as the solvent.

Then, the films are immersed in a solution including a plating catalyst material whose pH is adjusted, and the plating catalyst material is adsorbed onto the photocatalyst materials or material including an amino group 205a, 205b and 205c.

Figure 16A:
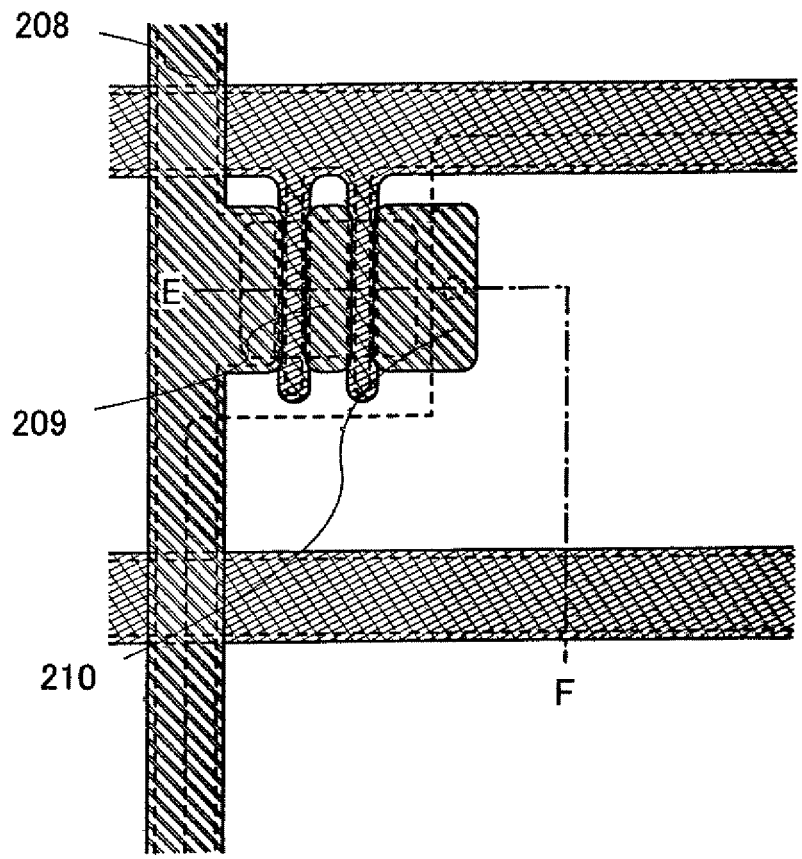
FIGS. 16A and 16B are diagrams explaining a method for manufacturing a display device of the present invention.
Figure 16B:
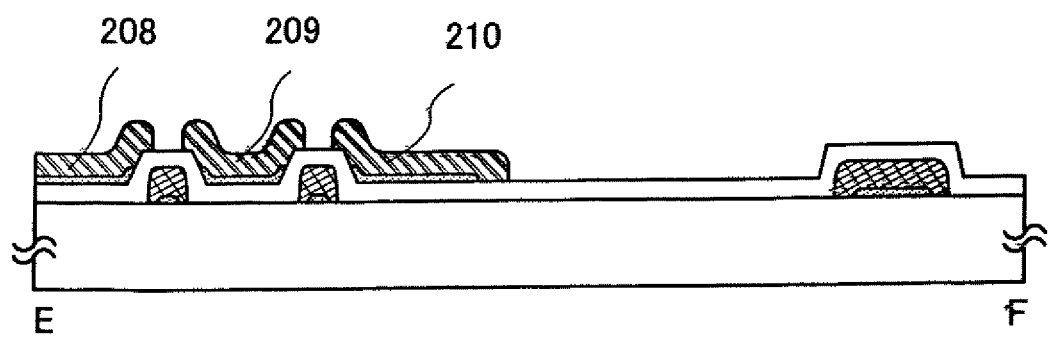

After that, they are immersed in a plating solution including a metal material to grow the metal film on the plating catalyst material, thereby forming source or drain electrode layers 208, 209 and 210 (FIGS. 16A and 16B). Metal films of the source or drain electrode layers 208, 209 and 210 are grown almost isotropically as shown in FIGS. 16A and 16B. Thus, the source or drain electrode layers 208, 209 and 210 are formed to cover top and side faces of the photocatalyst materials or materials including an amino group 205a, 205b and 205c.

Depending on a combination of a material used for a semiconductor layer and a material used for a source electrode layer and a drain electrode layer, degradation of electrical characteristics may occur, such as incapability of conducting or increase in resistance. Therefore, a material used for a semiconductor layer and a material used for a source electrode layer and a drain electrode layer need to be selected appropriately. In this embodiment mode, the source or drain electrode layer is formed by a plating method; therefore, displacement plating by another metal material can be performed to the surface of the source or drain electrode layer. Therefore, by forming the surface with a material having lower-resistance to a semiconductor layer to be stacked, electrical characteristics of a thin film transistor can be improved. In this embodiment mode, each of the source or drain electrode layer 208, the source or drain electrode layer 209, and the source or drain electrode layer 210 is a nickel-phosphorus alloy film formed using palladium as a plating catalyst material. Since pentacene, which is an organic semiconductor, is used for the semiconductor layer in this embodiment mode, gold is preferable as a material of the source electrode layer and drain electrode layer which is to be in contact with. Therefore, in this embodiment mode, gold plating is performed in which the surfaces of the source or drain electrode layer 208, the source or drain electrode layer 209, and the source or drain electrode layer 210 are displaced by gold.

Figure 17A:
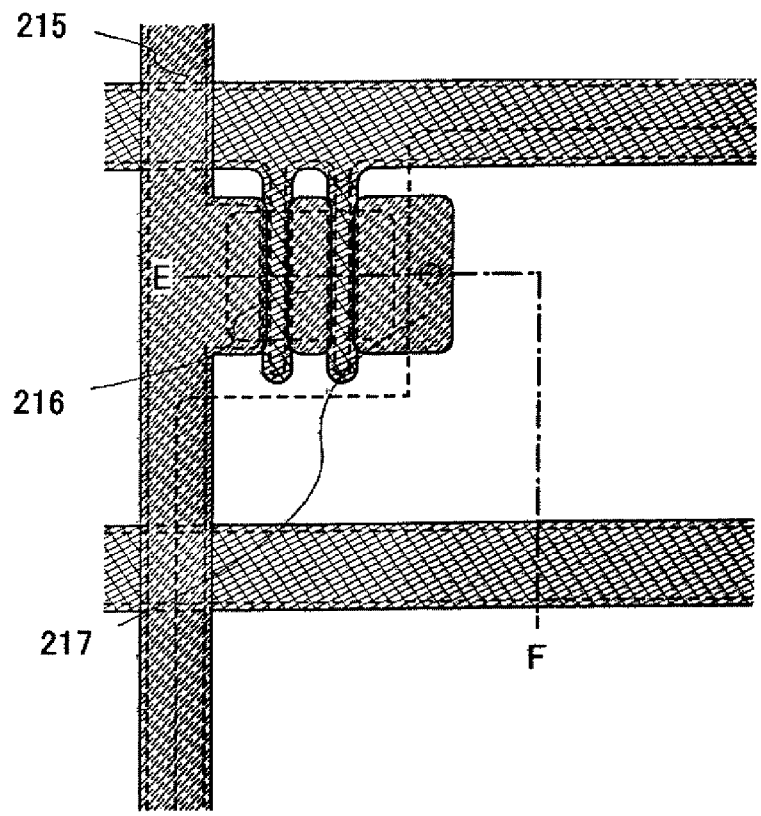
FIGS. 17A and 17B are diagrams explaining a method for manufacturing a display device of the present invention.
Figure 17B:
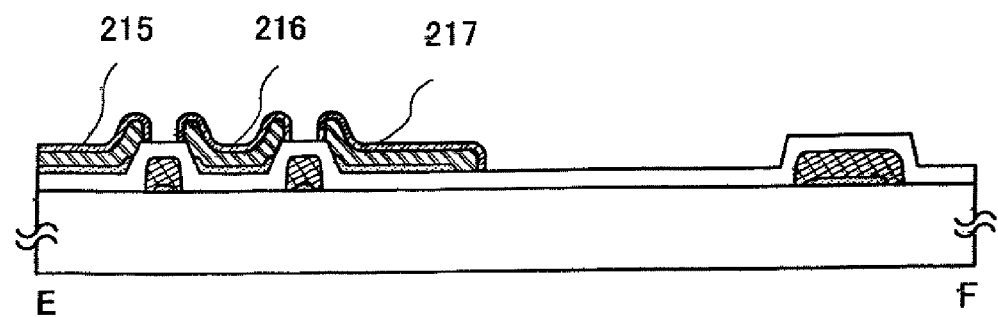
Figure 18A:
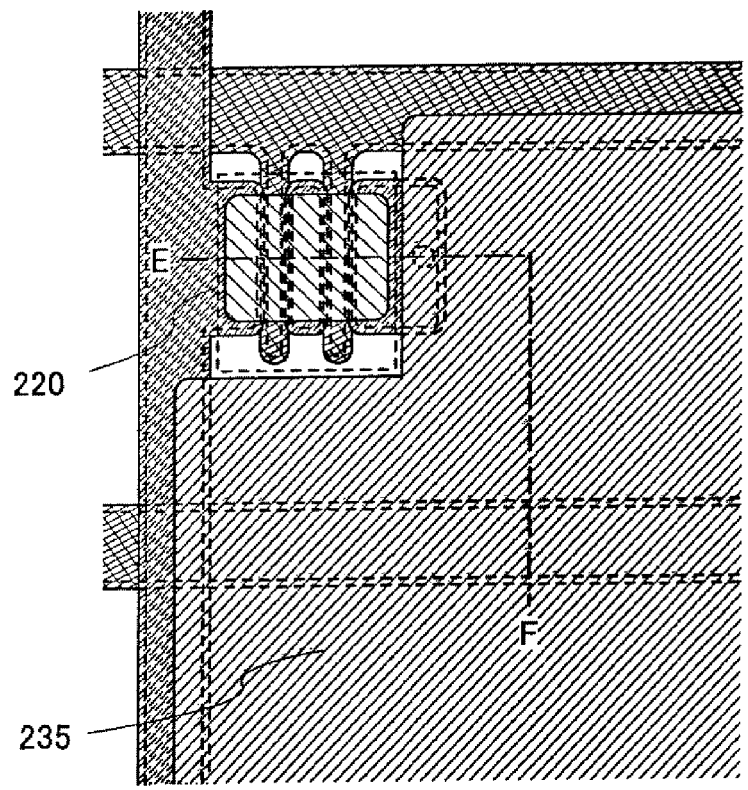
FIGS. 18A and 18B are diagrams explaining a display device of the present invention.
Figure 18B:
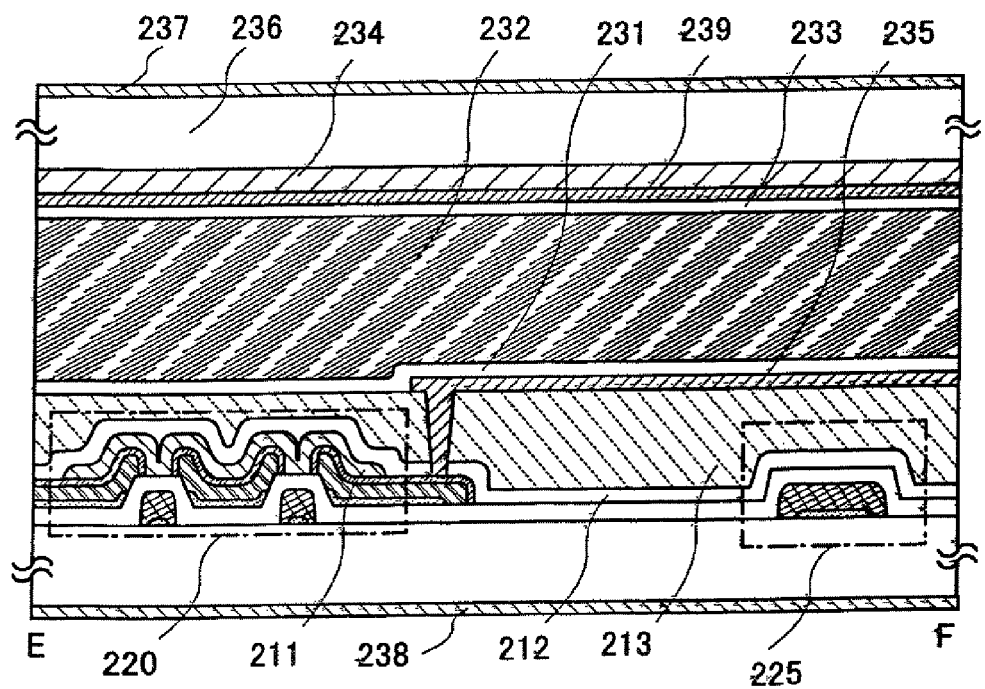

The source or drain electrode layer 208, the source or drain electrode layer 209, and the source or drain electrode layer 210 are immersed in a plating solution containing gold as a metal material to form a metal film 215, a metal film 216, and a metal film 217, which are gold thin films, on the surfaces of the source or drain electrode layer 208, the source or drain electrode layer 209, and the source or drain electrode layer 210 (FIGS. 17A and 17B).

In this embodiment mode, activation is performed in a sulphuric acid solution before performing gold plating. Further, it is effective to perform preheating (80° C. to 90° C.) immersion with pure water before plating. The plating solution containing gold as a metal material in this embodiment mode includes a metal salt (potassium gold cyanide, chlorauric acid), a complexing agent (EDTA (ethylenediaminetetraacetic acid), quadrol, citrate, lactate), a pH buffer (ammonium chloride-ammonia, phosphate-sodium phosphate), and the like. In addition, an active metal ion (for example, an ion of Zn, Co, Ni, Cu, or the like) may be added to increase deposition rate and obtain a thicker plating film. When an active metal ion is added, there are also advantageous effects such as improvement in luster and adhesion.

A semiconductor layer 211 is formed using pentacene by a droplet-discharge method to be in contact with the metal film 215, the metal film 216, and the metal film 217 over the source or drain electrode layer 208, the source or drain electrode layer 209, and the source or drain electrode layer 210 to form a coplanar thin film transistor 220. In addition, a capacitor 225 is also formed.

An insulating layer 212 and an insulating layer 213 are formed over the thin film transistor 220 and the capacitor 225. The insulating layer 213 functions as a planarizing film.

The insulating layer 212 and the insulating layer 213 can be formed using a material selected from among silicon oxide, silicon nitride, silicon oxynitride, silicon nitride oxide, aluminum nitride (AN), aluminum oxynitride (AlON), aluminum nitride oxide having more nitrogen content than oxygen content (AlNO), aluminum oxide, diamond-like carbon (DLC), a nitrogen-containing carbon (CN) film, PSG (phosphosilicate glass), a BPSG (borophosphosilicate glass), an alumina film, polysilazane, and other substances containing an inorganic insulating material. Further, a siloxane resin may be employed. Furthermore, an organic insulating material may be used. A photosensitive or non-photosensitive organic material may be employed, for example, polyimide, acrylic, polyamide, polyimide amide, resist or benzocyclobutene, or a low dielectric constant material can be used.

After forming the insulating layer 212 and the insulating layer 213 by discharging a composition, surfaces of the insulating layer 212 and the insulating layer 213 may be planarized by pressing with pressure to improve their planarity. As a pressing method, unevenness may be smoothed out by scanning a roller-shaped object over the surface, or the surface may be perpendicularly pressed with a flat plate-shaped object. Alternatively, an uneven portion on the surface may ay be removed with an air knife after softening or melting the surface with a solvent or the like. A CMP method may also be used for polishing the surface. This step can be employed in planarizing a surface when unevenness is generated by a formation method. When the planarity is improved through this step, display unevenness (mura) or the like of the display panel can be prevented; therefore, a high-definition image can be displayed.

Then, an opening reaching the metal film 217 is formed in the insulating layer 212 and the insulating layer 213, and a pixel electrode layer 235 is formed in contact with the metal film 217 over the source or drain electrode layer 210. The pixel electrode layer 235 can be formed using a similar material to the above-described first electrode layer 117. In a case where a transmissive liquid crystal display panel is manufactured, indium oxide containing tungsten oxide, indium zinc oxide containing tungsten oxide, indium oxide containing titanium oxide, indium tin oxide containing titanium oxide, or the like can be used. Naturally, indium tin oxide (ITO), indium zinc oxide (IZO), indium tin oxide to which silicon oxide is added (ITSO), or the like can also be used. As a reflective metal thin film, a conductive film formed of titanium, tungsten, nickel, gold, platinum, silver, aluminum, magnesium, calcium, lithium, an alloy thereof, or the like can be employed.

The pixel electrode layer 235 can be formed using an evaporation method, a sputtering method, a CVD method, a printing method, a droplet-discharge method, or the like. In this embodiment mode, indium tin oxide (ITO) is used for the pixel electrode layer 272.

Next, an insulating layer 231 referred to as an orientation film is formed by a printing method or a spin coating method so as to cover the pixel electrode layer 235 and the insulating layer 213. Note that the insulating layer 231 can be selectively formed by using a screen printing method or an offset printing method. After that, rubbing is performed. Then, a sealant 282 is formed by a droplet-discharge method at the periphery of a region where the pixels are formed.

Then, an opposite substrate 236 provided with an insulating layer 233 serving as an orientation film, a conductive layer 239 serving as an opposite electrode, a colored layer 234 serving as a color filter, and a polarizing plate 237 is attached to the substrate 200 that is a WI substrate with a spacer 281 interposed therebetween. By providing a space with a liquid crystal layer 232, a liquid crystal display panel can be manufactured (FIGS. 18A to 19B). A polarizing plate 238 is also formed on a side of the substrate 200 which is opposite to the side having elements. The sealant may be mixed with a filler, and further, the opposite substrate 236 may be provided with a shielding film (black matrix) or the like. Note that a dispenser method (a dropping method) or a dip method (a pumping method) by which a liquid crystal is injected utilizing a capillary phenomenon after attaching the substrate 200 having elements to the opposite substrate 236, can be used as a method of forming the liquid crystal layer.

Figure 30:
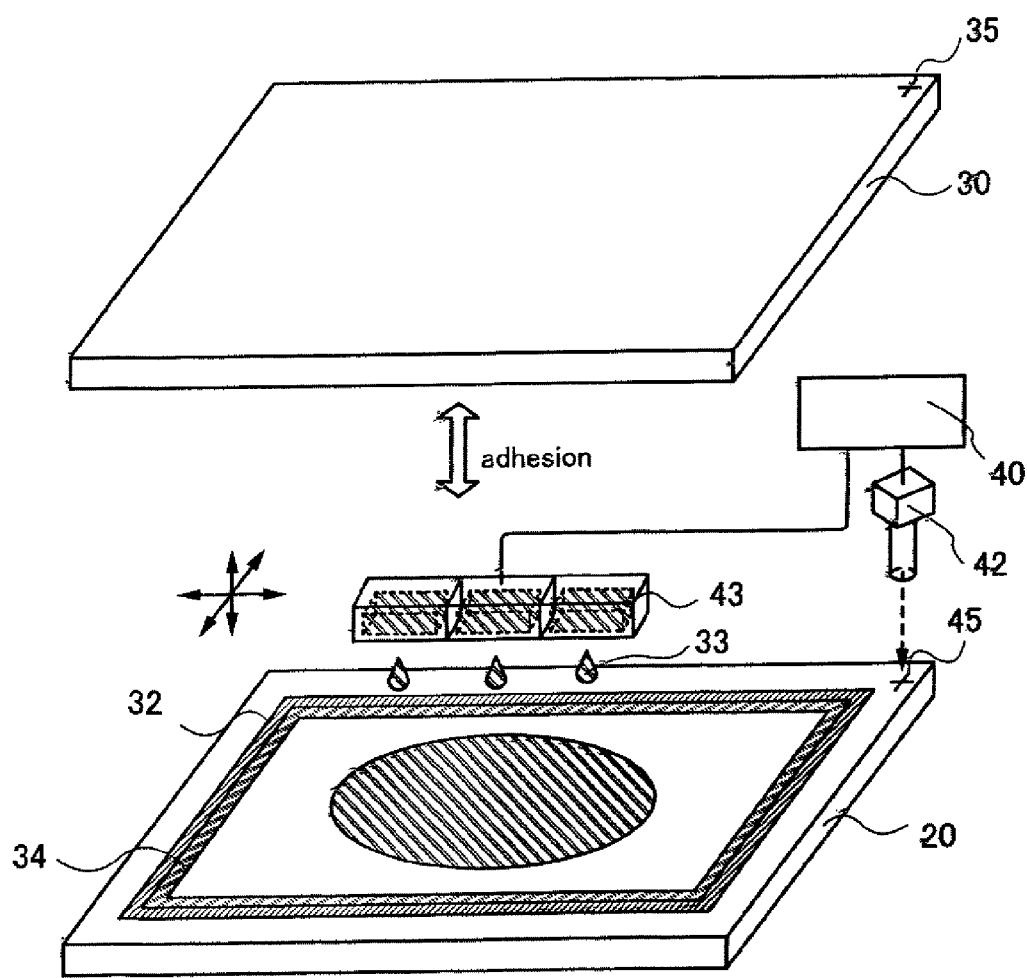
FIG. 30 is a diagram showing a structure of a droplet-discharge device which can be applied to the present invention.

A liquid crystal dropping method employing the dispenser method is explained with reference to FIG. 30. The liquid crystal dropping method shown in FIG. 30 includes a control device 40, an imaging means 42, a head 43, a liquid crystal 33, markers 35 and 45, a barrier layer 34, a sealant 32, a TFT substrate 30, and an opposite substrate 20. A closed loop is formed with the sealant 32, and the liquid crystal 33 is dropped one or more times in the closed loop from the head 43. When the liquid crystal material has high viscosity, the liquid crystal material is continuously discharged and attached onto a formation region without a break in the liquid. On the other hand, when the liquid crystal material has low viscosity, the liquid crystal material is intermittently discharged to drop a droplet as shown in FIG. 30. At that time, the barrier layer 34 is provided to prevent the sealant 32 and the liquid crystal 33 from reacting with each other. Next, the substrates are attached in a vacuum, and then, ultraviolet curing is performed to make the space filled with the liquid crystal. Alternatively, a sealant may be formed on a TFT substrate side, and a liquid crystal may be dropped.

The spacer may be provided by dispersing particles of several micrometers; however, in this embodiment mode, the spacer is provided by forming a resin film over the entire surface of the substrate and processing it. After coating the substrate with such a spacer material by a spinner, the spacer material is formed into a predetermined pattern by light exposure and a developing treatment. Further, the pattern is cured by heating at a temperature of 150° C. to 200° C. with a clean oven or the like. The spacer manufactured in this manner can have different shapes depending on the conditions of the light exposure and the developing treatment. It is preferable that the spacer have a pillar shape with a flat top portion, so that when the opposite substrate is attached to the substrate, the mechanical strength as a liquid crystal display device can be ensured. There is no particular limitation on the shape of the spacer, and it may have the shape of a circular cone or the shape of a pyramid shape.

A connection portion is formed to connect the inside of the display device formed through the above steps with an external wiring board. The insulating layer in the connection portion is removed by an ashing treatment using an oxygen gas under atmospheric pressure or pressure close to the atmospheric pressure. This treatment is performed by using an oxygen gas and one or more gases selected from among hydrogen, $CF_4$, $NF_3$, $H_2O$, and $CHF_3$. In this step, the ashing treatment is performed after sealing is done with the opposite substrate to prevent damage or destruction due to static electricity; however, the ashing treatment may be performed at any timing, as long as there are almost no influences from static electricity.

After that, a terminal electrode layer 287 which is electrically connected to the pixel portion is provided with an FPC 286 which is a wiring board for connection through an anisotropic conductive layer 285. The FPC 286 has a function of transmitting a signal or an electric potential from the outside. Through the above-mentioned steps, a liquid crystal display device having a display function can be manufactured.

A top view of a liquid crystal display device is shown in FIG. 19(A). As shown in FIGS. 19A and 19B, a pixel portion 290 and scanning line driver regions 291a and 291b are sealed between the substrate 200 and the opposite substrate 236 with the sealant 282, and a signal line driver circuit 292 formed with a driver IC is provided over the substrate 200. A driver circuit having thin film transistors 283 and 284 is provided in a driver region.

Since the thin film transistors 283 and 284 are n-channel thin film transistors, an NMOS circuit including the thin film transistors 283 and 284 is provided as a peripheral driver circuit in this embodiment mode.

In this embodiment mode, an NMOS structure is used in a driver circuit region and functions as an inverter. In the case of thus using only a PMOS structure or an NMOS structure, a gate electrode layer of some of TFTs is connected to a source or drain electrode layer thereof.

Although a switching TFT has a double gate structure in this embodiment mode, it may have a single gate structure or a multi-gate structure. In the case where a semiconductor is manufactured using a SAS or a crystalline semiconductor, an impurity region can be formed by adding an impurity which imparts one conductivity type. In this case, the semiconductor layer may have impurity regions having different concentrations. For example, the semiconductor layer may have low concentration impurity regions in the vicinity of a channel formation region and a region which is overlapped with a gate electrode layer, and may have a high concentration impurity region outside those regions.

As described above, the process can be simplified in this embodiment mode. Also, by forming various kinds of components (parts) or a mask layer directly over a substrate using a droplet-discharge method, a display panel can be easily manufactured even using a glass substrate of the fifth generation or later having a side of 1000 mm or more.

In accordance with the present invention, a conductive layer constituting a part of a semiconductor device or a display device can be manufactured with a simplified process. Thus, cost can be reduced. In addition, by using a plating method, the film thickness and the size of a wire layer can be controlled relatively easily, and a wire layer suitable for an intended purpose can be formed. Accordingly, high performance and highly reliable semiconductor device and display device which can operate at a high speed can be manufactured.

Embodiment Mode 5

Embodiment Mode 5 of the present invention will be described with reference to FIGS. 20A to 20D and FIGS. 21A to 21C. In this embodiment mode, a display device is manufactured using a top gate type (staggered type) thin film transistor. A liquid crystal display device using a liquid crystal material as a display element is shown as an example. Therefore, repetitive explanation of the same portion or a portion having a similar function is omitted. FIGS. 20A to 20D and FIGS. 21A to 21C are cross-sectional views of a display device.

In this embodiment mode, a source or drain electrode layer and a gate electrode layer are also formed by a plating method using the present invention. A photocatalyst material or a material including an amino group is selectively formed by a droplet-discharge method in a formation region for forming the source or drain electrode layer over a substrate 300 as a material for adsorbing the plating catalyst material for the source or drain electrode layer. A liquid composition including a photocatalyst material or a material including an amino group is discharged to form photocatalyst materials or material including an amino group 351a, 351b, 351c and 351d by a droplet-discharge device 382. The photocatalyst materials or material including an amino group 351a and 351b are solidified by drying or baking. In this embodiment mode, titanium oxide is used as the photocatalyst material, and water is used as the solvent.

Figure 20A:
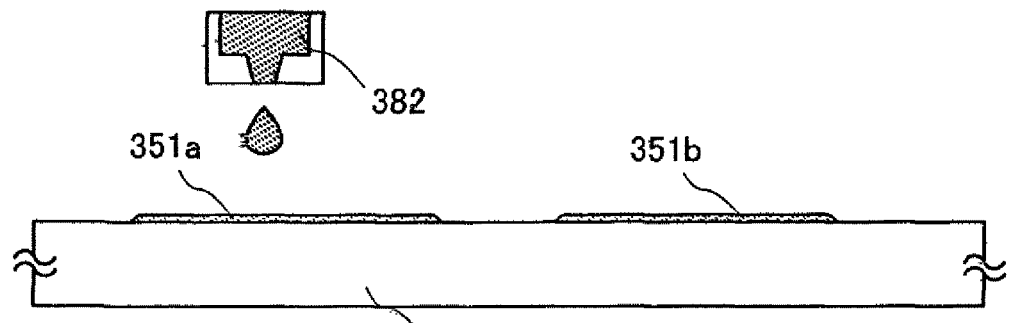
FIGS. 20A to 20D are diagrams explaining a method for manufacturing a display device of the present invention.
Figure 20B:
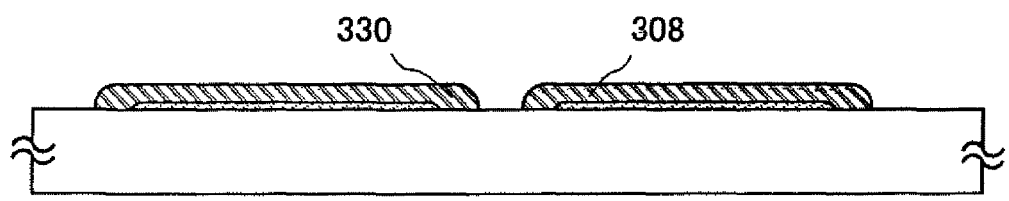

Then, the films are immersed in a solution including a plating catalyst material whose pH is adjusted, and the plating catalyst materials are adsorbed onto the photocatalyst materials or materials including an amino group 351a and 351b. After that, they are immersed in a plating solution including a metal material to grow the metal film on the plating catalyst material, thereby obtaining source or drain electrode layers 330 and 308 (FIG. 20B). As shown in FIG. 20B, metal films of the source or drain electrode layers 330 and 308 are grown almost isotropically. Thus, the source or drain electrode layers 330 and 308 are formed to cover top and side faces of the photocatalyst materials or material including an amino group 351a and 351b.

As described in Embodiment Mode 2, when a photocatalyst material is used as the photocatalyst material or the material including an amino group and irradiated with light to generate a photocatalytic function, the pH adjustment of the solution including the plating catalyst material is not necessarily done. In this case, the photocatalyst material is immersed in the solution including the plating catalyst material while conducting light irradiation for generating the photocatalytic function of the photocatalyst material.

As a material including an amino group, a coupling agent which is chemically coupled with a substrate is preferable in terms of adhesion. As the coupling agent, a silane coupling agent and a titanium coupling agent can be used. A silane coupling agent having an amino group at its end group, for example, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, N,N-bis[3-(trimethoxysilyl)propyl]ethylenediamine, p-[N-(2-aminoethyl)aminomethyl]phenethyltrimethoxysilane, or the like can be used.

The photocatalyst material can reduce and deposit the plating catalyst material included in the solution by a photocatalytic function. The photocatalyst material is preferably titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like. Photocatalytic activity can be caused by irradiating the photocatalyst material with light in an ultraviolet region (having a wavelength of 400 nm or less, preferably, 380 nm).

The plating catalyst material is appropriately selected depending on a metal material to be used for plating. As the plating catalyst material, palladium (Pd), rhodium (Rh), ruthenium (Ru), osmium (Os), iridium (Ir), gold (Au), platinum (Pt), silver (Ag), or the like may be used. The plating catalyst material is dissolved in a solution, and is used as a solution containing the plating catalyst material.

As the plating metal material, nickel (Ni), a nickel alloy (such as a nickel phosphorus (NiP) alloy, a nickel cobalt (NiCo) alloy, a nickel cobalt phosphorus (NiCoP) alloy, a nickel iron phosphorus (NiFeP) alloy, or a nickel tungsten phosphorus (NiWP) alloy), copper (Cu), gold (Au), cobalt (Co), tin (Sn), or the like can be used.

Other detailed plating conditions can be similar to those in Embodiment Mode 1.

Figure 20C:
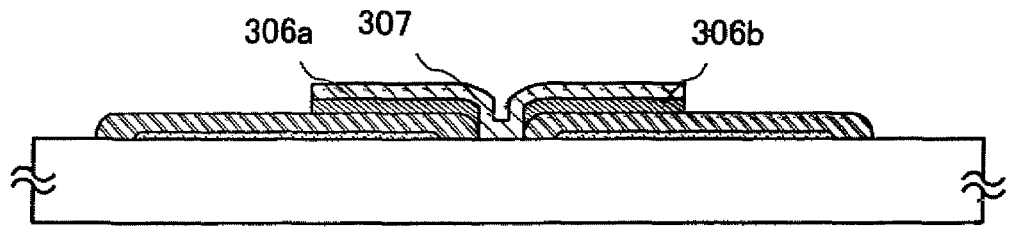

An n-type semiconductor layer is formed over the source or drain electrode layers 330 and 308 and etched using a mask formed of a resist or the like. The resist may be formed by a droplet-discharge method. A semiconductor layer is formed over the n-type semiconductor layer and processed again using a mask or the like. Accordingly, n-type semiconductor layers 306a and 306b and a semiconductor layer 307 are formed (FIG 20C). The n-type semiconductor layer may be formed by stacking a semiconductor layer containing an impurity element which imparts n-type conductivity at a higher -concentration and a semiconductor layer containing an impurity element which imparts n-type conductivity at a lower concentration over the source or drain electrode layer.

Figure 20D:
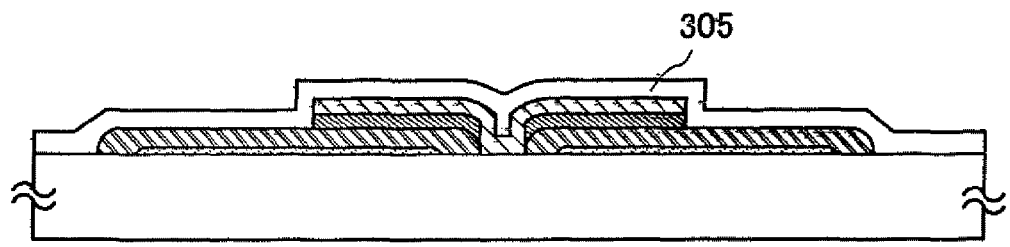

Subsequently, a gate insulating layer 305 is formed to have a stacked structure or a single-layer structure by a plasma CVD method or a sputtering method (FIG. 20D). As a particularly preferable mode, a stacked layer of three insulating layers, a silicon nitride film, a silicon oxide film, and a silicon nitride film, is used.

Figure 21A:
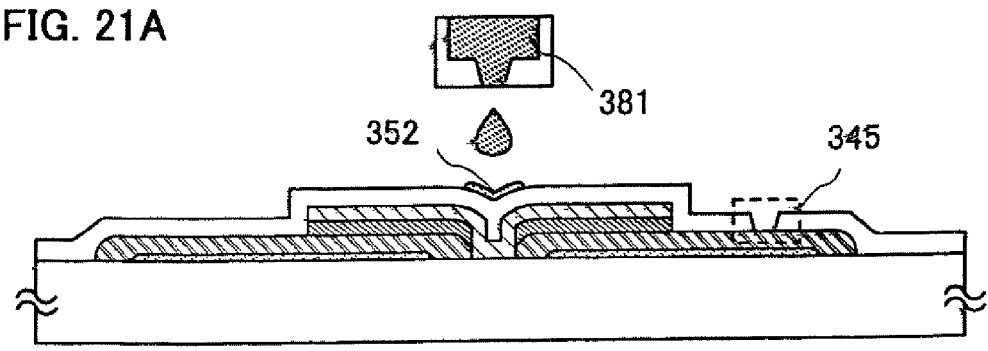
FIGS. 21A to 21C are diagrams explaining a method for manufacturing a display device of the present invention.

Subsequently, a mask formed of a resist or the like is formed over the gate insulating layer 305, and the gate insulating layer 305 is etched to form a through hole 345. In this embodiment mode, the mask is selectively formed by a droplet-discharge method. Further, in this embodiment mode, the gate electrode layer is formed by a plating method, and thus, a photocatalyst material or a material including an amino group which functions to adsorb the plating catalyst material, is selectively formed by a droplet-discharge method, similarly to the source or drain electrode layers 308 and 330. In this embodiment mode, a photocatalyst material or a material including an amino group 352 is selectively formed by discharging a liquid composition including a photocatalyst material or a material including an amino group from a droplet-discharge device 381 (FIG. 21A).

Figure 21B:
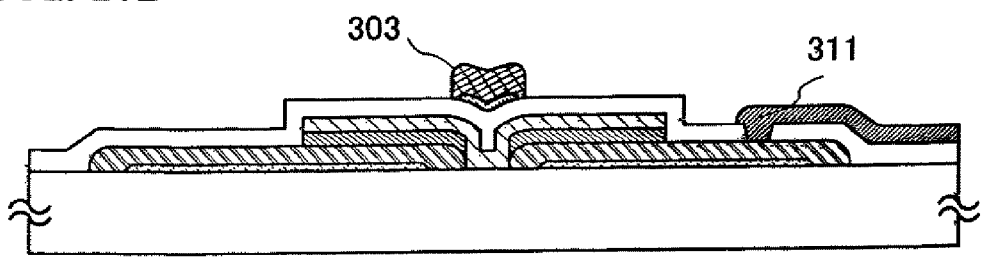

The photocatalyst material or a material including an amino group 352 is immersed in a solution including a plating catalyst material whose pH is adjusted, so that the plating catalyst material is adsorbed onto the photocatalyst material or a material including an amino group 352. The plating catalyst material is immersed in a plating solution including a metal material so that a metal film can grow on the plating catalyst material, thereby forming a gate electrode layer 303. Since a metal film of the gate electrode layer 303 is grown almost isotropically as shown in FIG. 21B, it is formed to cover top and side faces of the photocatalyst material or a material including an amino group 352.

In this embodiment mode, a pixel electrode layer 311 is formed by a droplet-discharge method and is electrically connected to a source or drain electrode layer 308 through a through hole 345 which has been formed before. The pixel electrode layer 311 can be formed using the same material as the first electrode layer 117 described above. In a case where a transmissive liquid crystal display panel is manufactured, the pixel electrode layer may be formed into a desired pattern using a composition containing indium tin oxide (ITO), indium tin oxide having silicon oxide (ITSO), zinc oxide (ZnO), tin oxide ($SnO_2$), or the like, and baked.

Subsequently, an insulating layer 312 referred to as an orientation film is formed by a printing method or spin coating so as to cover the pixel electrode layer 311. Note that the insulating layer 312 can be selectively formed by using a screen printing method or an offset printing method. Then, rubbing is performed. Then, a sealant is formed by a droplet-discharge method in an area surrounding a region where pixels are formed (not shown).

Figure 21C:
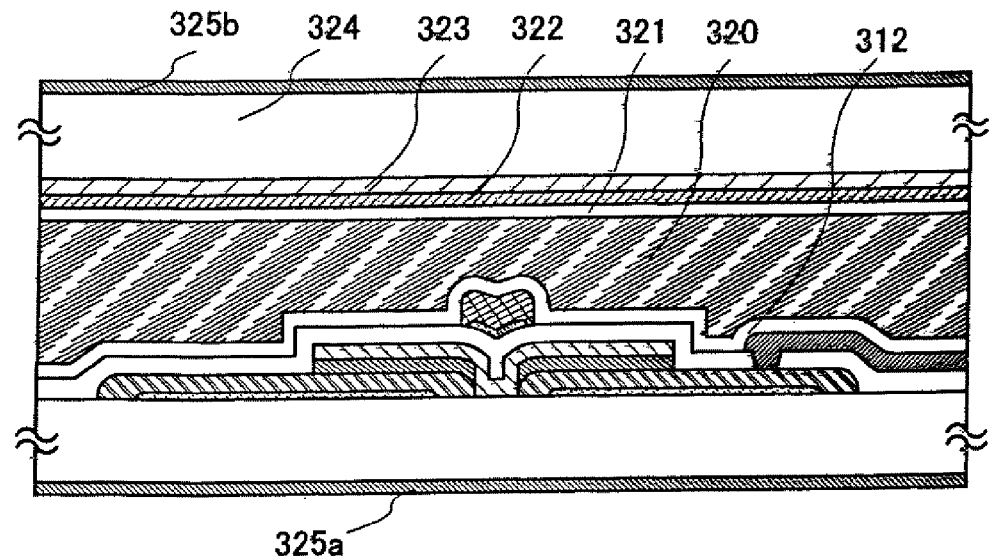

After that, an opposite substrate 324 in which the insulating film 321 serving as an orientation film, a conductive layer 324 serving as an opposite electrode, a colored layer 323 serving as a color filter, a polarizing plate 325b are formed, is attached to the substrate 300 provided with the TFT (TFT substrate) in which a polarizing plate 325a is formed, with a spacer interposed therebetween. By providing the space with a liquid crystal layer 320, a liquid crystal display panel can be manufactured (FIG. 21C). A sealant may be mixed with a filler, and further, the opposite substrate 324 may be provided with a shielding film (a black matrix) or the like. Note that a dispenser method (a dropping method) or a dip coating method (a pumping method) by which a liquid crystal is injected utilizing a capillary phenomenon after attaching the opposite substrate 324 can be used as a method of forming the liquid crystal layer.

A connecting portion is formed for connecting a pixel portion formed by the above process and an external wiring board. Under atmospheric pressure or pressure close to the atmospheric pressure, an insulating layer of the connecting portion is removed by an ashing treatment using oxygen gas. This treatment is carried out by using oxygen gas and one or more selected from among hydrogen, $CF_4$, $NF_3$, $H_2O$, and $CHF_3$. In this step, the ashing treatment is performed after sealing is done with the opposite substrate to prevent damage or destruction due to static electricity; however, the ashing treatment may be performed at any timing, as long as there are almost no influences from static electricity.

Subsequently, a wiring board for connection is provided so that a wire layer can be electrically connected via an anisotropic conductive layer. The wiring board takes on a role of transmitting signals and electric potentials from the exterior. Through the above process, a liquid crystal display panel having a display function can be manufactured.

In this embodiment mode, a single gate structure is described for the switching TFT; however, a structure may be a multigate structure such as a double gate structure. In a case where SAS or a crystalline semiconductor is used as a semiconductor, an impurity imparting one conductivity type is added to form an impurity region. In this case, a semiconductor layer may have impurity regions having different concentrations. For example, the semiconductor layer may have low concentration impurity regions in the vicinity of a channel formation region and a region which is overlapped with a gate electrode layer, and may have a high concentration impurity region outside those regions.

In this embodiment mode, the process can be simplified as described above. By forming various components (parts) directly over a substrate using a droplet-discharge method, a display panel can be easily manufactured even using a glass substrate of the fifth generation or later having a side of 1000 mm or more.

In accordance with the present invention, a conductive layer constituting a part of a semiconductor device or a display device can be manufactured with a simplified process. Thus, the cost can be reduced. In addition, by using a plating method, the film thickness or the size of a wire layer can be controlled comparatively easily, and a wire layer suitable for an intended purpose can be formed. Accordingly, high performance and highly reliable semiconductor device and display device which can operate at a high speed can be manufactured.

Embodiment Mode 6

A thin film transistor can be formed in accordance with the present invention, and a display device can be formed using the thin film transistor. In addition, when a light-emitting element is used and an n-channel transistor is used as a transistor which drives the light-emitting element, light emitted from the light-emitting element is extracted in any mode of bottom emission, top emission, and dual emission. Here, a stacked structure of the light-emitting element corresponding to each emission mode will be described with reference to FIGS. 12A to 12C.

Further, in this embodiment mode, channel protective thin film transistors 461, 471, and 481 using the present invention are used. The thin film transistor 481 is provided over a light-transmitting substrate 480 and includes a gate electrode layer 493, a gate insulating film 497, a semiconductor layer 494, n-type semiconductor layers 495a and 495b, source or drain electrode layers 487a and 487b, and a channel protective layer 496. The gate electrode layer 493 is formed from a photocatalyst material or a material including an amino group 482 having a function of adsorbing or depositing a plating catalyst material by a plating method. Since the photocatalyst material or the material including an amino group 482 is selectively formed by a droplet-discharge method, the manufacturing process can be simplified.

In this embodiment mode, a crystalline semiconductor layer is used as the semiconductor layer, and an n-type semiconductor layer is used as a semiconductor layer having one conductivity type. Instead of forming the n-type semiconductor layer, the semiconductor layer may be provided with a conductivity by a plasma treatment using a $PH_3$ gas. The semiconductor layer is not limited to this embodiment mode, and an amorphous semiconductor layer can be used. In the case of using a crystalline semiconductor layer of polysilicon or the like as in this embodiment mode, an impurity region having one conductivity type may be formed by introducing (adding) an impurity into the crystalline semiconductor layer without forming the semiconductor layer having one conductivity type. Further, an organic semiconductor of pentacene or the like can be used. When an organic semiconductor is selectively formed by a droplet-discharge method or the like, the processing process can be simplified.

In the embodiment mode, an amorphous semiconductor layer is crystallized to form a crystalline semiconductor layer as the semiconductor layer 494. In the crystallizing step, an element which promotes crystallization (also referred to as a catalytic element or a metal element) is added into the amorphous semiconductor layer, and a heat treatment (at a temperature of 550° C. to 750° C. for 3 minutes to 24 hours) is performed to crystallize the amorphous semiconductor layer. As a metal element which promotes crystallization, one or more elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In this embodiment mode, nickel is used.

In order to remove or reduce the element which promotes crystallization from the crystalline semiconductor layer or reduce the element, a semiconductor layer containing an impurity element is formed in contact with the crystalline semiconductor layer and used as a gettering sink. The impurity element may be an impurity element imparting n-type conductivity, an impurity element imparting p-type conductivity, a rare gas element or the like. For example, one or more elements of phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment mode, an n-type semiconductor layer containing phosphorus (P) which is an impurity element imparting n-type conductivity is formed as the semiconductor layer containing the impurity element which functions as a gettering sink. The n-type semiconductor layer is formed over the crystalline semiconductor layer containing the element which promotes crystallization, and a heat treatment (at a temperature of 550 ° C. to 750° C. for 3 minutes to 24 hours) is performed. The element which promotes crystallization in the crystalline semiconductor layer moves into the n-type semiconductor layer, and the element which promotes crystallization in the crystalline semiconductor layer is removed or reduced to form the semiconductor layer 494. On the other hand, the n-type semiconductor layer becomes an n-type semiconductor layer containing a metal element that is the element which promotes crystallization and is then processed into a desired shape to form n-type semiconductor layers 495a and 495b. The n-type semiconductor layers 495a and 495b function as gettering sinks of the semiconductor layer 494 and also function as a source region or a drain region directly.

In this embodiment mode, a crystallizing step and a gettering step for the semiconductor layer are performed by a plurality of heat treatments; however, the crystallizing step and gettering step can be performed by one heat treatment. In this-case, the heat treatment may be performed after forming an amorphous semiconductor layer, adding an element which promotes crystallization, and forming a semiconductor layer functioning as a gettering sink.

In the embodiment mode, a gate insulating layer is formed by stacking a plurality of layers, and the gate insulating film 497 has a two-layered structure formed by sequentially stacking a silicon nitride oxide film and a silicon oxynitride film over the gate electrode layer 493. The insulating layers to be stacked are preferably formed continuously at the same temperature in the same chamber by changing reaction gases while maintaining a vacuum state. When the layers are continuously stacked while maintaining the vacuum state, an interface between the stacked films can be prevented from being contaminated.

The channel protective layer 496 may be formed by dropping polyimide, polyvinyl alcohol, or the like by a droplet-discharge method. As a result, a light exposure step can be omitted. The channel protective layer may be formed from a film of one or a plurality of an inorganic material (silicon oxide, silicon nitride, silicon oxynitride, silicon nitride oxide, or the like), a photosensitive or non-photosensitive organic material (an organic resin material) (polyimide, acrylic, polyamide, polyimide amide, benzocyclobutene, or the like), resist, a low dielectric constant material, and the like; a stacked layer of such films; or the like. Alternatively, a siloxane resin material may be used. As a manufacturing method, a vapor phase growth method such as a plasma CVD method or a thermal CVD method, or a sputtering method can be used. A droplet-discharge method, or a printing method (a method for forming a pattern, such as screen printing or offset printing) can also be used. An SOG film obtained by a coating method can also be used.

Figure 12A:
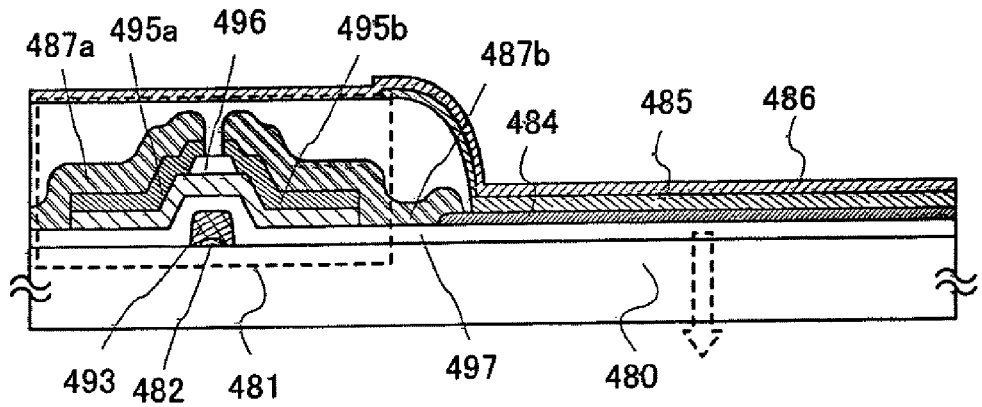
FIGS. 12A to 12C are diagrams explaining a method for manufacturing a display device of the present invention.
Figure 12B:
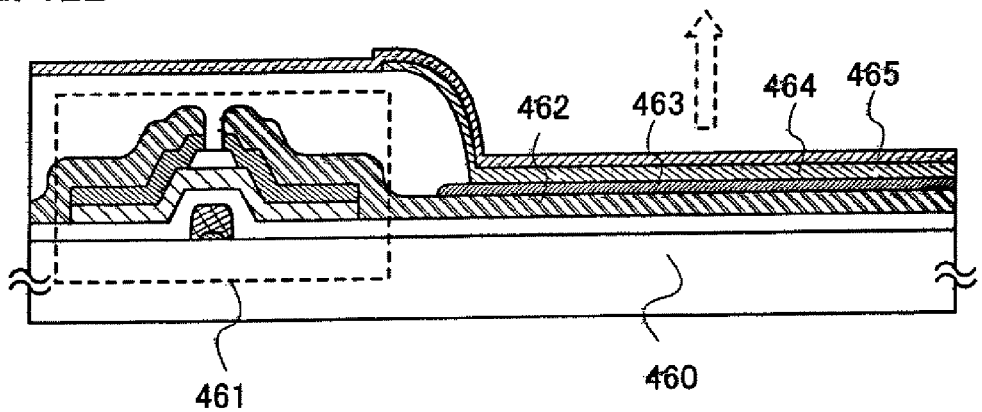
Figure 12C:
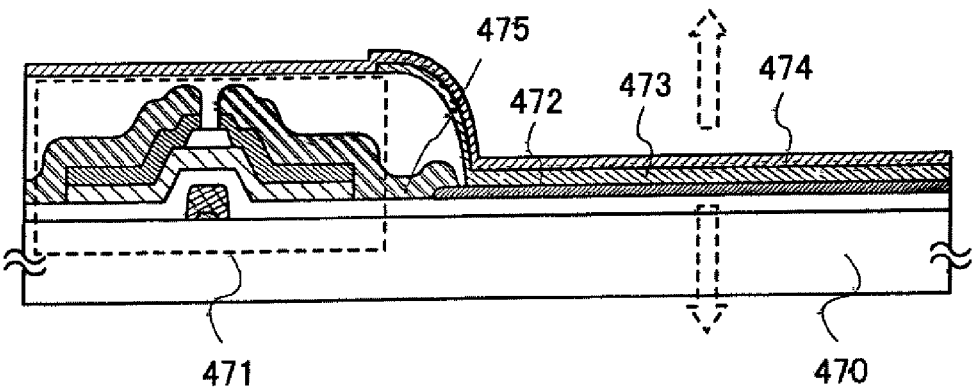

First, the case of emitting light to a substrate 480 side, in other words, a bottom emission mode, is explained with reference to FIG. 12A. In this case, a first electrode layer 484, an electroluminescent layer 485, and a second electrode layer 486 are sequentially stacked to be in contact with the source or drain electrode layer 487b so that the first electrode layer 484 can be electrically connected to the thin film transistor 481. The substrate 480 through which light passes is required to transmit at least visible light. Next, the case of emitting light to the side opposite to a substrate 460, in other words, a top-emission mode, is explained with reference to FIG. 12B. The thin film transistor 461 can be formed in a similar manner to the above described thin film transistor.

A source or drain electrode layer 462 which is electrically connected to the thin film transistor 461 is in contact with a first electrode layer 463 so as to be electrically connected to the first electrode layer 463. The first electrode layer 463, an electroluminescent layer 464, and a second electrode layer 465 are sequentially stacked. The source or drain electrode layer 462 is a reflective metal layer and reflects light, which is emitted from a light-emitting element, upward as indicated by an arrow. The source or drain electrode layer 462 and the first electrode layer 463 are stacked, and therefore, when the first electrode layer 463 is formed using a light-transmitting material and transmits light therethrough, the light is reflected by the source or drain electrode layer 462 and is then emitted to the opposite side of the substrate 460. Naturally, the first electrode layer 463 may be formed using a reflective metal film. Since light generated in the light-emitting element is emitted through the second electrode layer 465, the second electrode layer 465 is formed using a material which transmits at least visible light. Lastly, the case of emitting light through both a substrate 470 side and an opposite side, in other words, a dual emission mode, is explained with reference to FIG. 12C. The thin film transistor 471 is also a channel protective thin film transistor. A source or drain electrode layer 477 electrically connected to a semiconductor layer of the thin film transistor 471 is electrically connected to a first electrode layer 472. The first electrode layer 472, an electroluminescent layer 473, and a second electrode layer 474 are sequentially stacked. When both the first electrode layer 472 and the second electrode layer 474 are formed using materials which can transmit at least light in the visible region (visible light) or formed to have such thicknesses that can transmit light, the dual emission mode is realized. In this case, an insulating layer and the substrate 470 through which light passes are also required to transmit at least light in the visible region.

Modes of light-emitting elements that can be applied to this embodiment mode are shown in FIGS. 11A to 11D. FIGS. 11A to 11D each show a structure of a light-emitting element. Each light-emitting element has a structure in which an electroluminescent layer 860 in which an organic compound and an inorganic compound are mixed, is interposed between a first electrode layer 870 and a second electrode layer 850. The electroluminescent layer 860 includes a first layer 804, a second layer 803 and a third layer 802 as shown in FIGS. 11A to 11D.

The first layer 804 is a layer which has a function of transporting holes to the second layer 803, and includes at least a first organic compound and a first inorganic compound showing an electron-accepting property to the first organic compound. What is important is that the first organic compound and the first inorganic compound are not only simply mixed, but the first inorganic compound shows an electron-accepting property to the first organic compound. This structure generates a lot of hole-carriers in the first organic compound, which originally has almost no inherent carriers, and thus, a highly excellent hole-injecting property and a highly excellent hole-transporting property can be obtained.

Therefore, as for the first layer 804, not only advantageous effect that is considered to be obtained by mixing an inorganic compound (such as improvement in a heat resistant property) but also excellent conductivity (in particular, a hole-injecting property and a hole-transporting property in the first layer 804) can be obtained. This excellent conductivity is advantageous effect that cannot be obtained in a conventional hole-transporting layer in which an organic compound and an inorganic compound, which do not electronically interact with each other, are simply mixed. This advantageous effect can make a drive voltage lower than conventional one. In addition, since the first layer 804 can be made thicker without causing increase in a drive voltage, short circuit of the element due to dust and the like can be suppressed.

It is preferable to use a hole-transporting organic compound as the first organic compound since hole-carriers are generated in the first organic compound as described above. Examples of the hole-transporting organic compound include, but are not limited to, phthalocyanine (abbreviated as $H_2Pc$), copper phthalocyanine (abbreviated as CuPc), vanadyl phthalocyanine (abbreviated as VOPc), 4,4',4"-tris(N,N-diphenylamino)triphenylamine (abbreviated as TDATA), 4,4',4"-tris[N-(3-methylphenyl)-N-phenylamino]triphenylamine (abbreviated as MTDATA), 1,3,5-tris[N,N-di(m-tolyl)amino]benzene (abbreviated as m-MTDAB), N,N'-diphenyl-N,N'-bis(3-methylphenyl)-1,1'-biphenyl-4,4'-diamine (abbreviated as TPD), 4,4'-bis[N-(1-naphthyl)-N-phenylamino]biphenyl (abbreviated as NPB), 4,4'-bis{N-[4-di(m-tolyl)amino]phenyl-N-phenylamino}biphenyl (abbreviated as DNTPD), 4,4',4"-tris(N-carbazolyl)triphenylamine (abbreviated as TCTA), and the like. In addition, among the compounds mentioned above, aromatic amine compounds as typified by TDATA, MTDATA, DAB, TPD, NPB, DNTPD, and TCTA can easily generate hole-carriers, and are a suitable group of compounds for the first organic compound.

On the other hand, the first inorganic compound may be any material as long as the material can easily accept electrons from the first organic compound, and various kinds of metal oxide and metal nitride can be used. An oxide of a transition metal that belongs to any of Groups 4 to 12 of the periodic table is preferable since such an oxide of a transition metal easily show an electron-accepting property. Specifically, titanium oxide, zirconium oxide, vanadium oxide, molybdenum oxide, tungsten oxide, rhenium oxide, ruthenium oxide, zinc oxide, and the like can be used. In addition, among the metal oxides mentioned above, many kinds of oxides of transition metals that belong to any of Groups 4 to 8 have a higher electron-accepting property, which are a preferable group of compounds. In particular, vanadium oxide, molybdenum oxide, tungsten oxide, and rhenium oxide are preferable since they can be formed by vacuum evaporation and can be easily handled.

It is to be noted that the first layer 804 may be formed by stacking a plurality of layers each including a combination of the organic compound and the inorganic compound as described above, or may further include another organic compound or another inorganic compound.

Next, the third layer 802 will be described. The third layer 802 is a layer which has a function of transporting electrons to the second layer 803, and includes at least a third organic compound and a third inorganic compound showing an electron-donating property to the third organic compound. What is important is that the third organic compound and the third inorganic compound are not only simply mixed but also the third inorganic compound shows an electron-donating property to the third organic compound. This structure generates a lot of electron-carriers in the third organic compound which has originally almost no inherent carriers, and a highly excellent electron-injecting property and a highly excellent electron-transporting property can be obtained.

Therefore, as for the third layer 802, not only an advantageous effect that is considered to be obtained by mixing an inorganic compound (such as improvement in a heat resistant property) but also excellent conductivity (in particular, an electron-injecting property and an electron-transporting property in the third layer 802) can also be obtained. This excellent conductivity is an advantageous effect that cannot be obtained in a conventional electron-transporting layer in which an organic compound and an inorganic compound, which do not electronically interact with each other, are simply mixed. This advantageous effect can make a drive voltage lower than the conventional one. In addition, since the third layer 802 can be made thick without causing increase in a drive voltage, short circuit of the element due to dust and the like can be suppressed.

It is preferable to use an electron-transporting organic compound as the third organic compound since electron-carriers are generated in the third organic compound as described above. Examples of the electron-transporting organic compound include, but are not limited to, tris(8-quinolinolato) aluminum (abbreviated as $Alq_3$), tris(4-methyl-8-quinolinolato)aluminum (abbreviated as $Almq_3$), bis(10-hydroxybenzo[h]-quinolinato)beryllium (abbreviated as $BeBq_2$), bis(2-methyl-8-quinolinolato)(4-phenylphenolato)aluminum (abbreviated as BAlq), bis[2-(2'-hydroxyphenyl)benzoxazolato]zinc (abbreviated as $Zn(BOX)_2$), bis [2-(2'-hydroxyphenyl)benzothiazolato]zinc (abbreviated as $Zn(BTZ)_2$), bathophenanthroline (abbreviated as BPhen), bathocuproin (abbreviated as BCP), 2-(4-biphenylyl)-5-(4-tert-butylphenyl)-1,3,4-oxadiazole (abbreviated as PBD), 1,3-bis[5-(4-tert-butylphenyl)-1,3,4-oxadiazol-2-yl]benzene (abbreviated as OXD-7), 2,2',2''-(1,3,5-benzenetriyl)-tris(1-phenyl-1H-benzimidazole) (abbreviated as TPBJ), 3-(4-biphenylyl)-4-phenyl-5-(4-tert-butylphenyl)-1,2,4-triazole (abbreviated as TAZ), 3-(4-biphenylyl)-4-(4-ethylphenyl)-5-(4-tert-butylphenyl)-1,2,4-triazole (abbreviated as p-EtTAZ), and the like. In addition, among the compounds mentioned above, chelate metal complexes having a chelate ligand including an aromatic ring as typified by $Alq_3$, $Almq_3$, $BeBq_2$, BAlq, $Zn(BOX)_2$, $Zn(BTZ)_2$, and the like; organic compounds having a phenanthroline skeleton as typified by BPhen, BCP and the like; and organic compounds having an oxadiazole skeleton as typified by PBD, OXD-7, and the like can easily generate electron-carriers, and are suitable groups of compounds for the third organic compound.

On the other hand, the third inorganic compound may be any material as long as the material can easily donate electrons to the third organic compound, and various kinds of metal oxide and metal nitride can be used. Alkali metal oxide, alkaline-earth metal oxide, rare-earth metal oxide, alkali metal nitride, alkaline-earth metal nitride, and rare-earth metal nitride are preferable since they easily show an electron-donating property. Specifically, lithium oxide, strontium oxide, barium oxide, erbium oxide, lithium nitride, magnesium nitride, calcium nitride, yttrium nitride, lanthanum nitride, and the like can be used. In particular, lithium oxide, barium oxide, lithium nitride, magnesium nitride, and calcium nitride are preferable since they can be formed by vacuum evaporation and can be easily handled.

It is to be noted that the third layer 802 may be formed by stacking a plurality of layers each including a combination of the organic compound and the inorganic compound as described above, or may further include another organic compound or another inorganic compound.

Next, the second layer 803 will be described. The second layer 803 is a layer which has a function of emitting light, and includes a second organic compound that has a light-emitting property. A second inorganic compound may also be included. The second layer 803 can be formed by using various light-emitting organic compounds and inorganic compounds. However, since it is believed to be hard to make a current flow through the second layer 803 as compared with the first layer 804 or the third layer 802, the thickness of the second layer 803 is preferably about 10 to 100 nm.

The second organic compound is not particularly limited as long as it is a light-emitting organic compound, and examples of the second organic compound include, for (abbreviated as DNA), example, 9,10-di(2-naphthyl)anthracene 9,10-di(2-naphthyl)-2-tent-butylanthracene (abbreviated as t-BuPNA), 4,4'-bis(2,2-diphenylvinyl)biphenyl (abbreviated as DPVBi), coumarin 30, coumarin 6, coumarin 545, coumarin 545T, perylene, rubrene, perfilanthene, 2,5,8,11-tetra(tert-butyl) perylene (abbreviated as TBP), 9,10-diphenyl anthracene abbreviated as DPA), 5,12-diphenyltetracene, 4-(dicyanomethylene)-2-methyl-6-[p-(dimethylamino)styryl]-4H-pyran (abbreviated as DCM1), 4-(dicyanomethylene)-2-methyl-6-[2-(julolidine-9-yl)ethenyl]-4H-pyran (abbreviated as DCM2), 4-(dicyanomethylene)-2,6-bis[p-(dimethylamino)styryl]-4H-pyran (abbreviated as BisDCM), and the like. In addition, it is also possible to use a compound capable of emitting phosphorescence such as bis[2-(4',6'-difluorophenyl)pyridinato-$N,C^{2'}$]iridium(picolinate) (abbreviation: FIrpic), bis{2-[3',5'-bis(trifluoromethyl)phenyl]pyridinato-$N,C^{2'}$}iridium(picolinate) (abbreviation: $Ir(CF_3ppy)_2(pic)$), tris(2-phenylpyridinato-$N,C^{2'}$)iridium (abbreviated as $Ir(ppy)_3$), bis(2-phenylpyridinato-$N,C^{2'}$)iridium(acetylacetonate) (abbreviated as $Ir(ppy)_2(acac)$), bis[2-(2'-thienyl)pyridinato-$N,C^{3'}$]iridium(acetylacetonate) (abbreviated as $Ir(thp)_2(acac)$), bis(2-phenylquinolinato-$N,C^{2'}$)iridium (acetylacetonate) (abbreviated as $Ir(pq)_2(acac)$), or bis[2-(2'-benzothienyl)pyridinato-$N,C^{3'}$]iridium(acetylacetonate) (abbreviated Ir(btp)2(acac)).

Further, a triplet excitation light-emitting material containing a metal complex or the like may be used for the second layer 803 in addition to a singlet excitation light-emitting material. For example, among pixels emitting red, green, and blue light, a pixel emitting red light whose luminance is reduced by half in a relatively short time is formed by using a triplet excitation light-emitting material and the other pixels are formed by using a singlet excitation light-emitting material. A triplet excitation light-emitting material has a feature of favorable light-emitting efficiency and less power consumption to obtain the same luminance. In other words, when a triplet excitation light-emitting material is used for a red pixel, only a small amount of current needs to be applied to a light-emitting element, and thus, reliability can be improved. A pixel emitting red light and a pixel emitting green light may be formed by using a triplet excitation light-emitting material and a pixel emitting blue light may be formed by using a singlet excitation light-emitting material to achieve lower power consumption as well. Low power consumption can be further achieved by forming a light-emitting element emitting green light that is highly visible to human eyes by using a triplet excitation light-emitting material.

The second layer 803 may include not only the second organic compound as described above, which produces light-emission, but also another organic compound. Examples of organic compounds that can be added include, but are not limited to, TDATA, MTDATA, m-MTDAB, TPD, NPB, DNTPD, TCTA, $Alg_a$, $Almq_3$, $BeBq_2$, BAlq, $Zn(BOX)_2$, $Zn(BTZ)_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviated as CBP), 1,3,5-tris[4-(N-carbazolyl)phenyl]benzene (abbreviated as TCPB), and the like. It is preferable that the organic compound, which is added in addition to the second organic compound, have higher excitation energy than that of the second organic compound and be added in larger amounts than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure to perform color display by providing each pixel with a light-emitting layer having a different emission wavelength range. Typically, a light-emitting layer corresponding to each color of R (red), G (green), and B (blue) is formed. Also in this case, color purity can be improved and a pixel portion can be prevented from having a mirror surface (reflection) by providing the light-emission side of the pixel with a filter which transmits light of an emission wavelength range of the light. By providing the filter, a circularly polarizing plate or the like that has been conventionally required can be omitted, and further, the loss of light emitted from the light-emitting layer can be eliminated. Moreover, change in a color tone, which occurs when a pixel portion.(display screen) is obliquely seen, can be reduced.

Either a high-molecular organic light-emitting material or a low-molecular organic light-emitting material can be used for a material of the second layer 803. A high-molecular organic light-emitting material is physically stronger than a low-molecular material and is superior i durability of the element. In addition, a high-molecular organic light-emitting material can be formed by coating; therefore, the element can be relatively easily manufactured.

The emission color is determined depending on a material forming the light-emitting layer; therefore, a light-emitting element which exhibits desired light-emission can be formed by selecting an appropriate material for the light-emitting layer. As a high-molecular electroluminescent material which can be used for forming the light-emitting layer, a polyparaphenylenevinylene-based material, a polyparaphenylene-based material, a polythiophene-based material, or a polyfluorene-based material can be used.

As the polyparaphenylenevinylene-based material, a derivative of poly(paraphenylenevinylene) [PPV] such as poly(2,5-dialkoxy-1,4-phenylenevinylene) [RO-PPV]; poly (2-(2'-ethyl-hexoxy)-5-methoxy-1,4-phenylenevinylene) [MEH-PPV]; or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP]; or poly(2,5-dihexoxy-1,4-phenylene) can be given. As the polythiophene-based material, a derivative of polythiophene [PT] such as poly(3-alkylthiophene) [PAT]; poly(3-hexylthiophen) [PHT]; poly(3-cyclohexylthiophen) [PCHT]; poly (3-cyclohexyl-4-methylthiophene) [PCHMT]; poly(3,4-dicyclohexylthiophene) [PDCHT]; poly[3-(4-octylphenyl)-thiophene] [POPT]; or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light-emission of the second organic compound is not easily quenched by the inorganic compound, and various kinds of metal oxide and metal nitride can be used. In particular, an oxide of a metal that belongs to Group 13 or 14 of the periodic table is preferable since light-emission of the second organic compound is not easily quenched by such an oxide, and specifically, aluminum oxide, gallium oxide, silicon oxide, and germanium oxide are preferable. However, the second inorganic compound is not limited thereto.

It is to be noted that the second layer 803 may be formed by stacking a plurality of layers each including a combination of the organic compound and the inorganic compound as described above, or may further include another organic compound or another inorganic compound. A layer structure of the light-emitting layer can be changed, and an electrode layer for injecting electrons may be provided or a light-emitting material may be dispersed, instead of providing no specific electron-injecting region or light-emitting region. Such a change can be permitted unless it departs from the spirit of the present invention.

A light-emitting element formed by using the above described materials emits light by being forwardly biased. A pixel of a display device which is formed by using a light-emitting element can be driven by a simple matrix (passive matrix) mode or an active matrix mode. In any case, each pixel emits light by applying a forward bias thereto at a specific timing; however, the pixel is in a non-emitting state for a certain period. Reliability of a light-emitting element can be improved by applying a reverse bias thereto in the non-emitting time. In a light-emitting element, there is a deterioration mode in which emission intensity is decreased under constant driving conditions or a deterioration mode in which a non-light-emitting region is enlarged in the pixel and luminance is apparently decreased. However, progression of deterioration can be slowed down by alternating current driving where bias is applied forwardly and reversely, and thus, reliability of a light-emitting display device can be improved. Additionally, either digital driving or analog driving can be applied.

A color filter (colored layer) may be formed on a sealing substrate. The color filter (colored layer) can be formed by an evaporation method or a droplet-discharge method. With the use of the color filter (colored layer), high-definition display can be performed. This is because a broad peak can be corrected to be sharp in an emission spectrum of each of R, Q and B by the color filter (colored layer).

Full color display can be performed by forming a material emitting light of a single color and combining it with a color filter or a color conversion layer. The color filter (colored layer) or the color conversion layer may be formed over, for example, a second substrate (a sealing substrate) and may be attached to a substrate.

Naturally, display of a single color emission may also be performed. For example, an area color type display device may be manufactured by using single color emission. The area color type is suitable for a passive matrix display portion, and can mainly display characters and symbols.

Materials of the first electrode layer 870 and the second electrode layer 850 are required to be selected considering the work function. The first electrode layer 870 and the second electrode layer 850 can be either an anode or a cathode depending on the pixel structure. In a case where polarity of a driving thin film transistor is a p-channel type, the first electrode layer 870 may serve as an anode and the second electrode layer 850 may serve as a cathode as shown in FIG. 1A. In a case where polarity of the driving thin film transistor is an n-channel type, the first electrode layer 870 may serve as a cathode and the second electrode layer 850 may serve as an anode as shown in FIG. 11B. Materials that can be used for the first electrode layer 870 and the second electrode layer 850 will be described. It is preferable to use a material having a higher work function (specifically, a material having a work function of 4.5 eV or higher) for one of the first electrode layer 870 and the second electrode layer 850, which serve as an anode, and a material having a lower work function (specifically, a material having a work function of 3.3 eV or lower) for the other electrode layer which serves as a cathode. However, since the first layer 804 is superior in a hole-injecting property and a hole-transporting property and the third layer 802 is superior in an electron-injecting property and an electron transporting property, both of the first electrode layer 870 and the second electrode layer 850 are scarcely restricted by a work function, and various materials can be used.

The light-emitting elements shown in FIGS. 11A and 11B have a structure in which light is extracted through the first electrode layer 870, and thus, the second electrode layer 850 is not always required to have a light-transmitting property. The second electrode layer 850 may be formed of a film mainly including an element selected from Ti, TiN, TiSi$_x$N$_y$, Ni, W, WSi$_x$, WN$_x$, WSi$_x$N$_y$, NbN, Cr, Pt, Zn, Sn, In, Ta, Al, Cu, Au, Ag, Mg, Ca, Li or Mo, or an alloy material or a compound material containing the element as its main component, or a stacked film thereof in a total thickness range of 100 to 800 nm.

The second electrode layer 850 can be formed by an evaporation method, a sputtering method, a CVD method, a printing method, a droplet-discharge method, or the like.

In addition, when the second electrode layer 850 is formed by using a light-transmitting conductive material, like the material used for the first electrode layer 870, light is also extracted from the second electrode layer 850, and a dual emission mode can be obtained, in which light emitted from the light-emitting element is emitted from both of the first electrode layer 870 side and the second electrode layer 850 side.

It is to be noted that the light-emitting element according to the present invention has many variations by changing types of the first electrode layer 870 and the second electrode layer 850.

FIG. 11B shows a case where the third layer 802, the second layer 803, and the first layer 804 are provided in this order from the first electrode layer 870 side in the electroluminescent layer 860.

As described above, in the light-emitting element of the present invention, layers interposed between the first electrode layer 870 and the second electrode layer 850 are formed from the electroluminescent layer 860 including a layer in which an organic compound and an inorganic compound are combined. The light-emitting element is an organic-inorganic composite light-emitting element provided with layers (that is, the first layer 804 and the third layer 802) that provide functions called a high carrier-injecting property and carrier-transporting property by mixing an organic compound and an inorganic compound, where the functions are not obtainable from only either one of the organic compound or the inorganic compound. Further, the first layer 804 and the third layer 802 are required to be layers in which an organic compound and an inorganic compound are combined, particularly when provided on the first electrode layer 870 side, and may contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method of evaporating both an organic compound and an inorganic compound by resistance heating. In addition, for co-evaporation, an inorganic compound may be evaporated by an electron beam (EB) while evaporating an organic compound by resistance heating. Further, the methods also include a method of sputtering an inorganic compound while evaporating an organic compound by resistance heating to deposit the both at the same time. In addition, the electroluminescent layer may also be formed by a wet process.

Similarly, for the first electrode layer 870 and the second electrode layer 850, evaporation by resistance heating, EB evaporation, sputtering, a wet process, and the like can be used.

In FIG. 11C, an electrode layer having reflectivity is used for the first electrode layer 870, and an electrode layer having a light-transmitting property is used for the second electrode layer 850 in the structure of FIG. 11A. Light emitted from the light-emitting element is reflected by the first electrode layer 870, then, transmitted through the second electrode layer 850, and is emitted to outside. Similarly, in FIG. 11D, an electrode layer having reflectivity is used for the first electrode layer 870, and an electrode layer having a light-transmitting property is used for the second electrode layer 850 in the structure of FIG. 11B. Light emitted from the light-emitting element is reflected by the first electrode layer 870, then, transmitted through the second electrode layer 850, and is emitted to outside. This embodiment mode can be freely combined with Embodiment Modes 1 to 6

Embodiment Mode 7

Next, a mode of mounting a driver circuit for driving on a display panel manufactured in accordance with Embodiment Modes 3 to 5 will be described.

First, a display device employing a COG method is explained with reference to FIG. 28A. A pixel portion 2701 for displaying information of characters, images, or the like is provided over a substrate 2700. A substrate provided with a plurality of driver circuits is divided into rectangles, and a driver circuit 2751 after division (also referred to as a driver IC) is mounted on the substrate 2700. FIG. 28A shows a mode of mounting a plurality of driver ICs 2751 and FPCs 2750 mounted on the end of the driver ICs 2751. In addition, the size obtained after division may be made almost equal to the length of a side of the pixel portion on a signal line side, and a tape may be mounted on the end of the single driver IC.

Alternatively, a TAB method may be employed. In that case, a plurality of tapes may be attached and driver ICs may be mounted on the tapes as shown in FIG. 28B. Similarly to the case of a COG method, a single driver IC may be mounted on a single tape. In this case, a metal piece or the like for fixing the driver IC may be attached together in terms of intensity.

A plurality of driver ICs to be mounted on a display panel are preferably formed over a rectangular substrate having a side of 300 mm to 1000 mm, or a side longer than 1000 mm for the sake of improvement in productivity.

In other words, a plurality of circuit patterns each including a driver circuit portion and an input-output terminal as a unit may be formed over the substrate and may be lastly divided to be used. In consideration of the side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel portion, or a length obtaining by adding a side length of the pixel portion to a side length of each driver circuit.

An advantage of the external dimension of the driver IC over an IC chip is the length of the long side. When the driver IC having a long side length of 15 mm to 80 mm is used, the number of the driver ICs necessary for being mounted in accordance with the pixel portion is less than that in the case of using an IC chip. Therefore, yield in manufacturing can be improved. When a driver IC is formed over a glass substrate, productivity is not decreased since there is no limitation on the shape of a substrate used as a mother body. This is a great advantage compared with the case of taking IC chips out of a circular silicon wafer.

When a scanning line driver circuit 3702 is integrated with a substrate as shown in FIG. 27B, a driver IC provided with a signal line driver circuit is mounted on a region outside a pixel portion 3701. The driver IC is a signal line driver circuit. In order to form a pixel portion corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitches of output terminals of the driver ICs.

The driver IC is preferably formed of a crystalline semiconductor formed over a substrate. The crystalline semiconductor is preferably formed by being irradiated with continuous wave laser light. Therefore, a continuous wave solid-state or gas laser is used for an oscillator for generating the laser light. There are almost no crystal defects when a continuous wave laser is used, and as a result, a transistor can be manufactured by using a polycrystalline semiconductor layer having a large grain size. In addition, high-speed driving is possible since mobility or response speed is high, and it is possible to further improve an operating frequency of an element than that of the conventional element. Therefore, high reliability can be obtained since variation in characteristics is little. Note that the channel-length direction of the transistor and a moving direction of laser light may be arranged in the same direction to further improve the operating frequency. This is because the highest mobility can be obtained when a channel length direction of a transistor and a moving direction of laser light over a substrate are almost parallel to each other (preferably, −30° to 30°) in a step of laser crystallization with a continuous wave laser. Note that the channel length direction corresponds to a current flowing direction, in other words, a direction in which an electric charge moves in a channel formation region. The thus manufactured transistor has an active layer including a polycrystalline semiconductor layer in which a crystal grain is extended in the channel direction, and this means that a crystal grain boundary is formed almost along the channel direction.

In order to perform laser crystallization, it is preferable to significantly narrow down the laser light, and the shape of the laser light (beam spot) preferably has the same width as that of a short side of the driver ICs, approximately 1 mm to 3 mm. In addition, in order to secure an enough and effective energy density for an object to be irradiated, an region irradiated with the laser light preferably has a linear shape. The term "linear" used herein refers to not a line in a strict sense but a rectangle or an oblong with a large aspect ratio. For example, the linear shape refers to a shape with an aspect ratio of 2 or more (preferably 10 to 10000). Thus, by making a width of the laser light shape (beam spot) the same length as a short side of the driver ICs, a method for manufacturing a display device, of which productivity is improved, can be provided.

As shown in FIGS. 28A and 28B, driver ICs may be mounted as both the scanning line driver circuit and the signal line driver circuit. In this case, it is preferable to use the driver ICs having different specifications for the scanning line driver circuit and the signal line driver circuit.

In the pixel portion, the signal line and the scanning line intersect to form a matrix, and transistors are arranged corresponding to each intersection. One feature of the present invention is that a having an amorphous semiconductor or a semiamorphous semiconductor as a channel portion is used as the transistor arranged in the pixel portion. The amorphous semiconductor is formed by a method such as a plasma CVD method or a sputtering method. The semiamorphous semiconductor can be formed by a plasma CVD method at a temperature of 300° C. or less. A film thickness necessary to form the transistor is formed in a short time even in the case of using, for example, a non-alkaline glass substrate having an external size of 550 mm×650 mm. The feature of such a manufacturing technique is effective for manufacturing a large-sized display device. In addition, a semiamorphous TFT can obtain field effect mobility of 2 $cm^2$/V·sec to 10 $cm^2$/V·sec by forming a channel formation region using a SAS. When the present invention is applied, a minute wire can be stably formed without a defect such as a short circuit since a pattern can be formed into a desired shape with high controllability. Accordingly, a TFT having electric characteristics required to operate pixels sufficiently can be formed. Therefore, this TFT can be used as a switching element of the pixel or as an element included in the scanning line driver circuit. Thus, a display panel in which system-on-panel is realized can be manufactured.

The scanning line driver circuit can also be formed over the substrate by using a TFT having a semiconductor layer formed of a SAS. In the case of using a TFT having a semiconductor layer formed of an AS, the driver ICs may be mounted as both the scanning line driver circuit and the signal line driver circuit.

In that case, it is preferable to use the driver ICs having different specifications for the scanning line driver circuit and the signal line driver circuit. For example, a transistor included in the scanning line driver IC is required to withstand a voltage of approximately 30 V; however, a drive frequency thereof is 100 kHz or less, and high-speed operation is not relatively required. Therefore, it is preferable to set a channel length (L) of the transistor included in the scanning line driver sufficiently long. On the other hand, a transistor of the signal line driver IC is required to withstand a voltage of only approximately 12 V; however, a drive frequency thereof is around 65 MHz at 3 V, and high-speed operation is required. Therefore, it is preferable to set a channel length or the like of the transistor included in a driver on a micron rule. By using the present invention, a minute pattern can be formed with high controllability. Therefore, the present invention can handle such a micron rule sufficiently.

A method for mounting the driver IC is not particularly limited, and a COG method, a wire bonding method, or a TAB method can be employed.

When the thicknesses of the driver IC and the opposite substrate are set equal to each other, a distance therebetween is almost constant, which contributes to thinning of a display device as a whole. When both substrates are formed of the same material, thermal stress is not generated and characteristics of a circuit formed of a TFT are not damaged even when a temperature change is caused in the display device. Furthermore, the number of the driver ICs to be mounted on one pixel portion can be reduced by mounting longer driver ICs than IC chips as driver circuits as described in this embodiment mode.

In this manner, a driver circuit can be incorporated in a display panel.

Embodiment Mode 8

An example of a protective circuit included in a display device of the present invention will be described.

As shown in FIGS. 31A to 31E, a protective circuit 2713 can be formed between an external circuit and an internal circuit. The protective circuit includes one or more elements selected from a TFT, a diode, a resistor element, a capacitor element, or the like. Explained below are several structures of the protective circuit and the operation thereof. First, the structures of an equivalent circuit of a protective circuit which is disposed between the external circuit and the internal circuit and which corresponds to one input terminal are explained with reference to FIGS. 31A to 31E. The protective circuit shown in FIG. 31A includes p-channel thin film transistors 7220 and 7230, capacitor elements 7210 and 7240, and a resistor element 7250. The resistor element 7250 has two terminals; one of which is supplied with an input voltage Vin (hereinafter referred to as Vin), and the other of which is supplied with a low-electric potential voltage VSS (hereinafter referred to as VSS).

Figure 31A:
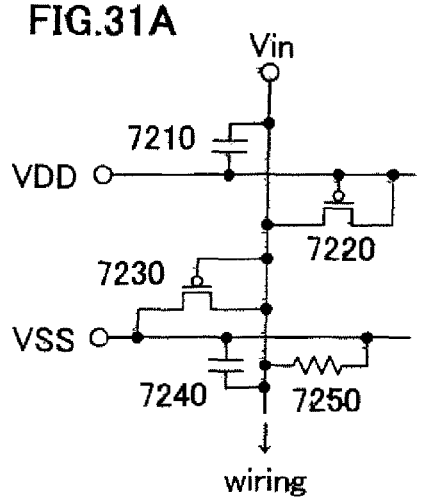
FIGS. 31A to 31E are diagrams showing protective circuits to which the present invention is applied.
Figure 31D:
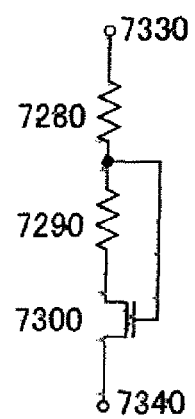
Figure 31B:
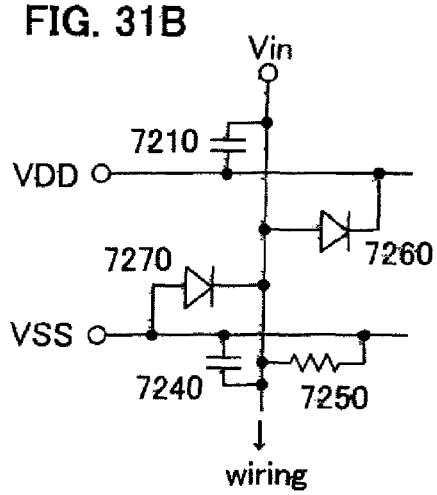
Figure 31E:
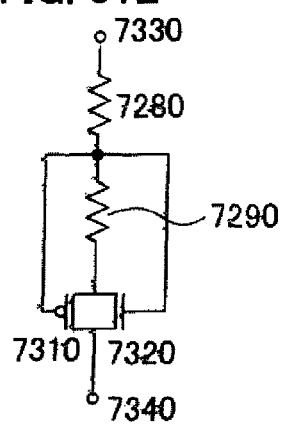
Figure 31C:
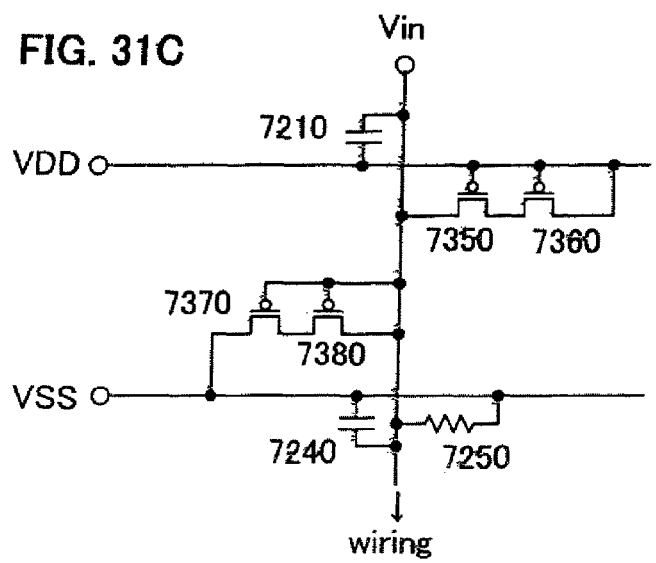

FIG. 31B is an equivalent circuit diagram showing a protective circuit in which the p-channel thin film transistors 7220 and 7230 are substituted by rectifying diodes 7260 and 7270. FIG. 31C is an equivalent circuit diagram showing a protective circuit in which the p-channel thin film transistors 7220 and 7230 are substituted by TFTs 7350, 7360, 7370, and 7380. In addition, as a protective circuit having a different structure from the above structures, FIG. 31D shows a protective circuit which includes resistors 7280 and 7290 and an n-channel thin film transistor 7300. A protective circuit shown in FIG. 31E includes resistors 7280 and 7290, a p-channel thin film transistor 7310, and an n-channel thin film transistor 7320. By providing the protective circuit, a sudden surge in electric potential can be prevented, and element breakdown or damage can be prevented, which improves reliability. Note that an element having the aforementioned protective circuit is preferably formed using an amorphous semiconductor that can withstand high voltage. This embodiment mode can be freely combined with the aforementioned embodiment mode.

This embodiment mode can be freely combined with Embodiment Modes 1 to 7.

Embodiment Mode 9

A structure of a pixel of a display panel shown in this embodiment mode will be explained with reference to equivalent circuit diagrams shown in FIGS. 10A to 10F. This embodiment mode describes an example in which a light-emitting element (EL element) is used as a display element of the pixel.

Figure 10A:
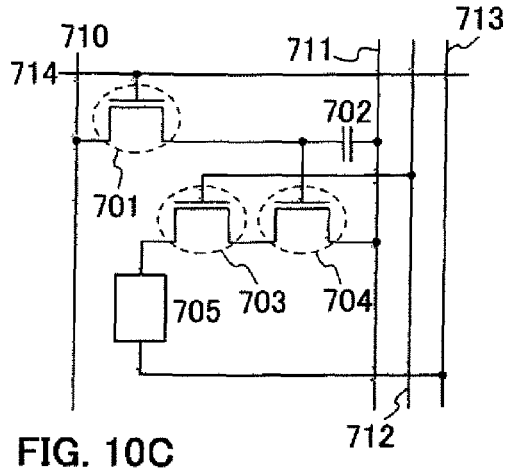
FIGS. 10A to 10F are circuit diagrams explaining structures of pixels applicable to an EL display panel of the present invention.

In a pixel shown in FIG. 10A, a signal line 710 and power supply lines 711, 712, and 713 are arranged in a column direction, and a scanning line 714 is arranged in a row direction. The pixel also includes a TFT 701 as a switching TFT, a TFT 703 as a driver TFT, a TFT 704 as a current control TFT, a capacitor element 702, and a light-emitting element 705.

Figure 10B:
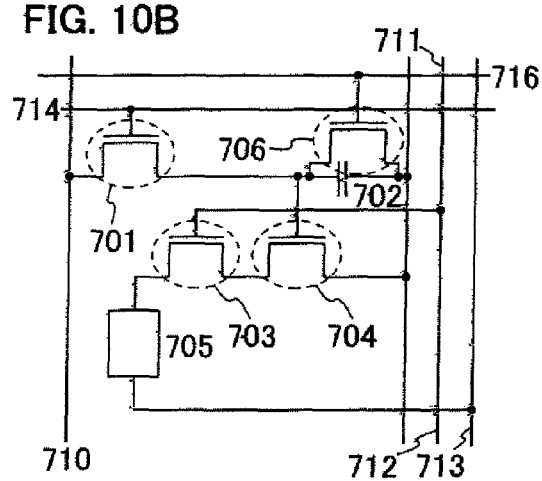
Figure 10C:
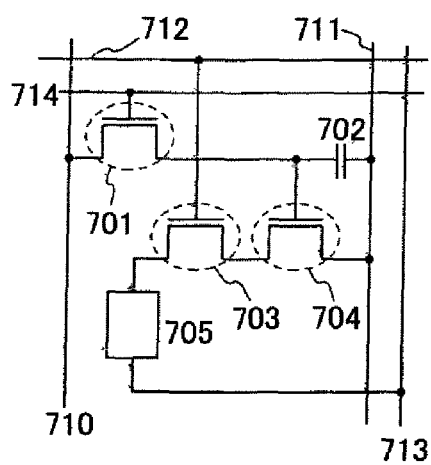
Figure 10D:
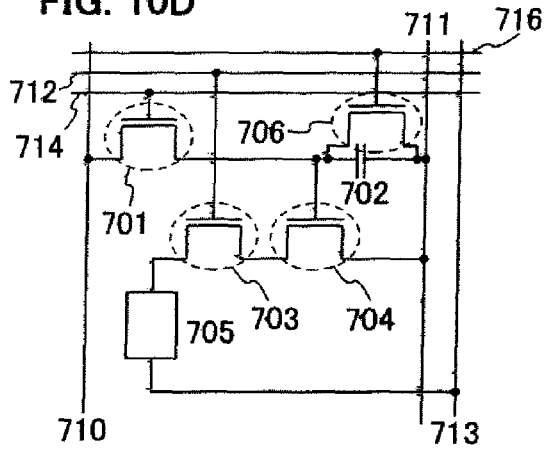

A pixel shown in FIG. 10C has the same structure as that shown in FIG. 10A, except that a gate electrode of the TFT 703 is connected to the power supply line 712 arranged in a row direction. In other words, both pixels shown in FIGS. 10A and 10C show the same equivalent circuit diagrams. However, power supply lines are formed of conductive layers in different levels between the cases where the power supply line 712 is arranged in a column direction (FIG. 10A) and where the power supply line 712 is arranged in a row direction (FIG. 10C). Here, a wire to which the gate electrode of the TFT 703 is connected is focused and the figures are separately shown in FIG. 10A and 10C to show that the wires are formed in different layers.

In the pixels shown in FIGS. 10A and 10C, the TFTs 703 and 704 are connected to each other in series, and a channel length $L_3$ and a channel width $W_3$ of the TFT 703 and a channel length $L_4$ and a channel width $W_4$ of the TFT 704 are preferably set to satisfy $L_3/W_3: L_4/W_4 = 5$ to $6000:1$ For example, when $L_3$, $W_3$, $L_4$, and $W_4$ are respectively 500 µm, 3 µm, 3 µm, and 100 µm. Further, a miniaturizing process can be conducted by applying the present invention, thus, such a minute wire having a short channel width can be formed stably without causing defects such a short circuit. Therefore, a TFT having electric characteristics enough to operate the pixels as shown in FIGS. 10A and 10C can be formed, and thus a highly reliable display panel having an excellent display ability can be manufactured.

Note that the TFT 703 is operated in a saturation region and functions to control the amount of current flowing into the light-emitting element 705, whereas the TFT 704 is operated in a linear region and functions to control current supply to the light-emitting element 705. The TFTs 703 and 704 preferably have the same conductivity in view of the manufacturing step. For the TFT 703, a depletion mode TFT as well as an enhancement mode TFT may be used. In the present invention having the above structure, slight variations in $V_{GS}$ of the TFT 704 does not affect the amount of current flowing into the light-emitting element 705, since the TFT 704 is operated in a linear region. In other words, the amount of current flowing into the light-emitting element 705 is determined by the TFT 703 operated in the saturation region. The present invention having the above structure can provide a display device in which image quality is improved by suppressing variations in luminance of the light-emitting element due to the variation in the TFT characteristics.

The TFT 701 of each of pixels shown in FIGS. 10A to 10D controls a video signal input to the pixel. When the TFT 701 is turned on and a video signal is input to the pixel, the video signal is held by the capacitor element 702. Although FIGS. 10A and 10C show structures provided with the capacitor element 702, the present invention is not limited thereto. When a gate capacitance or the like can serve as a capacitor holding a video signal, the capacitor element 702 is not provided explicitly.

The light-emitting element 705 has a structure in which an electroluminescent layer is interposed between a pair of electrodes. A pixel electrode and an opposite electrode (an anode and a cathode) have a electric potential difference therebetween so that a forward bias voltage is applied. The electroluminescent layer is formed of a wide range of materials such as an organic material and an inorganic material. The luminescence in the electroluminescent layer includes light emission that is generated in returning from a singlet excited state to a ground state (fluorescence) and light emission that is generated in returning from a triplet exited state to a ground state (phosphorescence).

A pixel shown in FIG. 10B has the same structure as that shown in FIG. 10A, except that a TFT 706 and a scanning line 716 are added. Similarly, a pixel shown in FIG. 10D has the same structure as that shown in FIG. 10C, except that a TFT 706 and a scanning line 716 are added.

The TFT 706 is controlled to be turned on or off by the newly arranged scanning line 716. When the TFT 706 is turned on, electric charges held at the capacitor element 702 are discharged, thereby turning off the TFT 704. In other words, supply of a current to the light-emitting element 705 can be forcibly stopped by providing the TFT 706. Therefore, by employing the structures shown in FIGS. 10B and 10D, a lighting period can start simultaneously with or shortly after a start of a writing period without waiting until signals are written into all the pixels; thus, a duty ratio can be improved.

Figure 10E:
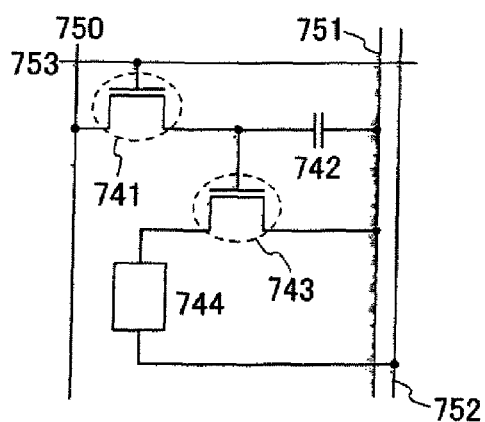
Figure 10F:
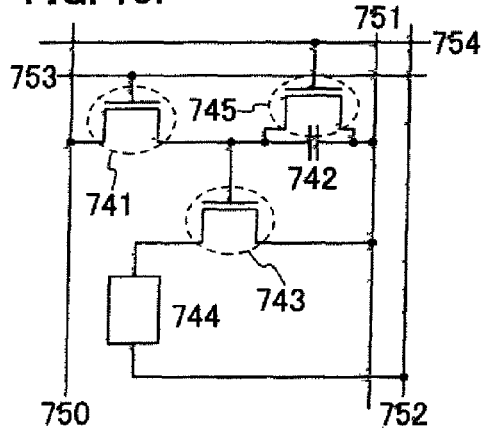

In a pixel shown in FIG. 10E, a signal line 750 and power supply lines 751 and 752 are arranged in a column direction, and a scanning line 753 is arranged in a row direction. The pixel further includes a TFT 741 as a switching TFT, a TFT 743 as a driver TFT, a capacitor element 742, and a light-emitting element 744. A pixel shown in FIG. 10F has the same structure as that shown in FIG. 10E, except that a TFT 745 and a scanning line 754 are added. The structure of FIG. 10F can also improve a duty ratio by providing the TFT 745.

As described above, in accordance with the present invention, a wire can be precisely and stably formed without a formation defect. Therefore, a TFT can be provided with high electric characteristics and reliability, and the present invention can be satisfactorily used for an applied technique for improving display capability of a pixel in accordance with the intended use.

This embodiment mode can be freely combined with Embodiment Modes 1 to 3 and 6 to 8.

Embodiment Mode 10

Figure 22:
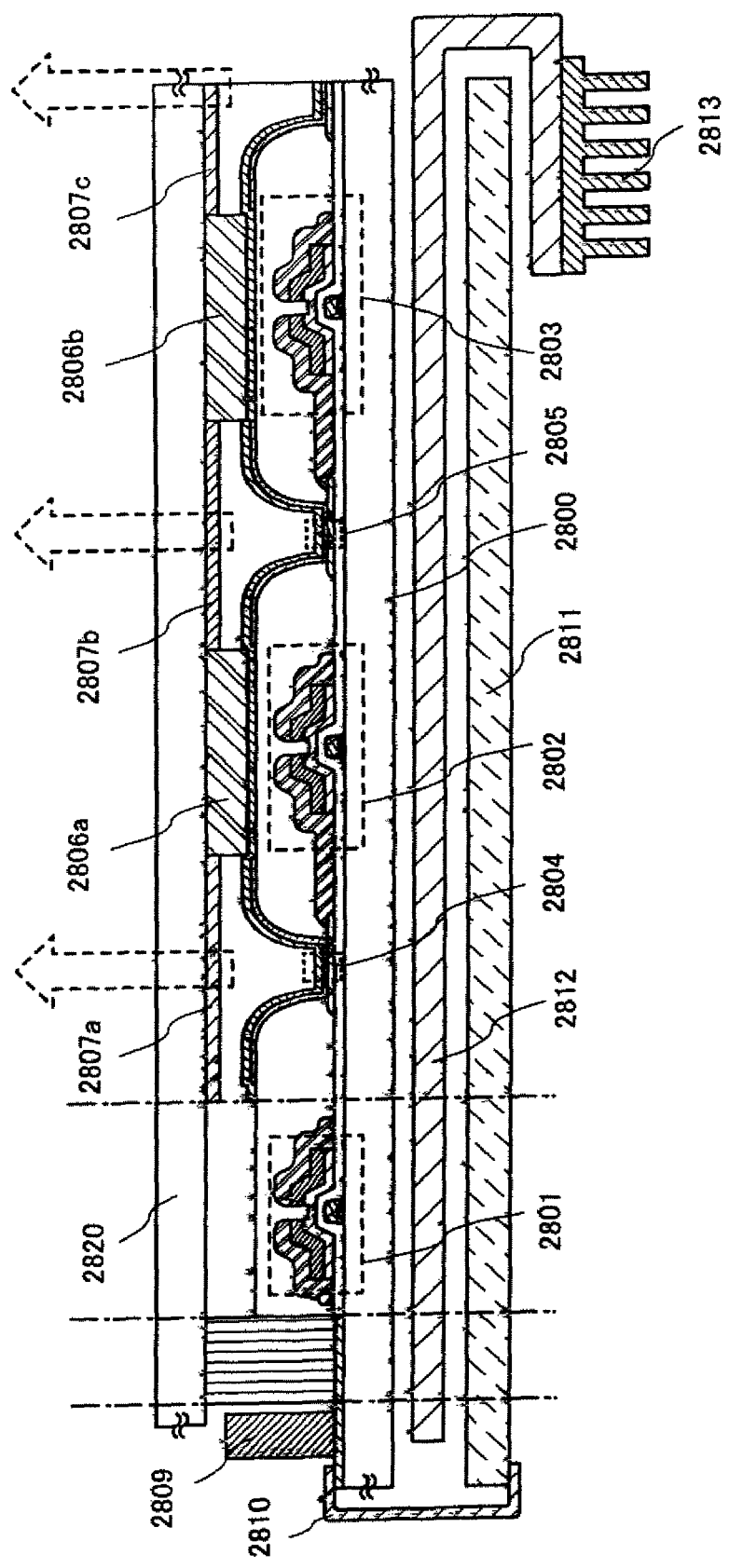
FIG. 22 is a cross-sectional view explaining a structure example of an EL display module of the present invention.

This embodiment mode will be explained with reference to FIG. 22. FIG. 22 shows an example of forming an EL display module using a TFT substrate 2800 manufactured in accordance with the present invention. In FIG. 22, a pixel portion including pixels is formed over the TFT substrate 2800.

In FIG. 22, a TFT which has the same structure as that formed in the pixel, or a protective circuit portion 2801 operated in the same manner as a diode by connecting a gate to either a source or a drain of the TFT is provided between a driver circuit and the pixel and outside the pixel portion. A driver IC formed of a single crystalline semiconductor, a stick driver IC formed of a polycrystalline semiconductor film over a glass substrate, a driver circuit formed of a SAS, or the like is applied to a driver circuit 2809.

The TFT substrate 2800 is fixed to a sealing substrate 2820 with spacers 2806a and 2806b formed by a droplet discharge method interposed therebetween. The spacers are preferably provided to keep a distance between two substrates constant even when the substrate is thin or an area of the pixel portion is enlarged. A space between the TFT substrate 2800 and the sealing substrate 2820 over light-emitting elements 2804 and 2805 connected to TFTs 2802 and 2803, respectively, may be filled with a resin material which transmits at least light in the visible region and the resin material may be solidified. Alternatively, the space may be filled with anhydrous nitrogen or an inert gas.

FIG. 22 shows a case where the light-emitting elements 2804 and 2805 and 2815 have a structure of top emission mode, which emit light in the direction of arrows shown in the drawing. Multicolor display can be performed by making the pixels to emit light of different colors of red, green, and blue. At this time, color purity of light emitted outside can be improved by forming colored layers 2807a to 2807c corresponding to respective colors on the sealing substrate 2820 side. Moreover, pixels which emit white light may be used and may be combined with the colored layers 2807a to 2807c.

The driver circuit 2809 which is an external circuit is connected to a scanning line or a signal line connection terminal which is provided at one end of the TFT substrate 2800 with a wire board 2810. In addition, a heat pipe 2813 and a heat sink 2812 may be provided in contact with or adjacent to the substrate 2800 to increase a heat radiation effect.

Note that FIG. 22 shows the top emission EL module; however, a bottom emission mode may be employed by changing the structure of the light-emitting element or the disposition of the external circuit board. Naturally, a dual emission mode in which light is emitted from both sides of the top and bottom surfaces may be used. In the case of the top emission mode, the insulating layer serving as a partition wall may be colored and used as a black matrix. This partition wall can be formed by a droplet discharge method and it may be formed by mixing a black resin of a pigment material, carbon black, or the like into a resin material such as polyimide. A stacked layer thereof may also be used.

In addition, reflected light of light entering from outside may be blocked by using a retardation film or a polarizing plate in the EL display module. In the case of a top emission display device, an insulating layer serving as a partition wall may be colored and used as a black matrix. This partition wall can be formed by a droplet discharge method or the like. Carbon black or the like may be mixed into a black resin of a pigment material or a resin material such as polyimide, and a stacked layer thereof may also be used. By a droplet discharge method, different materials may be discharged to the same region plural times to form the partition wall. A quarter wave plate and a half wave plate may be used as the retardation films and may be designed to be able to control light. As the structure, the light-emitting element, the sealing substrate (sealant), the retardation films (quarter wave plate and half wave plate), and the polarizing plate are sequentially formed over a TFT element substrate, and light emitted from the light-emitting element is transmitted therethrough and emitted outside from the polarizing plate side. The retardation films or polarizing plate may be provided on a side through which light passes or may be provided on both sides in the case of a dual emission display device in which light is emitted from the both surfaces. In addition, an anti-reflection film may be provided on the outer side of the polarizing plate. Accordingly, a higher-definition and more accurate image can be displayed.

As for the TFT substrate 2800, a sealing structure may be formed by attaching a resin film to the side where the pixel portion is formed, with the use of a sealant or an adhesive resin. In this embodiment mode, glass sealing using a glass substrate is described; however, various sealing methods such as resin sealing using a resin, plastic sealing using plastic, and film sealing using a film can be adopted. A gas barrier film which prevents moisture from penetrating the resin film is preferably provided over the surface of the resin film. By employing a film sealing structure, further reduction in thickness and weight can be achieved.

In this embodiment mode, a manufacturing process can be simplified as described above. By forming various components (parts) directly over a substrate using a droplet discharge method, a display panel can be easily manufactured even when using a glass substrate of the fifth generation or later having a side of 1000 mm or more.

In accordance with the present invention, a conductive layer included in a display device (a gate electrode layer of a TFT in FIG. 22) can be manufactured in a simplified manufacturing process. Thus, cost reduction can be achieved. In addition, a plating method is used; therefore, the thickness or size of a wire layer can be controlled relatively easily, and a wire layer suitable for an intended purpose can be manufactured. Therefore, a high-performance and high-reliability display device which can operate at high speed can be manufactured.

This embodiment mode can be freely combined with Embodiment Modes 1 to 3 and 6 to 9.

Embodiment Mode 11

This embodiment mode is explained with reference to FIGS. 23A and 23B. FIGS. 23A and 23B show examples of forming a liquid crystal display module by using a TFT substrate 2600 manufactured in accordance with the present invention.

FIG. 23A shows an example of a liquid crystal display module, in which the TFT substrate 2600 and an opposite substrate 2601 are fixed to each other with a sealant 2602, and a pixel portion 2603 and a liquid crystal layer 2604 are provided between the substrates to form a display region. A colored layer 2605 is necessary to perform color display. In the case of the RGB system, colored layers corresponding to respective colors of red, green, and blue are provided for respective pixels. The outer sides of the TFT substrate 2600 and the opposite substrate 2601 are provided with polarizing plates 2606 and 2607, and a lens film 2613. A light source includes a cold-cathode tube 2610 and a reflecting plate 2611. A circuit substrate 2612 is connected to the TFT substrate 2600 by a flexible wiring board 2609. External circuits such as a control circuit and a power supply circuit are incorporated in the circuit substrate 2612. The liquid crystal display module can employ a TN (Twisted Nematic) mode, an IPS (In-Plane-Switching) mode, an MVA (Multi-domain Vertical Alignment) mode, an ASM (Axially Symmetric aligned Micro-cell) mode, an OCB mode, or the like.

Performance of the display device manufactured in accordance with the present invention can be improved by using the OCB mode that can respond at high speed. FIG. 23B shows an example of applying the OCB mode to the liquid crystal display module of FIG. 23A, so that this liquid crystal display module becomes an FS-LCD (Field Sequential-LCD). The FS-LCD performs red, green, and blue light emissions in one frame period. Color display can be performed by composing an image by a time division method. Also, emission of respective colors is performed using a light-emitting diode, a cold-cathode tube, or the like; hence, a color filter is not required. Therefore, since the arrangement of color filters of three primary colors is not required, nine times as many pixels as those in the case of using the color filters can be provided in the same area. On the other hand, light emission of three colors is performed in one frame period; therefore, high speed response of a liquid crystal is required. When an FS system or the OCB mode is applied to the display device of the present invention, a display device or a liquid crystal television device having higher performance and much higher definition can be completed.

A liquid crystal layer of the OCB mode has, what is called, a π cell structure. In the π cell structure, liquid crystal molecules are oriented such that pretilt angles of the liquid molecules are symmetrical with respect to the center plane between the active matrix substrate and the opposite substrate. The orientation in the π cell structure is a splay orientation when a voltage is not applied between the substrates, and shifts into a bend orientation when the voltage is applied. Further application of the voltage makes the liquid crystal molecules in the bend orientation orientated perpendicular to the substrates, which allows light to pass therethrough. Note that approximately ten times as high response speed as a conventional TN mode can be achieved by using the OCB mode.

Further, as a mode corresponding to the FS system, an HV-FLC, an SS-FLC, or the like using a ferroelectric liquid crystal (FLC) that can be operated at high speed can also be used. A nematic liquid crystal that has relatively low viscosity is used for the OCB mode. A smectic liquid crystal is used for the HV-FLC or the SS-FLC. As a liquid crystal material, an FLC, a nematic liquid crystal, a smectic liquid crystal, or the like can be used.

An optical response speed of the liquid crystal display module is increased by narrowing a cell gap of the liquid crystal display module. Alternatively, the optical response speed can be increased by lowering the viscosity of the liquid crystal material. The above method of increasing the optical response speed is more effective when a pixel pitch or a dot pitch of a pixel portion of a TN mode liquid crystal display module is 30 μm or less.

The liquid crystal display module of FIG. 23B is a transmissive type, in which a red light source 2910*a*, a green light source 2910*b*, and a blue light source 2910*c* are provided as light sources. A control portion 2912 is provided to separately control the red light source 2910*a*, the green light source 2910*b*, and the blue light source 2910*c* to be turned on or off. The light emission of respective colors is controlled by the control portion 2912, and light enters the liquid crystal to compose an image using the time division method, thereby performing color display.

In this embodiment mode, a manufacturing process can be simplified as described above. By forming various components (parts) directly over a substrate using a droplet discharge method, a display panel can be easily manufactured even when using a glass substrate of the fifth generation or later having a side of 1000 mm or more.

According to the present invention, a conductive layer included in a display device can be manufactured through the simplified process. Therefore, cost reduction can be achieved. In addition, a plating method is used; therefore, the thickness or size of a wire layer can be controlled relatively easily, and a wire layer suitable for an intended purpose can be manufactured. Therefore, a high-performance and high-reliability display device which can operate at high speed can be manufactured.

This embodiment mode can be freely combined with Embodiment Modes 1 to 4, 5, 7, and 8.

Embodiment Mode 12

Figure 24:
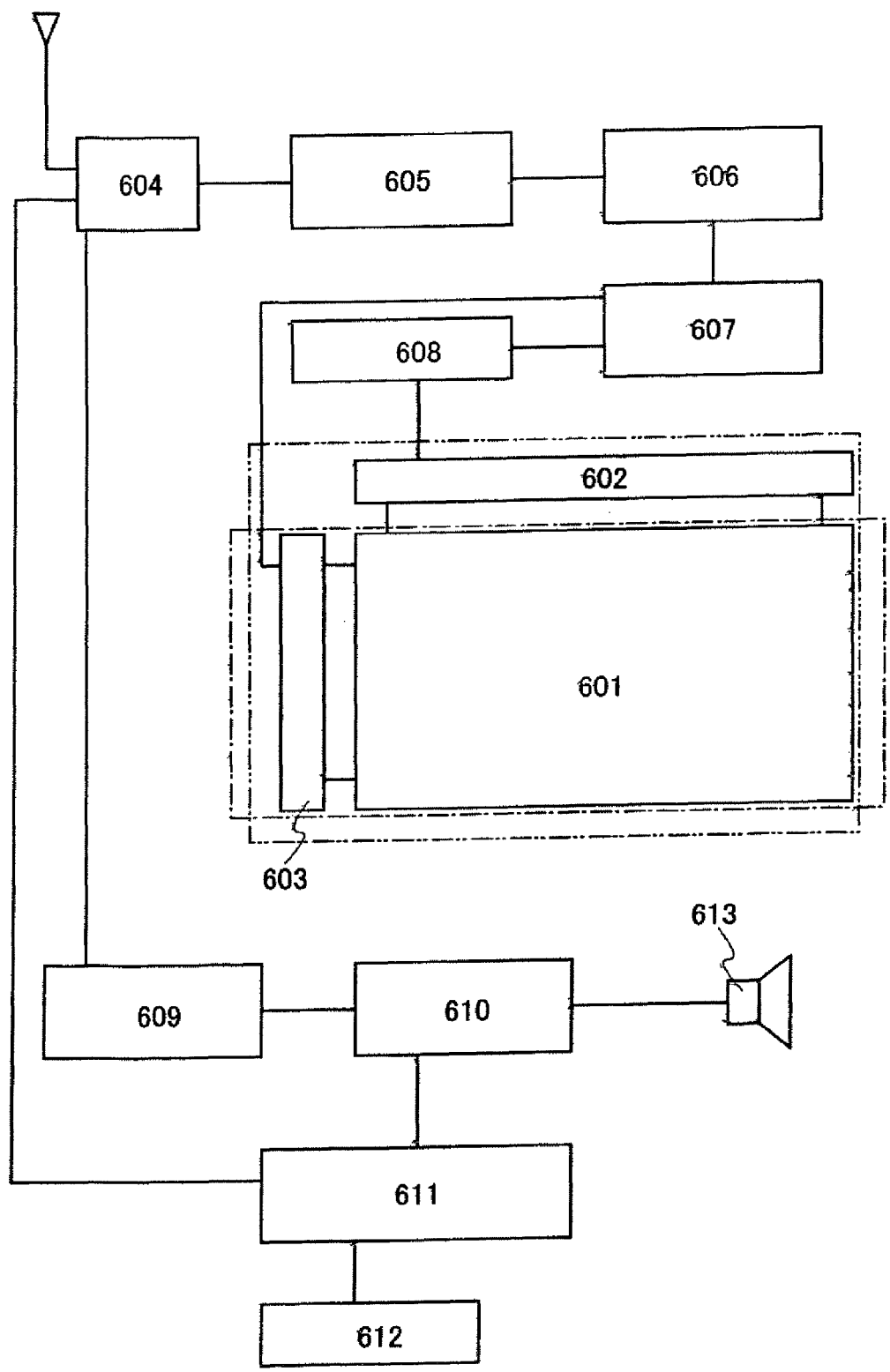
FIG. 24 is a block diagram showing a main structure of an electronic device to which the present invention is applied.

A television device can be completed by using the display device formed in accordance with the present invention. FIG. 24 is a block diagram showing a main structure of the television device. As for the display panel, there are a case in which only a pixel portion 601 is formed as shown in FIG. 27A and a scanning line driver circuit 603 and a signal line driver circuit 602 are mounted by a TAB method as shown in FIG. 28B; a case in which the scanning line driver circuit 603 and the signal line driver circuit 602 are mounted by a COG method as shown in FIG. 28A; a case in which TFTs are formed as shown in FIG. 27B, the pixel portion 601 and the scanning line driver circuit 603 are formed over a substrate, and the signal line driver circuit 602 is separately mounted as a driver IC; a case in which the pixel portion 601, the signal line driver circuit 602, and the scanning line driver circuit 603 are integrated with a substrate as shown in FIG. 27C; and the like. The display panel may have any of the structures.

As another external circuit, a video signal amplifier circuit 605 which amplifies a video signal among signals received by a tuner 604, a video signal processing circuit 606 which converts the signal output from the video signal amplifier circuit 605 into a chrominance signal corresponding to each color of red, green, and blue, a control circuit 607 which converts the video signal into an input specification of the driver IC, and the like are provided on an input side of the video signal. The control circuit 607 outputs signals to both a scanning line side and a signal line side. In a case of digital driving, a signal dividing circuit 608 may be provided on the signal line side and an input digital signal may be divided into m pieces and supplied.

An audio signal among signals received by the tuner 604 is sent to an audio signal amplifier circuit 609 and is supplied to a speaker 613 through an audio signal processing circuit 610. A control circuit 611 receives control information of a receiving station (reception frequency) or sound volume from an input portion 612 and transmits signals to the tuner 604 and the audio signal processing circuit 610.

Figure 25A:
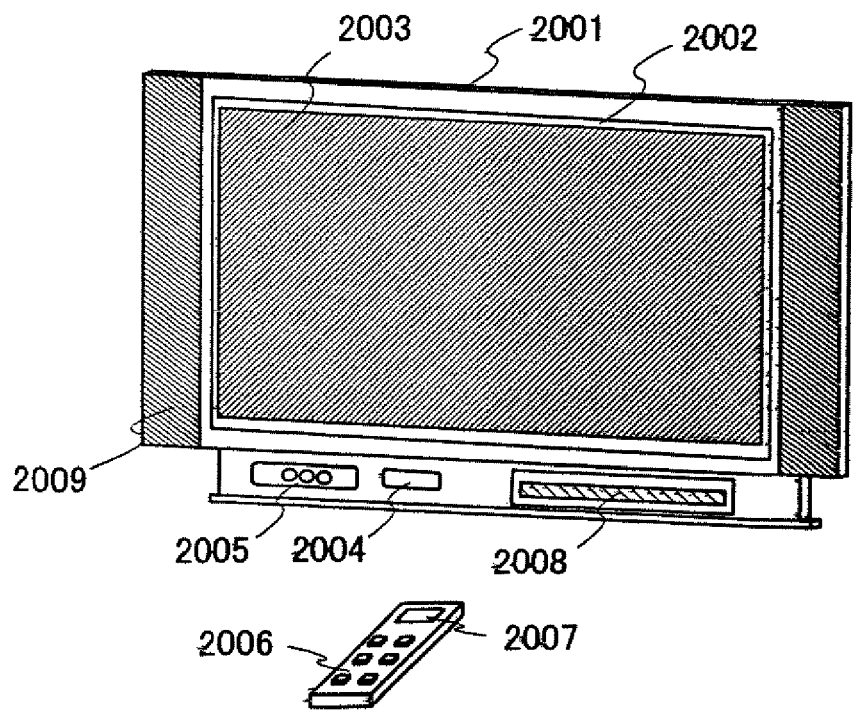
FIGS. 25A and 25B are diagrams showing electronic devices to which the present invention is applied.
Figure 25B:
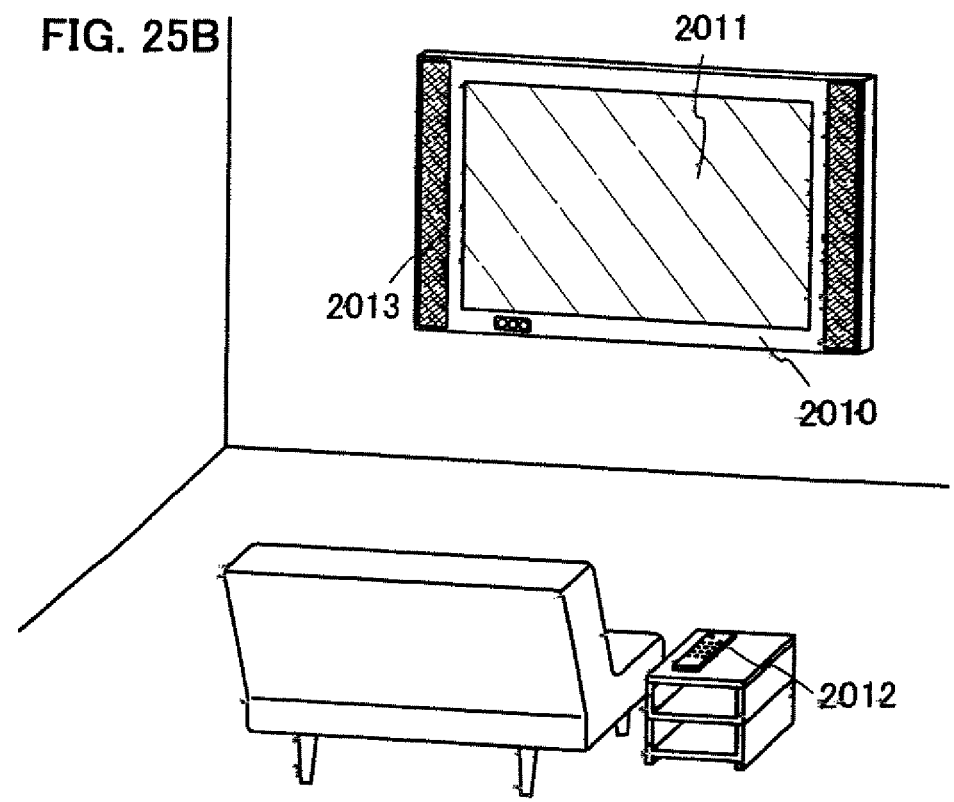

A television device can be completed by incorporating such a liquid crystal display module or an EL display module into a chassis as shown in FIGS. 25A and 25B. When an EL display module as shown in FIG. 22 is used, an EL television device can be obtained. When a liquid crystal display module as shown in FIG. 23A or FIG. 23B is used, a liquid crystal television device can be obtained. A main screen 2003 is formed by using the display module, and a speaker portion 2009, an operation switch, and the like are provided as its accessory equipment. Thus, a television device can be completed in accordance with the present invention.

A display panel 2002 is incorporated in a chassis 2001, and general TV broadcast can be received by a receiver 2005. When the display device is connected to a communication network by wired or wireless connections via a modem 2004, one-way (from a sender to a receiver) or two-way (between a sender and a receiver or between receivers) information communication can be performed. The television device can be operated by using a switch built in the chassis or a remote control unit 2006. A display portion 2007 for displaying output information may also be provided in the remote control unit 2006.

Further, the television device may also include a sub screen 2008 formed using a second display panel so as to display channels, volume, or the like, in addition to the main screen 2003. In this structure, the main screen 2003 may be formed using an EL display panel having a wide viewing angle, and the sub screen 2008 may be formed using a liquid crystal display panel capable of displaying images with lower power consumption. In order to reduce the power consumption preferentially, the main screen 2003 may be formed using a liquid crystal display panel, and the sub screen may be formed using an EL display panel, which can be switched on and off. In accordance with the present invention, a highly reliable display device can be formed even when a large-sized substrate is used and a large number of TFTs or electronic components are used.

FIG. 25B shows a television device having a large-sized display portion, for example, a 20-inch to 80-inch display portion. The television device includes a chassis 2010, a display portion 2011, a remote control device 2012 that is an operation portion, a speaker portion 2013, and the like. The present invention is applied to manufacturing of the display portion 2011. Since the television device in FIG. 25B is a wall-hanging type, it does not require a large installation space.

Naturally, the present invention is not limited to the television device, and can be applied to various use applications as a large-area display medium such as an information display board at a train station, an airport, or the like, or an advertisement display board on the street, as well as a monitor of a personal computer.

Embodiment Mode 13

By applying the present invention, various kinds of display devices can be manufactured. In other words, the present invention can be applied to various kinds of electronic devices in which such display devices are incorporated in display portions.

Examples of such electronic devices can be as follows: a camera such as a video camera or a digital camera, a projector, a head-mounted display (a gaggle type display), a car navigation system, a car stereo, a personal computer, a game machine, a portable information terminal (such as a mobile computer, a cellular phone, or an electronic book), an image reproducing device provided with a recording medium (specifically, a device which can reproduce content of a recording medium such as a digital versatile disc (DVD) and includes a display portion capable of displaying images thereof), and the like. Specific examples thereof are shown in FIGS. 26A to 26D.

Figure 26A:
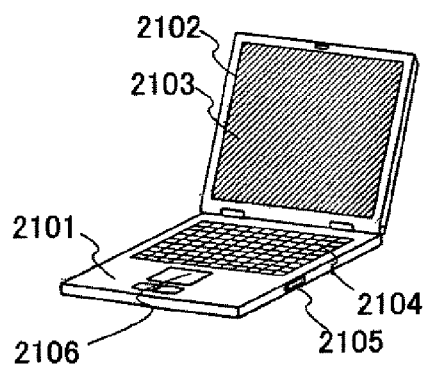
FIGS. 26A to 26D are diagrams showing electronic devices to which the present invention is applied.

FIG. 26A shows a personal computer, which includes a main body 2101, a chassis 2102, a display portion 2103, a keyboard 2104, an external connection port 2105, a pointing mouse 2106, or the like. The invention can be applied to manufacturing of the display portion 2103. By using the present invention, use efficiency of materials can be enhanced and a manufacturing process can be simplified. Thus, cost reduction can be realized.

Figure 26B:
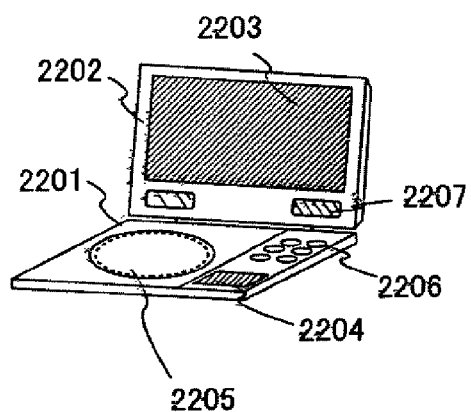

FIG. 26B shows an image reproducing device (specifically, a DVD player) including a recording medium loading portion, which includes a main body 2201, a chassis 2202, a display portion A 2203, a display portion B 2204, a recording medium (a DVD or the like) loading portion 2205, an operation key 2206, a speaker portion 2207, or the like. The display portion A 2203 mainly displays image information, and the display portion B 2204 mainly displays character information. The invention can be applied to manufacturing of the display portion A 2203 and the display portion B 2204. By using the present invention, use efficiency of materials can be enhanced and a manufacturing process can be simplified. Thus, cost reduction can be realized.

Figure 26C:
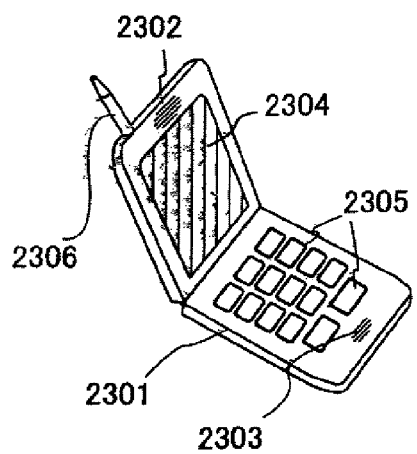

FIG. 26C shows a cellular phone, which includes a main body 2301, an audio output portion 2302, an audio input portion 2303, a display portion 2304, an operation switch 2305, an antenna 2306, or the like. The display device manufactured according to the present invention can be applied to the display portion 2304. By using the present invention, use efficiency of materials can be enhanced and a manufacturing process can be simplified. Thus, cost reduction can be realized.

Figure 26D:
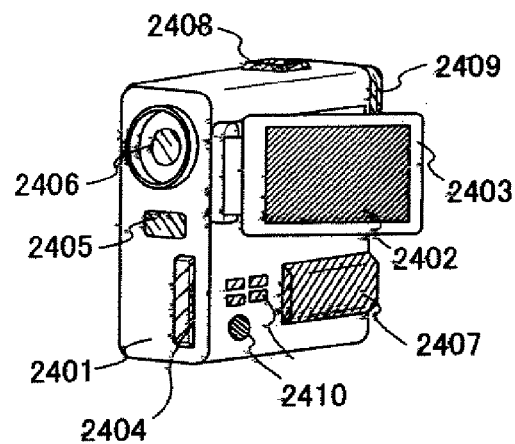

FIG. 26D shows a video camera, which includes a main body 2401, a display portion 2402, a chassis 2403, an external connection port 2404, a remote control receiving portion 2405, an image receiving portion 2406, a battery 2407, an audio input portion 2408, an eye piece portion 2409, operation keys 2410, or the like. The present invention can be applied to the display portion 2402. The display device manufactured according to the present invention can be applied to the display portion 2402. By using the present invention, use efficiency of materials can be enhanced and a manufacturing process can be simplified. Thus, cost reduction can be realized. This embodiment mode can be freely combined with any of the above-described embodiment modes.

Embodiment Mode 14

In accordance with the present invention, a semiconductor device functioning as a processor chip (also referred to as a wireless chip, a wireless processor, a wireless memory, or a wireless tag) can be formed. The application of the semiconductor device of the present invention is wide-ranging. For example, the semiconductor device of the present invention can be used by being provided in paper money, coins, securities, certificates, bearer bonds, packing containers, books, recording media, personal belongings, vehicles, food, clothing, health products, commodities, medicine, electronic devices, and the like.

Figure 33A:
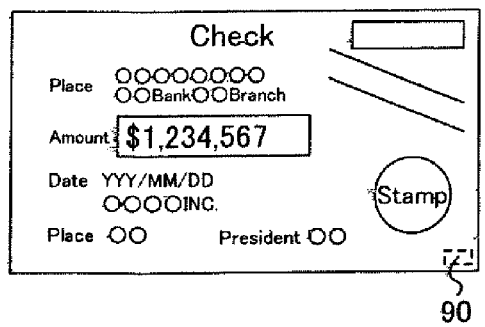
FIGS. 33A to 33G are diagrams showing semiconductor devices to which the present invention is applied.
Figure 33B:
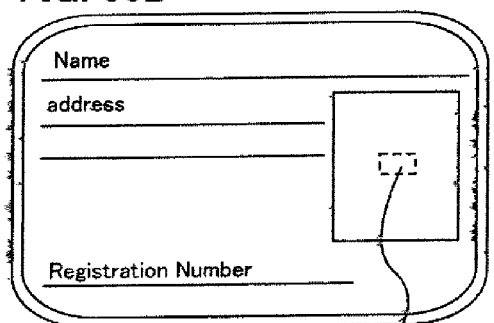
Figure 33C:
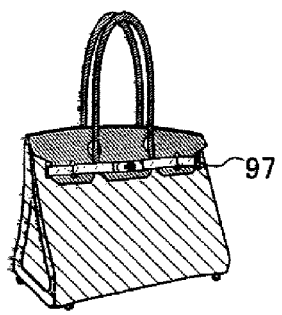
Figure 33D:
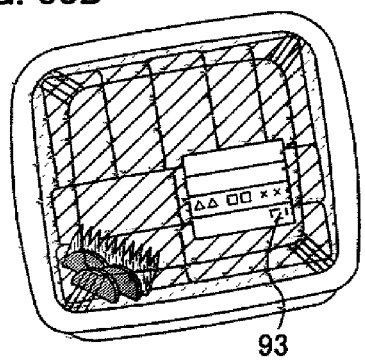
Figure 33E:
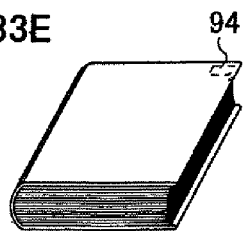
Figure 33F:
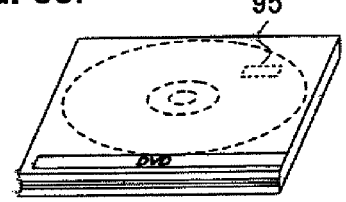
Figure 33G:
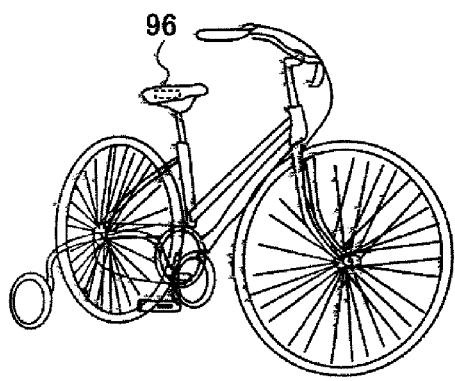

Paper money and coins are money distributed in the market and include ones valid in a certain area (cash voucher), memorial coins, and the like. Securities include checks, certificates, promissory notes, and the like, and can be provided with a processor chip 90 (FIG. 33A). Certificates include driver's licenses, certificates of residence, and the like, and can be provided with a processor chip 91 (FIG. 33B). Personal belongings include bags, glasses, and the like, and can be provided with a processor chip 97 (FIG. 33C). Bearer bonds include stamps, rice coupons, various gift certificates, and the like. Packing containers include wrapping paper for food containers and the like, plastic bottles, and the like, and can be provided with a processor chip 93 (FIG. 33D). Books include hardbacks, paperbacks, and the like, and can be provided with a processor chip 94 (FIG. 33E). Recording media include DVD software, video tapes, and the like, and can be provided with a processor chip 95 33F). Vehicles include wheeled vehicles such as bicycles, ships, and the like, and can be provided with a processor chip 96 (FIG. 33G). Food includes food articles, drink, and the like. Clothing includes clothes, footwear, and the like. Health products include medical instruments, health instruments, and the like. Commodities include furniture, lighting equipment, and the like. Medicine includes medical products, pesticides, and the like. Electronic devices include liquid crystal display devices, EL display devices, television devices (television receiver and thin television receiver), cellular phones, and the like.

Forgery can be prevented by providing a processor chip in paper money, coins, securities, certificates, bearer bonds, or the like. The efficiency of an inspection system or a system used in a rental shop can be improved by providing a processor chip in packing containers, books, recording media, personal belonging, food, commodities, electronic devices, or the like. By providing a processor chip in vehicles, health products, medicine, or the like, forgery or theft can be prevented; further, medicine can be prevented from being taken mistakenly. The processor chip is provided in such an article by being attached to the surface or being embedded therein. For example, in the case of a book, the processor chip may be embedded in a piece of paper; in the case of a package made from an organic resin, the processor chip may be embedded in the organic resin.

The system can have high functionality by applying the processor chip formed in accordance with the present invention to a management system or a distribution system of articles. For example, information that is recorded in a processor chip provided in a tag is read by a reader/writer provided beside a conveyor belt, information about a distribution process or a delivery destination is then read out, and inspection of merchandise or distribution of goods can be easily performed.

Figure 29:
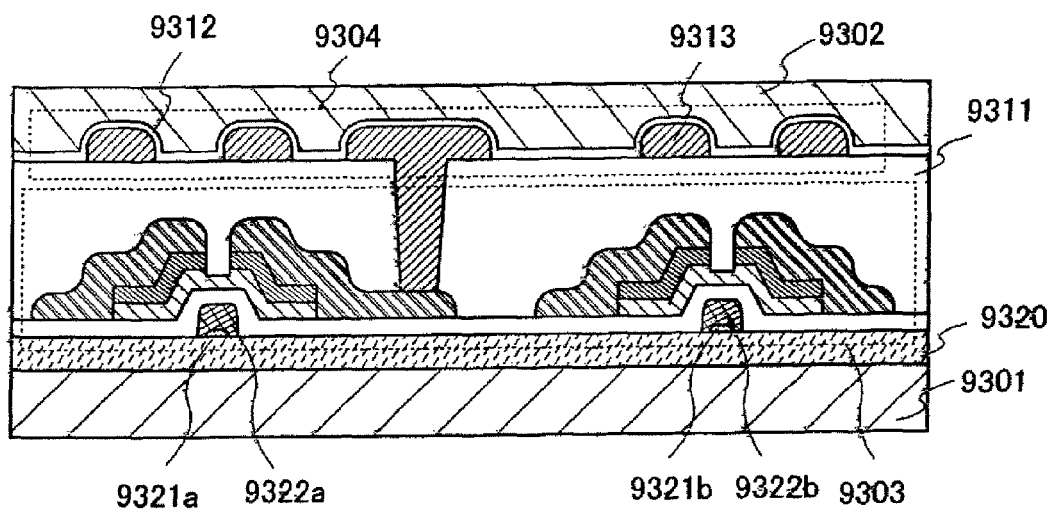
FIG. 29 is a diagram showing a semiconductor device to which the present invention is applied.

A structure of a processor chip which can be formed in accordance with the present invention is explained with reference to FIG. 29. The processor chip is formed using a thin film integrated circuit 9303 and an antenna 9304 connected to the thin film integrated circuit 9303. The thin film integrated circuit 9303 and the antenna 9304 are interposed between cover materials 9301 and 9302. The thin film integrated circuit 9303 may be attached to the cover material using an adhesive. In FIG. 29, one side of the thin film integrated circuit 9303 is attached to the cover material 9301 with an adhesive 9320 interposed therebetween.

The thin film integrated circuit 9303 is formed in the same manner as a TFT shown in any of the above embodiment modes, and provided for the cover material through a peeling step. Gate electrode layers 6322*a* and 6322*b* of TFTs of the thin film integrated circuit 9303 are formed using photocatalyst materials or materials including an amino group. 9321*a* and 9321*b* which are catalyst materials for the plating catalyst material by a plating method. Since the photocatalyst materials or materials including an amino group 9321*a* and 9321*b* are selectively formed by a droplet-discharge method, the manufacturing process is simplified. A semiconductor element used for the thin film integrated circuit 9303 is not limited to this. For example, a memory element, a diode, a photoelectric conversion element, a resistor element, a coil, a capacitor element, an inductor, or the like can be used as well as the TFT.

As shown in FIG. 29, an interlayer insulating film 9311 is formed over the TFT of the thin film integrated circuit 9303, and an antenna 9304 connected to the TFT is formed with the interlayer insulating layer 9311 interposed therebetween. Further, a barrier film 9312 made of a silicon nitride film or the like is formed over the interlayer insulating film 9311 and the antenna 9304.

The antenna 9304 is formed by discharging a droplet including a conductor such as gold, silver, or copper by a droplet discharge method, and drying and baking the droplet. By forming the antenna by a droplet discharge method, the number of steps can be reduced, and accordingly, cost can also be reduced.

For the cover materials 9301 and 9302, it is preferable to use a film (made of polypropylene, polyester, vinyl, polyvinyl fluoride, vinyl chloride, or the like), paper made of a fibrous material, a stacked film of a base material film (polyester, polyamide, an inorganic evaporation film, a variety of paper, or the like) and an adhesive synthetic resin film (an acrylic-based synthetic resin, an epoxy-based synthetic resin, or the like), or the like. The film and an object to be treated are subjected to a treatment for attachment or bonding by thermocompression. The film is attached to the object by melting an adhesion layer provided on a top surface of the film or a layer provided in an outmost layer (not the adhesion layer) through a heat treatment and by applying pressure.

By using an incinerable pollution-free material such as paper, a fiber, carbon graphite, or the like for the cover material, a used processor chip can be incinerated or cut. The processor chip using the above material is pollution-free since it does not generate a poisonous gas even when incinerated.

In FIG. 29, the processor chip is provided over the cover material 9301 with the adhesive 9320 interposed therebetween; however, the processor chip may be attached to an article instead of to the cover material 9301.

Embodiment Mode 15

In this embodiment mode, another structure applicable to the light-emitting element of the present invention is explained with reference to FIGS. 35A to 35C and FIGS. 36A to 36C.

Light emitting elements utilizing electroluminescence are classified according to whether a light-emitting material is an organic compound or an inorganic compound. In general, the former is referred to as an organic EL element, and the latter is referred to as an inorganic EL element.

The inorganic EL elements are classified according to their element structures into a dispersed inorganic EL element and a thin-film inorganic EL element. They are different in that the former includes an electroluminescent layer in which particles of a light-emitting material are dispersed in a binder and the latter includes an electroluminescent layer formed of a thin film of a light-emitting material; however, they are common in that electrons accelerated by a high electric field are required. Note that a mechanism for obtainable light emission includes a donor-acceptor recombination light emission which utilizes a donor level and an acceptor level and a localized light emission which utilizes inner-shell electron transition of metal ions. In general, it is often the case that the dispersed inorganic EL element performs the donor-acceptor recombination light emission and the thin-film inorganic EL element performs the localized light emission.

A light-emitting material which can be used in the present invention includes a base material and an impurity element serving as a light-emitting center. Light emission of various colors can be obtained by changing impurity elements to be contained. As a method for producing a light-emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a combined method of one of these methods and high-temperature baking, or a freeze-drying method can be used.

The solid phase method is a method by which a base material and an impurity element or a compound containing an impurity element are weighed, mixed in a mortar, and reacted by heating and baking in an electric furnace to make the impurity element contained in the base material. The baking temperature is preferably in the range of 700° C. to 1500° C. This is because solid phase reaction does not proceed when the temperature is too low, whereas the base material is decomposed when the temperature is too high. Note that the baking may be performed in powder form, but the baking is preferably performed in pellet form. The method requires baking at a relatively high temperature; however, it is a simple method. Therefore, the method provides good productivity and is suitable for mass production.

The liquid phase method (coprecipitation method) is a method by which a base material or a compound containing a base material is reacted in a solution with an impurity element or a compound containing an impurity element and the reactant is dried and then baked. Particles of the light-emitting material are uniformly distributed, a particle size is small, and the reaction can proceed even at a low baking temperature.

As the base material used for a light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (AlN), gallium nitride (GaN), indium nitride (InN), or the like can be used, for example. Further, zinc selenide (ZnSe), zinc telluride (ZnTe), or the like can also be used. It may be a ternary mixed crystal such as calcium gallium sulfide ($CaGa_2S_4$), strontium gallium sulfide ($SrGa_2S_4$), barium gallium sulfide ($BaGa_2S_4$), or the like.

As the light-emitting center of localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added. The halogen element can be used as a charge compensation.

On the other hand, as the light-emitting center of donor-acceptor recombination light emission, a light-emitting material which contains a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In a case of synthesizing the light-emitting material of donor-acceptor recombination light emission by a solid phase method, a base material, a first impurity element or a compound containing a first impurity element, and a second impurity element or a compound containing a second impurity element are separately weighed, mixed in a mortar, and then heated and baked in an electric furnace. As the base material, the above-mentioned base material can be used. As the first impurity element or the compound containing the first impurity element, fluorine (F), chlorine (Cl), aluminum sulfate ($Al_2S_3$), or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably in the range of 700° C. to 1500° C. This is because solid phase reaction does not proceed when the temperature is too low, whereas the base material is decomposed when the temperature is too high. Note that the baking may be performed in powder form, but the baking is preferably performed in pellet form.

As the impurity element in the case of utilizing solid phase reaction, a compound including the first impurity element and the second impurity element may be used. In this case, the impurity element is easily diffused and the solid phase reaction easily proceeds, so that a uniform light-emitting material can be obtained. Furthermore, a high-purity light-emitting element can be obtained since an unnecessary impurity element is not mixed. As the compound including the first impurity element and the second impurity element, copper chloride (CuCl), silver chloride (AgCl), or the like can be used, for example.

Note that the concentration of the impurity element to the base material may be in the range of 0.01 atomic % to 10 atomic %, preferably 0.05 atomic % to 5 atomic %.

In the case of the thin-film inorganic EL element, the electroluminescent layer is a layer containing the above-described light-emitting material, and can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as an organic metal CVD method or a hydride transfer low pressure CVD, an atomic layer epitaxy (ALE) method, or the like.

Figure 35A:
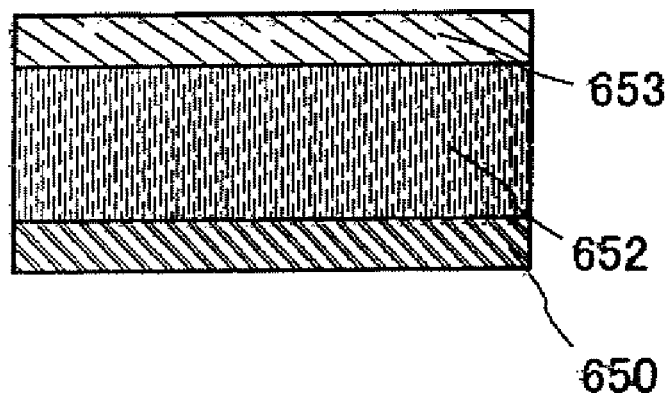
FIGS. 35A to 35C are diagrams explaining structures of light-emitting elements applicable to the present invention.
Figure 35B:
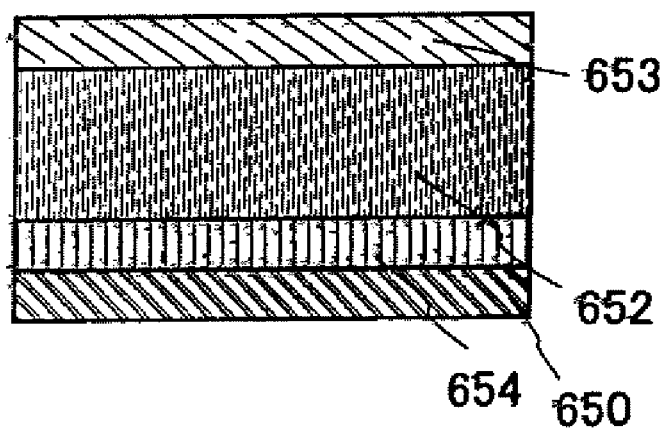
Figure 35C:
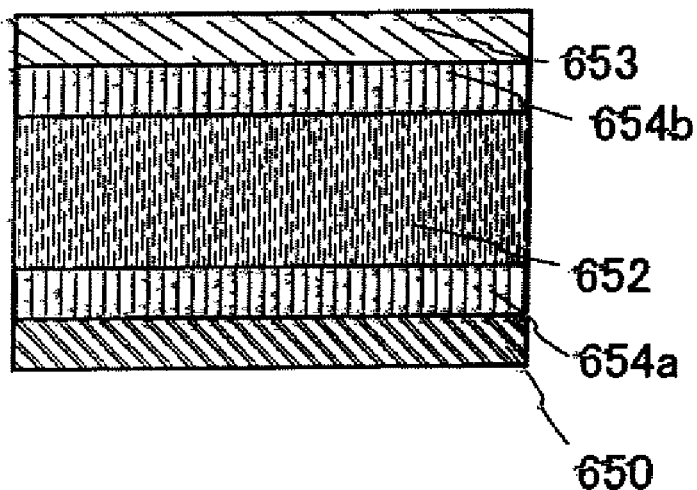

FIGS. 35A to 35C show examples of a thin-film inorganic EL element which can be used as a light-emitting element. In each of FIGS. 35A to 35C, a light-emitting element includes a first electrode layer 650, an electroluminescent layer 651, and a second electrode layer 653.

Each of the light-emitting elements shown in FIGS. 35B and 35C has a structure in which an insulating layer is provided between the electrode layer and the electroluminescent layer in the light-emitting element in FIG. 35A. The light-emitting element shown in FIG. 3513 includes an insulating layer 654 between the first electrode layer 650 and the electroluminescent layer 652. The light-emitting element shown in FIG. 35C includes an insulating layer 654*a* between the first electrode layer 650 and the electroluminescent layer 652 and an insulating layer 654*b* between the second electrode layer 653 and the electroluminescent layer 652. As described above, the insulating layer may be provided between the electroluminescent layer and either or both of the pair of electrode layers sandwiching the electroluminescent layer. The insulating layer may be a single layer or a stacked layer of a plurality of layers.

In FIG. 3513, the insulating layer 654 is provided to be in contact with the first electrode layer 650. However, the insulating layer 654 may be provided to be in contact with the second electrode layer 653 by reversing the order of the insulating layer and the electroluminescent layer.

In the case of the dispersed inorganic EL element, a particulate light-emitting material is dispersed in a binder to form a membranous electroluminescent layer. In a case where a particle having a desired size cannot be sufficiently obtained by a production method of a light-emitting material, the material may be processed into particles by crushing in a mortar or the like. The binder is a substance for fixing a particulate light-emitting material in a dispersed manner and holding the material in shape as the electroluminescent layer. The light-emitting material is uniformly dispersed and fixed in the electroluminescent layer by the binder.

In the case of the dispersed inorganic EL element, the electroluminescent layer can be formed by a droplet discharge method which can selectively form the electroluminescent layer, a printing method (such as screen printing or off-set printing), a coating method such as a spin-coating method, a dipping method, a dispenser method, or the like. The thickness is not particularly limited, but it is preferably in the range of 10 nm to 1000 nm. In addition, in the electroluminescent layer containing the light-emitting material and the binder, the proportion of the light-emitting material is preferably in the range of 50 wt % to 80 wt %.

Figure 36A:
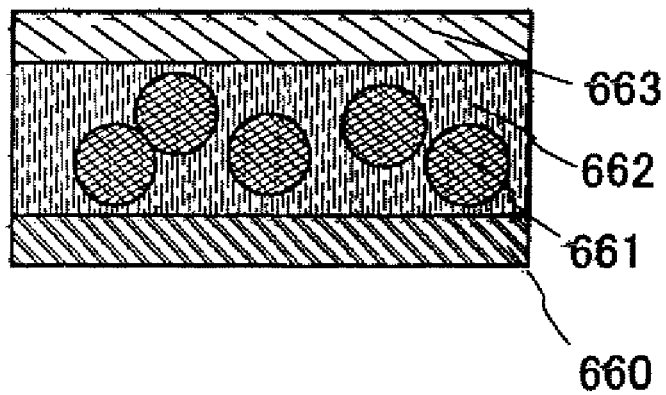
FIGS. 36A to 36C are diagrams explaining structures of light-emitting elements applicable to the present invention.
Figure 36B:
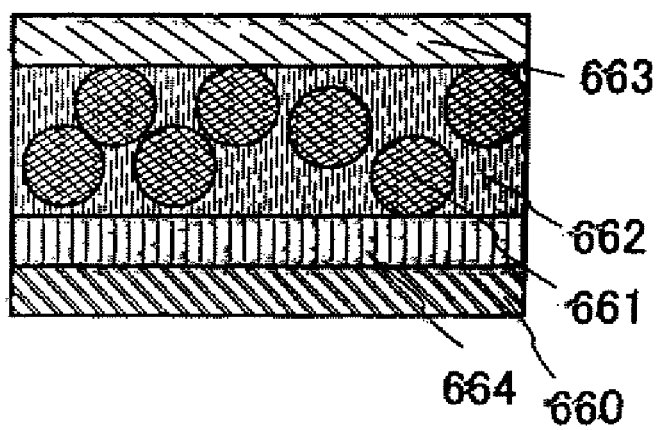
Figure 36C:
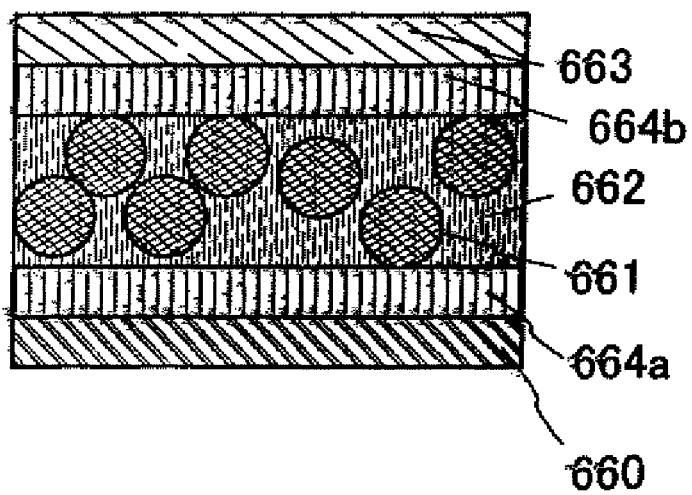

FIGS. 36A to 36C show examples of a dispersed inorganic EL element which can be used as a light-emitting element. A light-emitting element in FIG. 36A has a laminated structure of a first electrode layer 660, an electroluminescent layer 662, and a second electrode layer 663, and contains a light-emitting material 661 held by a binder in the electroluminescent layer 662.

As the binder which can be used in this embodiment mode, an insulating material, an organic material or an inorganic material, or a mixed material of an organic material and an inorganic material can be used. As an organic insulating material, a polymer having a relatively high dielectric constant, such as a cyanoethyl cellulose resin, or a resin such as polyethylene, polypropylene, a polystyrene resin, a silicone resin, an epoxy resin, or vinylidene fluoride can be used. Alternatively, a heat resistant high molecular compound such as aromatic polyamide or polybenzimidazole, or a siloxane resin may be used. Note that the siloxane resin corresponds to a resin including a Si—O—Si bond. A skeleton of siloxane includes a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin such as polyvinyl alcohol, polyvinylbutyral, a phenol resin, a novolac resin, an acrylic resin, a melamine resin, an urethane resin, or an oxazole resin (polybenzoxazole) may be used. A dielectric constant can be adjusted by appropriately mixing high dielectric constant fine particles such as barium titanate ($BaTiO_3$) or strontium titanate ($SrTiO_3$) in the above resin.

As an inorganic insulating material included in the binder, a material selected from substances containing inorganic insulating materials can be used, such as silicon oxide ($SO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalite ($BaTa_2O_6$), lithium tantalite ($LiTaO_3$), yttrium oxide ($Y_2O_3$), zirconium oxide ($ZrO_2$), or ZnS, or other insulating materials. A dielectric constant of the electroluminescent layer including the light-emitting material and the binder can be controlled by making an organic material to contain a high dielectric constant inorganic material (by adding etc.), so that a dielectric constant can be increased.

In a producing process, a light-emitting material is dispersed in a solution including a binder. As a solvent of the solution including the binder that can be used in this embodiment mode, a solvent in which a binder material is soluble and which can produce a solution having a viscosity suitable for a method for forming the electroluminescent layer (various wet processes) and a desired thickness, may be selected appropriately. An organic solvent or the like can be used. In the case of using, for example, a siloxane resin as the binder, propylene glycol monomethyl ether, propylene glycol monomethyl ether acetate (also referred to as PGMEA), 3-methoxy-3-methyl-1-butanol (also referred to as MMB), or the like can be used.

Each of the light-emitting elements shown in FIGS. 36B and 36C has a structure in which an insulating layer is provided between the electrode layer and the electroluminescent layer in the light-emitting element in FIG. 36A. The light-emitting element shown in FIG. 36B includes an insulating layer 664 between the first electrode layer 660 and the electroluminescent layer 662. The light-emitting element shown in FIG. 36C includes an insulating layer 664a between the first electrode layer 660 and the electroluminescent layer 662 and an insulating layer 664b between the second electrode layer 663 and the electroluminescent layer 662. As described above, the insulating layer may be provided between the electroluminescent layer and either or both of the pair of electrodes sandwiching the electroluminescent layer. In addition, the insulating layer may be a single layer or a stacked layer of a plurality of layers.

In FIG. 36B, the insulating layer 664 is provided to be in contact with the first electrode layer 660. However, the insulating layer 664 may be provided to be in contact with the second electrode layer 663 by reversing the order of the insulating layer and the electroluminescent layer.

An insulating layer such as the insulating layer 654 in FIGS. 35A to 35C or the insulating layer 664 in FIGS. 36A to 36C is not particularly limited, but it preferably has high insulation resistance and dense film quality. Furthermore, it preferably has a high dielectric constant. For example, a film of silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a mixed film thereof, or a stacked film of two or more kinds can be used. These insulating films can be formed by sputtering, evaporation, CVD, or the like. Alternatively, the insulating layer may be formed by dispersing particles of the insulating material in a binder. A binder material may be formed using a material and a method which are similar to those of the binder included in the electroluminescent layer. The thickness is not particularly limited, but it is preferably in the range of 10 nm to 1000 nm.

The light-emitting element described in this embodiment mode, which can provide light emission by applying voltage between a pair of electrode layers sandwiching the electroluminescent layer, can be operated by either DC drive or AC drive.

EXAMPLE 1

Example 1 shows an example in which a conductive layer is formed in accordance with the present invention.

On a substrate, an octadecyltrimethoxysilane (ODA) fim is formed for controlling wettability, a composition including titanium oxide was selectively formed by a droplet discharging method as a photocatalyst material adsorbing a plating catalyst material, and then, a heat treatment was conducted at 450° for 30 minutes to form a titanium oxide film. The ODA film was heated at a substrate temperature of 130° for ten minutes to evaporate a liquid ODA, so that the ODA film was formed. The substrate provided with the titanium oxide film was immersed in a plating catalyst solution including a palladium chloride ($PdCl_2$) solution whose pH was adjusted to be set at about 6 by adding potassium hydroxide (KOH) thereto. In this example, the immersion was conducted for about 30 seconds to 3 minutes so that palladium ions were adsorbed onto the titanium oxide film. After that, the substrate adsorbing palladium ions was immersed in a plating solution including a metal material to grow a metal film. As the plating solution, a solution in which nickel sulfate hexahydrate ($NiSO_4$) employed as a metal salt, hypophosphorous acid ($H_3PO_2$) employed as a reducing agent, lactice acid and malic acid employed as complexing agents were mixed, was used and a nickel phosphorus alloy film was formed by a plating method as a metal film.

Figure 34:
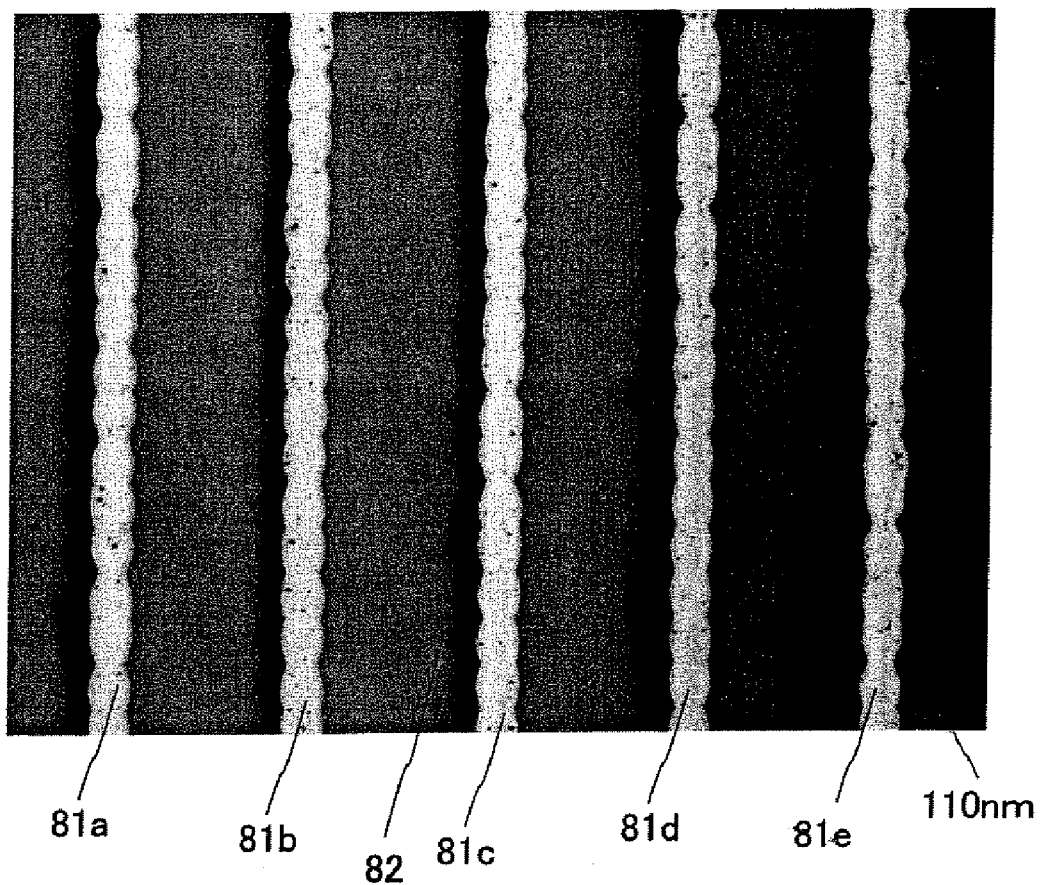
FIG. 34 shows experimental data of Example 1.

FIG. 34 shows an optical microscope photograph of the formed metal film. In FIG. 34, metal films 81a, 81b, 81c, 81d and 81e were formed over a substrate 82. The metal films 81a, 81b, 81c, 81d and 81e were formed to have shapes based on patterns of the selectively formed photocatalyst materials and plating catalyst materials. In this example, titanium oxide adsorbing palladium which is a plating catalyst material was selectively formed by a droplet-discharge method. Thus, a mask or a photolithography process is not required to form a desired shape. The process can be thus simplified and wire can be formed at low cost with high productivity. Accordingly, a semiconductor device, a display device and the like can be manufactured at low cost with high productivity, in accordance with the present invention.

By using a plating method, a film thickness or a size of wire layer can be controlled easily and thus, wire layers suitable for an intended purpose can be obtained. Accordingly, high performance and highly reliable semiconductor devices which can operate at high speed can be manufactured.

The present application is based on Japanese Patent application No. 2005-193192 filed on Jun. 30, 2005 with the Japanese Patent Office, the entire contents of which are hereby incorporated by reference.

What is claimed is:

1. A manufacturing method of a semiconductor device, comprising the steps of:
   selectively forming a first material including an amino group over a substrate by discharging a composition including the first material including an amino group;
   immersing the first material including an amino group in a solution including a first plating catalyst material so as to form the first plating catalyst material over the first material including an amino group;
   immersing the first plating catalyst material in a plating solution including a first metal material so as to form a gate electrode layer over a surface of the first material including an amino group;
   forming a gate insulating layer over the gate electrode layer;
   selectively forming a source or drain electrode layer over the gate insulating layer by a droplet-discharge method; and
   forming a semiconductor layer over the source or drain electrode layer,
   wherein the semiconductor layer comprises zinc oxide.

2. The manufacturing method of a semiconductor device according to claim 1, wherein an ITO thin film, a gold thin film, or a Ti thin film is formed as at least one of the gate electrode layer, the source electrode layer and the drain electrode layer.

3. The manufacturing method of a semiconductor device according to claim 1, wherein a $Y_zO_x$, an $Al_2O_3$, a $TiO_2$, or a stacked layer thereof is used for the gate insulating layer.

4. A manufacturing method of a semiconductor device, comprising the steps of:
   selectively forming a first material including an amino group over a substrate by discharging a composition including the first material including an amino group;
   immersing the first material including an amino group in a solution including a first plating catalyst material so as to form the first plating catalyst material over the first material including an amino group;
   immersing the first plating catalyst material in a plating solution including a first metal material so as to form a gate electrode layer over a surface of the first material including an amino group;
   forming a gate insulating layer over the gate electrode layer;
   selectively forming a source or drain electrode layer over the gate insulating layer by a droplet-discharge method; and
   forming a semiconductor layer over the source or drain electrode layer,
   wherein the semiconductor layer comprises zinc oxide, indium and gallium.

5. The manufacturing method of a semiconductor device according to claim 4, wherein an ITO thin film, a gold thin film, or a titanium thin film is formed as at least one of the gate electrode layer, the source electrode layer and the drain electrode layer.

6. The manufacturing method of a semiconductor device according to claim 4, wherein a $Y_zO_x$, an $Al_2O_3$, a $TiO_2$, or a stacked layer thereof is used for the gate insulating layer.

7. A manufacturing method of a semiconductor device, comprising the steps of:
   selectively forming a first material including an amino group over a substrate by discharging a composition including the first material including an amino group;
   immersing the first material including an amino group in a solution including a first plating catalyst material so as to form the first plating catalyst material over the first material including an amino group;
   immersing the first plating catalyst material in a plating solution including a first metal material so as to form a gate electrode layer over a surface of the first material including an amino group;
   forming a gate insulating layer over the gate electrode layer;

selectively forming a second material including an amino group over the gate insulating layer by discharging a composition including the second material including an amino group;

immersing the second material including an amino group in a solution including a second plating catalyst material so as to form the second plating catalyst material over the second material including an amino group; and immersing the second plating catalyst material in a plating solution including a second metal material so as to form a source or drain electrode layer over a surface of the second material including an amino group; and forming a semiconductor layer over the source or drain electrode layer, wherein the semiconductor layer comprises zinc oxide.

8. The manufacturing method of a semiconductor device according to claim 7, wherein pH of each of the solution including the first plating catalyst material and the solution including the second plating catalyst material is adjusted in a range of 3 to 6.

9. The manufacturing method of a semiconductor device according to claim 7, wherein an ITO thin film, a gold thin film, or a Ti thin film is formed as at least one of the gate electrode layer, the source electrode layer and the drain electrode layer.

10. The manufacturing method of a semiconductor device according to claim 7, wherein palladium, platinum, rhodium, or gold is used as at least one of the first plating catalyst material and the second plating catalyst material.

11. The manufacturing method of a semiconductor device according to claim 7, wherein a $Y_zO_x$, an $Al_2O_3$, a $TiO_2$, or a stacked layer thereof is used for the gate insulating layer.

12. A manufacturing method of a semiconductor device, comprising the steps of:

selectively forming a first material including an amino group over a substrate by discharging a composition including the first material including an amino group;

immersing the first material including an amino group in a solution including a first plating catalyst material so as to form the first plating catalyst material over the first material including an amino group;

immersing the first plating catalyst material in a plating solution including a first metal material so as to form a gate electrode layer over a surface of the first material including an amino group;

forming a gate insulating layer over the gate electrode layer;

selectively forming a second material including an amino group over the gate insulating layer by discharging a composition including the second material including an amino group;

immersing the second material including an amino group in a solution including a second plating catalyst material so as to form the second plating catalyst material over the second material including an amino group; and immersing the second plating catalyst material in a plating solution including a second metal material so as to form a source or drain electrode layer over a surface of the second material including an amino group; and forming a semiconductor layer over the source or drain electrode layer, wherein the semiconductor layer comprises zinc oxide, indium and gallium.

13. The manufacturing method of a semiconductor device according to claim 12, wherein pH of each of the solution including the first plating catalyst material and the solution including the second plating catalyst material is adjusted in a range of 3 to 6.

14. The manufacturing method of a semiconductor device according to claim 12, wherein an ITO thin film, a gold thin film, or a titanium thin film is formed as at least one of the gate electrode layer, the source electrode layer and the drain electrode layer.

15. The manufacturing method of a semiconductor device according to claim 12, wherein palladium, platinum, rhodium, or gold is used as at least one of the first plating catalyst material and the second plating catalyst material.

16. The manufacturing method of a semiconductor device according to claim 12, wherein a $Y_zO_x$, an $Al_2O_3$, a $TiO_2$, or a stacked layer thereof is used for the gate insulating layer.

* * * * *

UNITED STATES PATENT AND TRADEMARK OFFICE
CERTIFICATE OF CORRECTION

PATENT NO. : 8,241,948 B2
APPLICATION NO. : 12/792816
DATED : August 14, 2012
INVENTOR(S) : Gen Fujii It is certified that error appears in the above-identified patent and that said Letters Patent is hereby corrected as shown below:

In the Specification:

Col. 6, line 22, "The formation position timing" should read "The formation position (timing"

Col. 8, line 6, "iridium (Ir), cold (Au)," should read "iridium (Ir), gold (Au)"

Col. 8, line 28, "palladium(H) sodium" should read "palladium(II) sodium"

Col. 9, line 67, "FIGS. 2A to 2B." should read "FIGS. 2A to 2D."

Col. 11, line 14, "heptadefluorotetrahydroclecyltriethoxysilane" should read "heptadefluorotetrahydrodecyltriethoxysilane"

Col. 11, line 41, "ethylene-chlorotrifluoroethyle" should read "ethylene-chlorotrifluoroethylene"

Col. 11, line 42, "(ETFE) or polytrifluorochloroethylene-ethylene" should read "(ECTFE) or polytrifluorochloroethylene-ethylene"

Col. 13, line 55, "mariner as in FIG. 27A." should read "manner as in FIG. 27A."

Col. 23, line 32, "semiconductor layer 407" should read "semiconductor layer 107"

Col. 24, line 23, "stacking the souse" should read "stacking the source"

Col. 31, lines 6-7, "aluminum nitride (AN)," should read "aluminum nitride (AlN),"

Col. 31, line 26, "the surface may ay" should read "the surface may"

Col. 32, line 2, "that is a WI substrate" should read "that is a TFT substrate"

Signed and Sealed this
Twenty-fifth Day of February, 2014

Michelle K. Lee
*Deputy Director of the United States Patent and Trademark Office*

CERTIFICATE OF CORRECTION (continued)
U.S. Pat. No. 8,241,948 B2

In the Specification (cont.):

Col. 37, line 15, "electrode layers 487aand 487b," should read "electrode layers 487a and 487b,"

Col. 40, line 23, "TDATA, MTDATA, DAB," should read "TDATA, MTDATA, m-MTDAB,"

Col. 41, line 28, "(abbreviated as TPBJ)," should read "(abbreviated as TPBI),"

Col. 42, lines 6-7, "9,10-di(2-naphthyl)-2-tent-butylanthracene" should read "9,10-di(2-naphthyl)-2-tert-butylanthracene"

Col. 42, line 7, "(abbreviated as t-BuPNA)," should read "(abbreviated as t-BuDNA),"

Col. 42, line 10, "perylene, rubrene, perfilanthene," should read "perylene, rubrene, periflanthene"

Col. 42, line 11, "9,10-diphenyl anthracene" should read "9,10-diphenylanthracene"

Col. 42, line 12, "abbreviated as DPA)," should read "(abbreviated as DPA),"

Col. 42, lines 29-30, "(abbreviated lr(btp)2(acac))." should read "(abbreviated as Ir(btp)2(acac))."

Col. 43, line 27, "is superior i durability" should read "is superior in durability"

Col. 44, line 39, "each of R, Q and" should read "each of R, G and"

Col. 44, line 60, "1A. In a case where" should read "11A. In a case where"

Col. 45, line 3, "a work function of 33 eV" should read "a work function of 3.5 eV"

Col. 48, line 1, "is that a having an amorphous" should read "is that a TFT having an amorphous"

Col. 51, line 56, "colored layers 2807ato 2807c" should read "colored layers 2807a to 2807c"

Col. 51, line 59, "colored layers 2807ato 2807c." should read "colored layers 2807a to 2807c."

Col. 51, lines 64-65, "adjacent to the substrate" should read "adjacent to the TFT substrate"

Col. 56, line 6, "(a gaggle type display)," should read "(a goggle type display),"

Col. 60, line 60, "element shown in FIG. 3513" should read "element shown in FIG. 35B"

Col. 61, line 5, "In FIG. 3513, the insulating" should read "In FIG. 35B, the insulating"